United States Patent
Nishiwaki et al.

(10) Patent No.: US 9,316,786 B2
(45) Date of Patent: *Apr. 19, 2016

(54) LIGHT-TRAPPING SHEET AND ROD, AND LIGHT-RECEIVING DEVICE AND LIGHT-EMITTING DEVICE USING THE SAME

(71) Applicant: Panasonic Corporation, Osaka (JP)

(72) Inventors: Seiji Nishiwaki, Hyogo (JP); Shinichi Wakabayashi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 190 days.

This patent is subject to a terminal disclaimer.

(21) Appl. No.: 13/948,462

(22) Filed: Jul. 23, 2013

(65) Prior Publication Data

US 2013/0299684 A1 Nov. 14, 2013

Related U.S. Application Data

(63) Continuation of application No. PCT/JP2012/007080, filed on Nov. 5, 2012.

(30) Foreign Application Priority Data

Nov. 8, 2011 (JP) .................................. 2011-244601

(51) Int. Cl.
*G02B 6/34* (2006.01)
*G02B 6/124* (2006.01)
(Continued)

(52) U.S. Cl.
CPC .............. *G02B 6/124* (2013.01); *G02B 5/0252* (2013.01); *G02B 6/0001* (2013.01);
(Continued)

(58) Field of Classification Search
CPC .. G02B 6/124; G02B 6/0016; G02B 6/02057; G02B 5/1814; G02B 5/1819; G02B 5/1823
See application file for complete search history.

(56) References Cited

U.S. PATENT DOCUMENTS 3,939,439 A * 2/1976 Fletcher et al. ................. 372/96
5,187,760 A * 2/1993 Huber ............................ 385/37
(Continued)

FOREIGN PATENT DOCUMENTS

| EP | 2557599 A1 | 4/2011 |
| JP | 5-224018 A | 9/1993 |

(Continued)

OTHER PUBLICATIONS

International Search Report for corresponding International Application No. PCT/JP2012/007080 mailed Jan. 8, 2013.
(Continued)

*Primary Examiner* — Rhonda Peace
(74) *Attorney, Agent, or Firm* — Renner, Otto, Boisselle & Sklar, LLP

(57) ABSTRACT

A light-trapping sheet of the present disclosure includes: a light-transmitting sheet; and light-coupling structures arranged in an inner portion of the light-transmitting sheet. The light-coupling structure includes first, second and third light-transmitting layers. A refractive index of the first and second light-transmitting layers is smaller than that of the light-transmitting sheet; and a refractive index of the third light-transmitting layer is larger than those of the first and second light-transmitting layers. The third light-transmitting layer has a diffraction grating parallel to the surfaces of the light-transmitting sheet. The light-trapping sheet further includes a transparent cover sheet opposing at least one of the surfaces of the light-transmitting sheet with a gap interposed therebetween.

19 Claims, 27 Drawing Sheets

(51) Int. Cl.
*F21V 8/00* (2006.01)
*G02B 5/02* (2006.01)
*G02B 6/02* (2006.01)
*H01L 31/054* (2014.01)
*G02B 6/293* (2006.01)

(52) U.S. Cl.
CPC ............ *G02B 6/0006* (2013.01); *G02B 6/0008* (2013.01); *G02B 6/0016* (2013.01); *G02B 6/0035* (2013.01); *G02B 6/02066* (2013.01); *G02B 6/02123* (2013.01); *G02B 6/34* (2013.01); *H01L 31/0543* (2014.12); *H01L 31/0547* (2014.12); *G02B 6/29323* (2013.01); *G02B 6/29388* (2013.01); *Y02E 10/52* (2013.01)

(56) References Cited

U.S. PATENT DOCUMENTS

| | | | |
|---|---|---|---|
| 5,268,985 A | 12/1993 | Ando et al. | |
| 5,877,874 A | 3/1999 | Rosenberg | |
| 6,101,302 A * | 8/2000 | Park et al. | 385/37 |
| 6,274,860 B1 * | 8/2001 | Rosenberg | F24J 2/06 136/259 |
| 6,365,428 B1 * | 4/2002 | Zubrzycki | G02B 6/124 438/22 |
| 6,876,791 B2 * | 4/2005 | Murashima et al. | 385/37 |
| 7,639,911 B2 * | 12/2009 | Lee et al. | 385/37 |
| 7,817,885 B1 * | 10/2010 | Moore et al. | 385/33 |
| 8,267,583 B2 * | 9/2012 | Yao et al. | 384/31 |
| 8,498,505 B2 * | 7/2013 | Moore et al. | 385/33 |
| 8,817,208 B2 * | 8/2014 | Li | G02F 1/133504 349/112 |
| 8,934,743 B2 * | 1/2015 | Nishiwaki et al. | 385/37 |
| 9,103,978 B2 * | 8/2015 | Nishiwaki | G01J 1/0407 |
| 2004/0056183 A1 | 3/2004 | Eggleton et al. | 250/227.23 |
| 2004/0170356 A1 * | 9/2004 | Iazikov et al. | 385/37 |
| 2005/0078912 A1 * | 4/2005 | Iazikov et al. | 385/37 |
| 2005/0128592 A1 | 6/2005 | Nishii et al. | |
| 2006/0054164 A1 * | 3/2006 | Nyhart et al. | 126/685 |
| 2006/0221448 A1 * | 10/2006 | Nivon | G02B 5/1814 359/572 |
| 2006/0228073 A1 | 10/2006 | Mukawa et al. | |
| 2008/0239424 A1 | 10/2008 | Mukawa et al. | |
| 2008/0298740 A1 | 12/2008 | Hlousek et al. | |
| 2009/0323014 A1 * | 12/2009 | Cunningham | G02B 5/28 351/44 |
| 2010/0220295 A1 | 9/2010 | Mukawa et al. | |
| 2010/0329619 A1 * | 12/2010 | Moore et al. | 385/129 |
| 2011/0102777 A1 * | 5/2011 | Zinoviev et al. | 356/128 |
| 2012/0249934 A1 * | 10/2012 | Li | G02F 1/133504 349/96 |
| 2013/0264470 A1 * | 10/2013 | Nishiwaki | 250/216 |
| 2013/0299684 A1 * | 11/2013 | Nishiwaki et al. | 250/227.11 |
| 2013/0299685 A1 * | 11/2013 | Nishiwaki et al. | 250/237 G |
| 2013/0306844 A1 * | 11/2013 | Nishiwaki et al. | 250/216 |
| 2014/0050441 A1 * | 2/2014 | Wakabayashi et al. | 385/37 |
| 2015/0168651 A1 * | 6/2015 | Nishiwaki | G02B 5/1842 250/237 R |

FOREIGN PATENT DOCUMENTS

| | | |
|---|---|---|
| JP | 10-251038 A | 9/1998 |
| JP | 2001-510902 A | 8/2001 |
| JP | 2003-066203 A | 3/2003 |
| JP | 2003-248128 A | 9/2003 |
| JP | 2004-151182 A | 5/2004 |
| JP | 2005-025208 A | 1/2005 |
| JP | 2005-37872 A | 2/2005 |
| JP | 2005-173116 A | 6/2005 |
| JP | 2007-538292 A | 12/2007 |
| JP | 2008-176302 A | 7/2008 |
| JP | 2011-222735 A | 11/2011 |
| JP | 2012-047856 A | 3/2012 |
| WO | WO 2005/093493 A1 | 10/2005 |
| WO | WO 2009/005072 A1 | 1/2009 |
| WO | WO 2010/151253 A1 | 12/2010 |
| WO | WO 2012/046414 A1 | 4/2012 |

OTHER PUBLICATIONS

Form PCT/ISA/237 for corresponding International Application No. PCT/JP2012/007080 dated Jan. 8, 2013 and partial English translation.
Hiroshi Nishihara et al., "Optical Integrated Circuits", p. 94, p. 243, Ohmsha Ltd. and concise explanation.
Co-pending U.S. Appl. No. 13/877,362, filed Apr. 2, 2013.
Co-pending U.S. Appl. No. 13/947,541, filed Jul. 22, 2013.
Co-pending U.S. Appl. No. 13/948,445, filed Jul. 23, 2013.

* cited by examiner

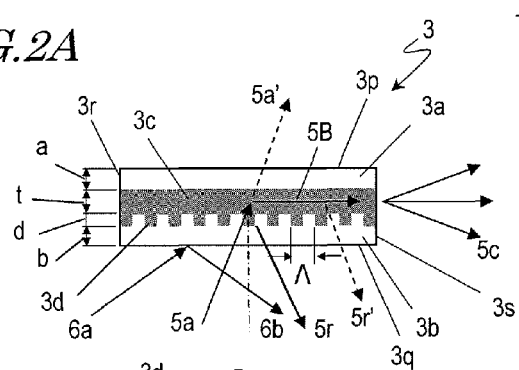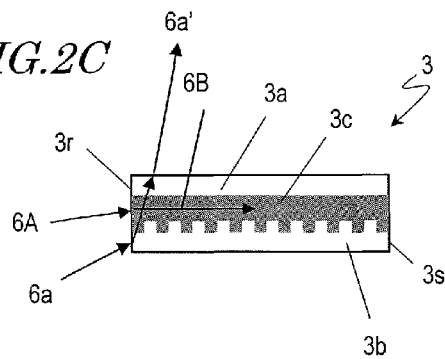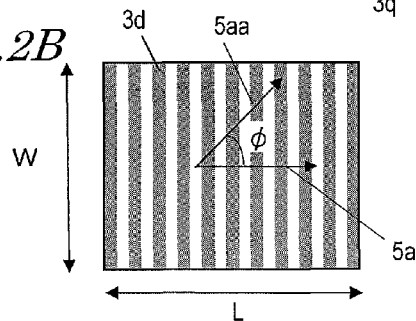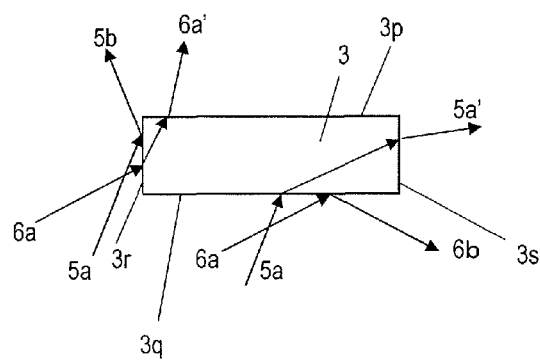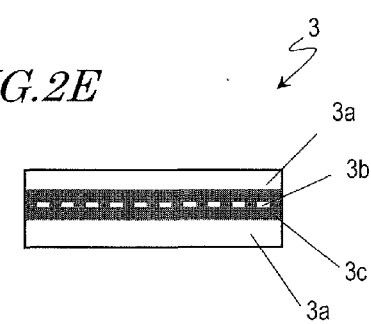

*FIG.5A*  $\lambda = 0.45, \theta = 5$
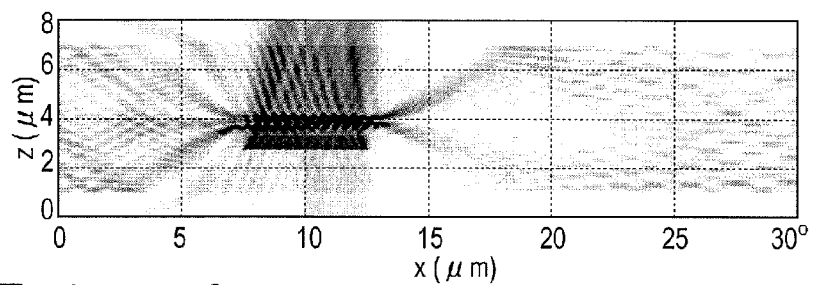
*FIG.5B*  $\lambda = 0.55, \theta = 0$
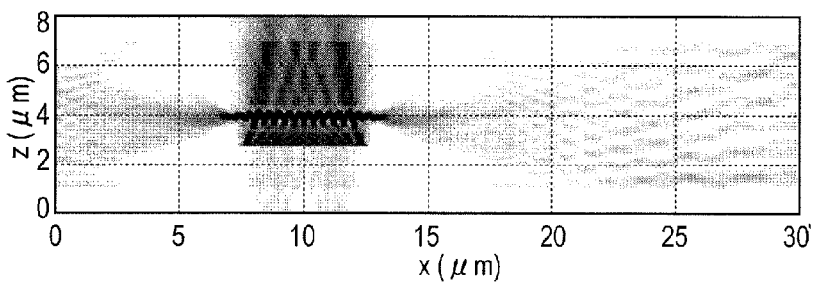
*FIG.5C*  $\lambda = 0.55, \theta = 10$
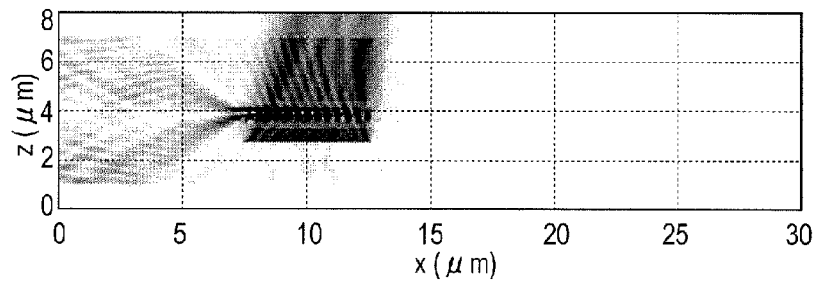
*FIG.5D*  $\lambda = 0.65, \theta = 10$
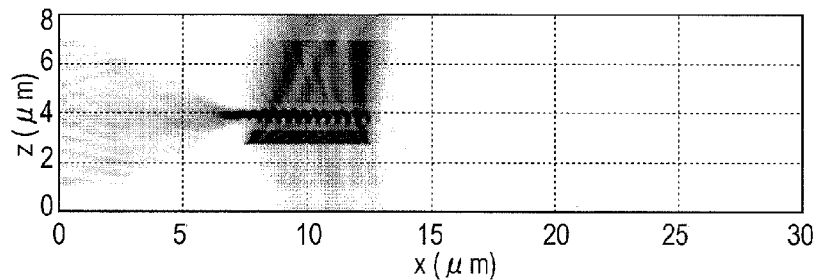
*FIG.5E*  $\lambda = 0.65, \theta = 20$
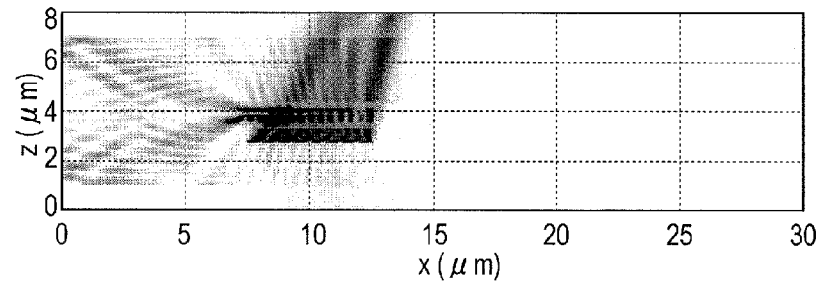

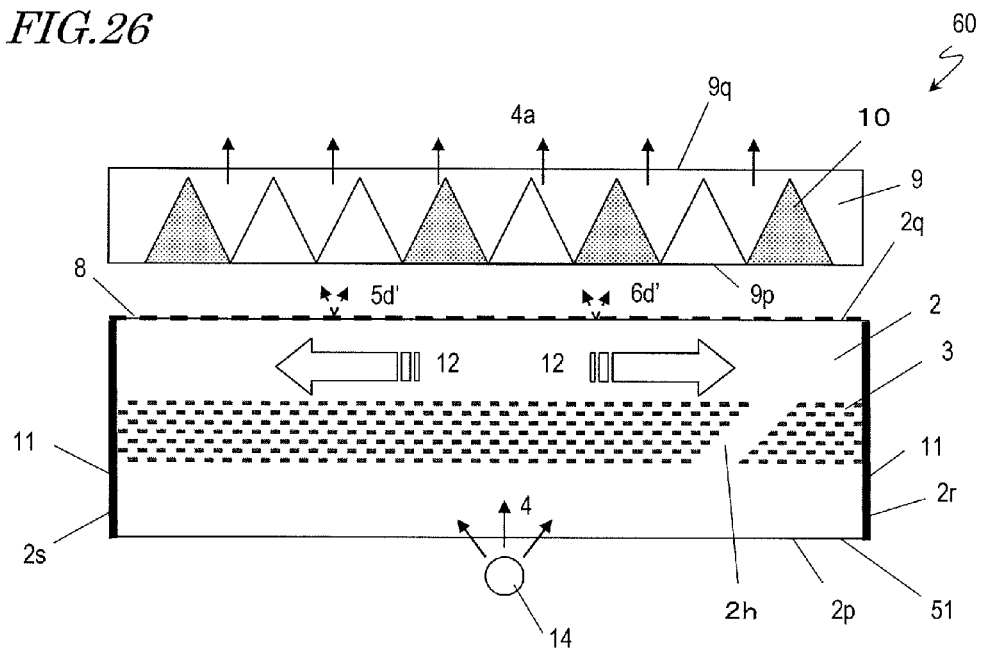
FIG.26
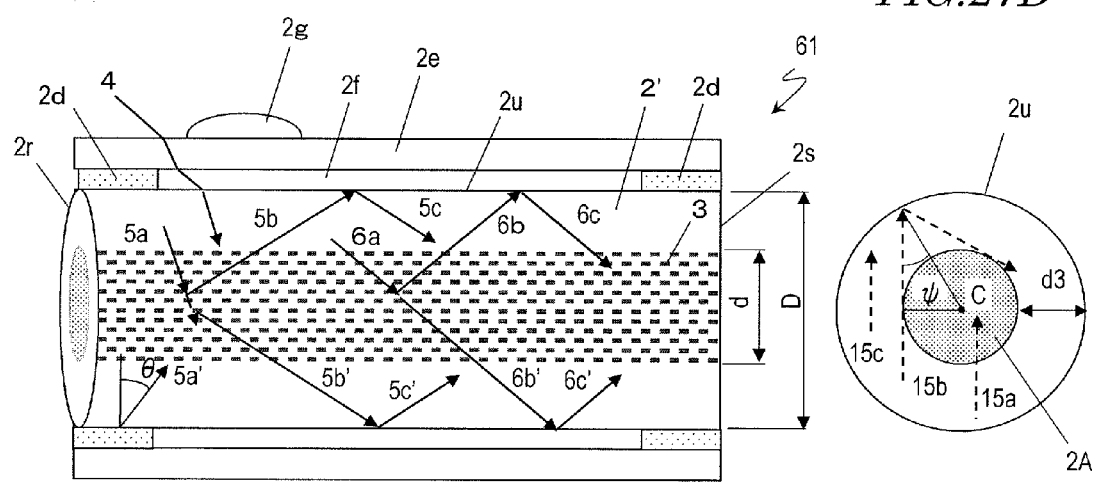
FIG.27A
FIG.27B

LIGHT-TRAPPING SHEET AND ROD, AND LIGHT-RECEIVING DEVICE AND LIGHT-EMITTING DEVICE USING THE SAME

This is a continuation of International Application No. PCT/JP2012/007080, with an international filing date of Nov. 5, 2012, which claims priority of Japanese Patent Application No. 2011-244601, filed on Nov. 8, 2011, the contents of which are hereby incorporated by reference.

BACKGROUND

1. Technical Field

The present disclosure relates to a light-trapping sheet and a rod for allowing light-trapping utilizing diffraction, and to a light-receiving device and a light-emitting device using the same.

2. Description of the Related Art

Where light is propagated between two light-propagating media of different refractive indices, since there is transmission and reflection of light at the interface, it is typically difficult to transfer, with a high efficiency, light from one light-propagating medium to the other light-propagating medium and maintain this state. A conventional grating coupling method shown in "Optical Integrated Circuits", p94, p243, Hiroshi Nishihara, et al. Ohmsha Ltd., for example, can be mentioned as a technique for taking light into a transparent sheet from an environmental medium such as the air. FIGS. 32A and 32B are diagrams illustrating the principle of the grating coupling method, showing a cross-sectional view and a plan view of a light-transmitting layer 20 with a linear grating of a pitch Λ provided on a surface thereof. As shown in FIG. 32A, if light 23a of a wavelength λ is allowed to enter the grating at a particular angle of incidence θ, it can be coupled to guided light 23B propagating inside the light-transmitting layer 20.

SUMMARY

According to the method disclosed in "Optical Integrated Circuits", p94, p243, Hiroshi Nishihara, et al. Ohmsha Ltd., only light that satisfies predetermined conditions can be taken into the light-transmitting layer 20, and light that falls out of the conditions is not taken in.

An embodiment of the present disclosure provides a light-trapping sheet and rod capable of taking in light. An embodiment of the present disclosure also provides a light-receiving device and a light-emitting device including the same.

In one general aspect, a light-trapping sheet of the present disclosure includes: a light-transmitting sheet having first and second principal surfaces; and at least one light-coupling structure arranged in an inner portion of the light-transmitting sheet at a first and second distance from the first and second principal surfaces, respectively, wherein: the at least one light-coupling structure includes a first light-transmitting layer, a second light-transmitting layer, and a third light-transmitting layer sandwiched therebetween; a refractive index of the first and second light-transmitting layers is smaller than a refractive index of the light-transmitting sheet; a refractive index of the third light-transmitting layer is larger than the refractive index of the first and second light-transmitting layers; and the third light-transmitting layer has a diffraction grating parallel to the first and second principal surfaces of the light-transmitting sheet; and the light-trapping sheet further includes a transparent cover sheet opposing at least one of the first and second principal surfaces of the light-transmitting sheet with a gap interposed therebetween.

In another aspect, a light-trapping rod of the present disclosure includes: a light-transmitting rod having a principal surface and a circular or elliptical cross section; and at least one light-coupling structure arranged in an inner portion of the light-transmitting rod at a first distance or more from the principal surface, wherein: at least one light-coupling structure includes a first light-transmitting layer, a second light-transmitting layer, and a third light-transmitting layer sandwiched therebetween; a refractive index of the first and second light-transmitting layers is smaller than a refractive index of the light-transmitting rod; a refractive index of the third light-transmitting layer is larger than the refractive index of the first and second light-transmitting layers; and the third light-transmitting layer includes a diffraction grating parallel to a central axis of the light-transmitting rod; and the light-trapping rod further comprises a transparent cover sheet opposing the principal surface of the light-transmitting rod with a gap interposed therebetween.

In another aspect, a light-receiving device of the present disclosure includes: a light-trapping sheet as set forth in any of the above; and a protrusion/depression structure or a prism sheet provided on the first principal surface or the second principal surface of the light-trapping sheet, and a photoelectric conversion section for receiving light output from the protrusion/depression structure or the prism sheet.

In another aspect, a light-emitting device of the present disclosure includes: a light-trapping sheet or a light-trapping rod as set forth in any of the above; and at least one light source provided adjacent to a principal surface of the light-transmitting sheet or the light-transmitting rod.

According to an embodiment of the present disclosure, it is possible to efficiently take light into a light-transmitting sheet or a light-transmitting rod by utilizing total reflection of light.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIGS. 2A and 2B are a schematic cross-sectional view and a plan view showing a light-coupling structure of the first embodiment, FIG. 2C is a cross-sectional view showing light being incident on an end face of the light-coupling structure, FIG. 2D is a cross-sectional view showing light being incident on the light-coupling structure with a light-transmitting layer 3c removed, and FIG. 2E is a cross-sectional view showing another configuration example of a light-coupling structure.

FIGS. 4A to 4D show results of an analysis conducted using the structure shown in FIG. 3, wherein FIGS. 4A to 4C show the relationship between the angle of incidence of light and the transmittance thereof out of the sheet, and FIG. 4D shows the relationship between the groove depth of the diffraction grating and the light take-out efficiency out of the sheet.

FIGS. 5A to 5E are diagrams showing light intensity distributions on the sheet cross section under conditions at positions indicated by arrows in FIGS. 4A to 4C.

FIG. 6D shows the relationship between the groove depth of the diffraction grating and the light take-out efficiency out of the sheet.

FIGS. 11A to 11D show results of an analysis conducted using the structure shown in FIG. 10, wherein FIGS. 11A to 11C show the relationship between the angle of incidence and the transmittance out of the sheet, and FIG. 10D shows the relationship between the groove depth of the diffraction grating and the light take-out efficiency out of the sheet.

FIGS. 12A to 12C show results of an analysis conducted using the structures shown in FIGS. 3 and 10 where the position of the light source is shifted by 5 μm in the x-axis negative direction, wherein FIGS. 12A to 12C show the relationship between the angle of incidence of light on the end face of a single light-coupling structure and the transmittance thereof out of the sheet.

FIG. 16D shows the relationship between the groove depth of the diffraction grating and the light take-out efficiency out of the sheet.

FIGS. 17A to 17C show results of an analysis conducted using the structures shown in FIGS. 3 and 15 where the position of the light source is shifted by 5 μm in the x-axis negative direction, wherein FIGS. 17A to 17C show the relationship between the angle of incidence of light on the end face of a single light-coupling structure and the transmittance thereof out of the sheet.

FIG. 26 is a schematic cross-sectional view showing an embodiment of a light-emitting device according to the present disclosure.

FIGS. 27A and 27B are schematic cross-sectional views parallel to and perpendicular to the central axis showing an embodiment of a light-trapping rod according to the present disclosure.

DETAILED DESCRIPTION

First, thoughts by the present inventors on the problems with conventional techniques set forth above will be presented.

Figure 32A:
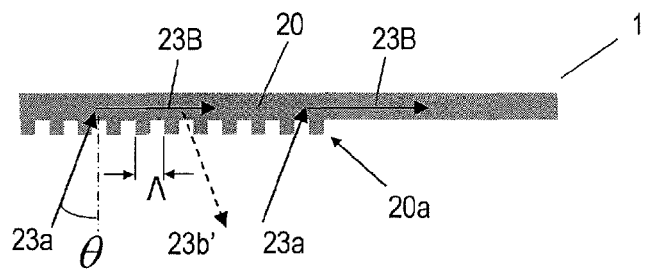
FIGS. 32A and 32B are a cross-sectional view and a plan view of a linear grating for taking in light by a grating coupling method.
Figure 32B:
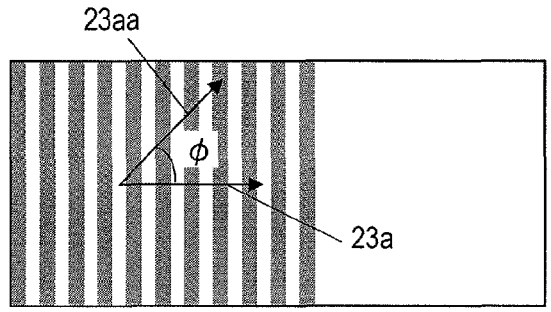
Figure 32C:
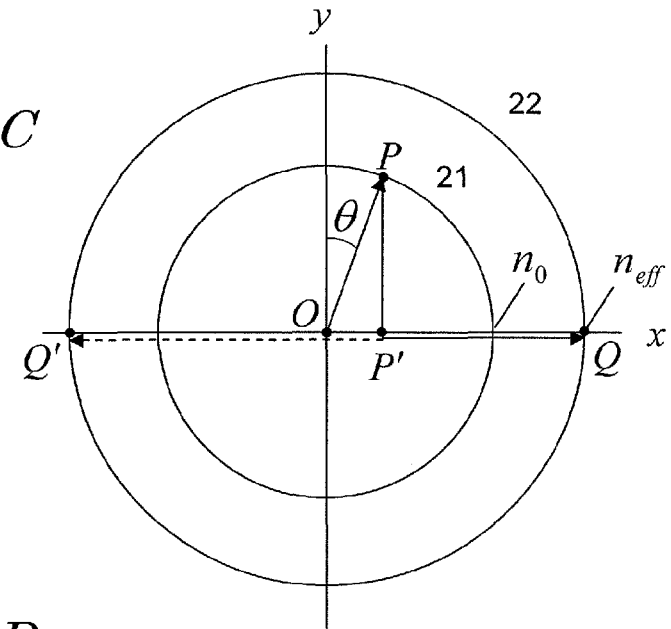
FIGS. 32C and 32D are diagrams showing the principle of the grating coupling method.
Figure 32D:
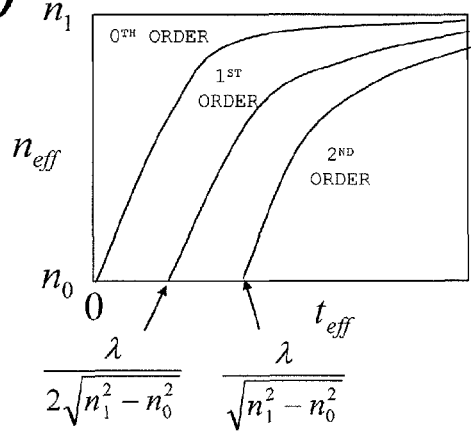

FIG. 32C shows a vector diagram of light incident on the grating provided on the light-transmitting layer 20. In FIG. 32C, circles 21 and 22 are centered about point O, wherein the radius of the circle 21 is equal to the refractive index $n_0$ of an environmental medium 1 surrounding the light-transmitting layer 20, and the radius of the circle 22 is equal to the equivalent refractive index $n_{eff}$ of the guided light 23B. The equivalent refractive index $n_{eff}$ is dependent on the thickness of the light-transmitting layer 20, and takes a particular value, depending on the waveguide mode, between the refractive index $n_0$ of an environmental medium 1 and the refractive index $n_1$ of the light-transmitting layer 20. FIG. 32D shows a relationship between the effective thickness $t_{eff}$ and the equivalent refractive index $n_{eff}$ in a case where light propagates in the TE mode through the light-transmitting layer 20.

The effective thickness is equal to the thickness of the light-transmitting layer 20 where there is no grating, and if there is a grating, it is the thickness of the light-transmitting layer 20 plus the average height of the grating. Induced guided light has modes such as zeroth, first, second, and so forth, which have different characteristic curves as shown in FIG. 32D. In FIG. 32C, point P is a point at which a line drawn from point O along the angle of incidence θ crosses the circle 21, point P' is the foot of a perpendicular from point P to the x axis, and points Q and Q' are points at which the circle 22 crosses the x axis. The condition for light coupling in the x-axis positive direction is represented by the length of P'Q being equal to an integral multiple of λ/Λ, and the condition for light coupling in the negative direction is represented by the length P'Q' being equal to an integral multiple of λ/Λ. Note however that λ is the wavelength of light, and Λ is the pitch of the grating. That is, the condition for light coupling is represented by Expression 1.

[Exp. 1]

$$\sin \theta = \pm n_{eff} + q\frac{\lambda}{\Lambda} \quad (1)$$

where q is the diffraction order represented by an integer. At an angle of incidence other than θ defined by Expression 1, light is not coupled into the light-transmitting layer 20. Even with the same angle of incidence θ, light is not coupled for different wavelengths.

Note that as shown in FIG. 32B, for light 23aa incident on the light-transmitting layer 20 at an azimuthal angle ϕ that is shifted by an angle ϕ from the direction of incidence of the light 23a, the essential pitch of the grating of the light-transmitting layer 20 is Λ/cos ϕ. Therefore, for the light 23a incident at a different azimuth, the condition for light coupling can be satisfied even with an angle of incidence θ and a wavelength that are different from those defined by Expression 1. That is, where changes in the azimuth of light incident on the light-transmitting layer 20 are tolerated, the condition for light coupling shown by Expression 1 is somewhat widened. However, incident light cannot be coupled to the guided light 23B over a wide wavelength range for every angle of incidence.

The guided light 23B, while propagating through the grating area, radiates light 23b' in the same direction as reflected light of the incident light 23a. Therefore, even if light is incident at a position far away from an end portion 20a of the grating and propagates through the light-transmitting layer 20 as the guided light 23B, it attenuates by the time it reaches the end portion 20a of the grating. Therefore, only the light 23a that is incident at a position close to the end portion 20a of the grating can propagate through the light-transmitting layer 20 as the guided light 23B without being attenuated by the radiation. That is, even if the area of the grating is increased in order to couple a large amount of light, it is not possible to allow all the light incident on the grating to propagate as the guided light 23B.

With a light-trapping sheet and a light-trapping rod according to an embodiment of the present disclosure, as opposed to the conventional technique described above, light incident on the light-transmitting sheet and the light-transmitting rod enters a light-coupling structure arranged in an inner portion thereof, and is converted by the diffraction grating of the third light-transmitting layer in the light-coupling structure to light that propagates in the direction along the third light-transmitting layer to be radiated from the end face of the light-coupling structure, as will be described later. Since the light-coupling structure is in such a positional relationship that it is parallel to the light-transmitting sheet surface or the rod central axis, and light that is radiated from the light-coupling structure is repeatedly totally reflected between the surface of the light-transmitting sheet, the surface of the light-transmitting rod and surfaces of other light-coupling structures, to be confined within the light-transmitting sheet or the light-transmitting rod.

First Embodiment

Figure 1A:
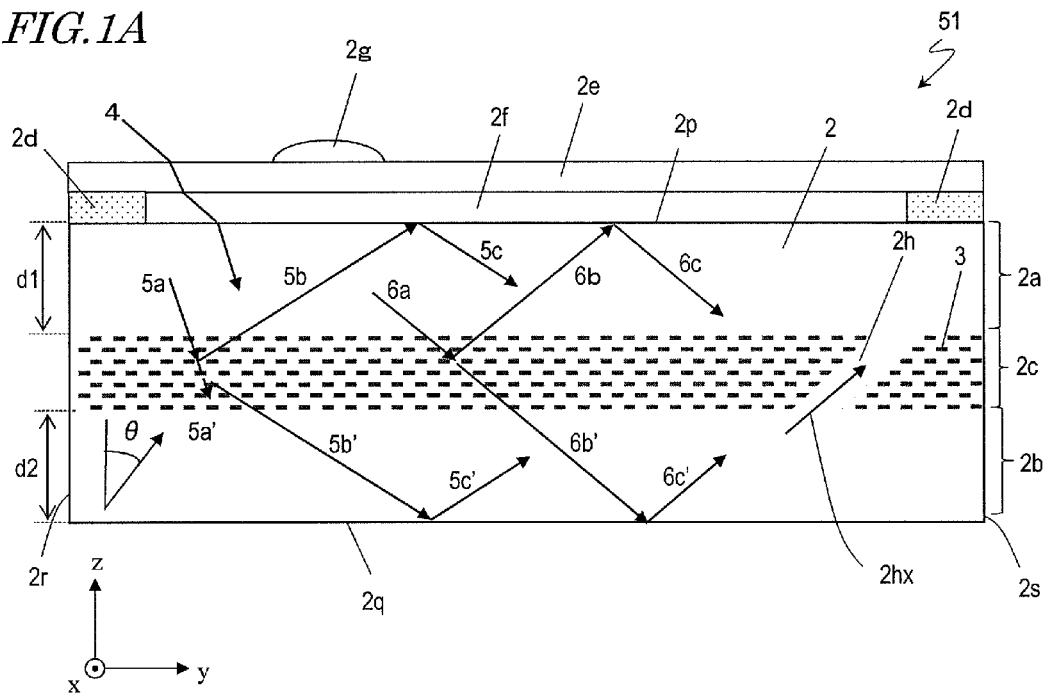
FIG. 1A is a schematic cross-sectional view showing a first embodiment of a light-trapping sheet according to the present disclosure.

A first embodiment of a light-trapping sheet according to the present disclosure will be described. FIG. 1A is a schematic cross-sectional view of a light-trapping sheet 51. The light-trapping sheet 51 includes a light-transmitting sheet 2 having a first principal surface 2p and a second principal surface 2q, and a plurality of light-coupling structure 3 provided in the light-transmitting sheet 2.

The light-transmitting sheet 2 is formed by a transparent material that transmits light of a desired wavelength or within a desired wavelength range determined according to the application. For example, it is formed by a material that transmits visible light (wavelength: 0.4 μm or more and 0.7 μm or less). The thickness of the light-transmitting sheet 2 is about 0.03 mm to 1 mm, for example. There is no particular limitation on the size of the first principal surface 2p and the second principal surface 2q, and they each have an area determined according to the application.

A cover sheet 2e is bonded on the light-transmitting sheet 2 with a spacer 2d sandwiched therebetween. Therefore, most of the first principal surface 2p of the light-transmitting sheet 2 is in contact with a buffer layer 2f. The spacer 2d is formed by a material having a lower refractive index than the light-transmitting sheet, such as an aerogel. Note that the cover sheet 2e may be formed on the second principal surface 2q of the light-transmitting sheet 2 or on both surfaces. The thickness of the cover sheet 2e is about 0.1 mm to 1.0 mm, for example.

As shown in FIG. 1A, the light-coupling structures 3 are arranged in an inner portion of the light-transmitting sheet 2 at a first distance d1 or more and a second distance d2 or more from the first principal surface 2p and the second principal surface 2q, respectively. Therefore, in the light-transmitting sheet 2, the light-coupling structure 3 is not provided in a first area 2a that is in contact with the first principal surface 2p and has a thickness of the first distance d1, and in a second area 2b that is in contact with the second principal surface 2q and has a thickness of the second distance d2, and the light-coupling structure 3 is provided in a third area 2c sandwiched between the first area 2a and the second area 2b.

The light-coupling structures 3 are three-dimensionally arranged in the third area 2c of the light-transmitting sheet 2. Preferably, the light-coupling structures 3 are two-dimensionally arranged on a surface parallel to the first principal surface 2p and the second principal surface 2q, and a plurality of sets of the two-dimensionally-arranged light-coupling structures 3 are layered together in the thickness direction of the light-transmitting sheet 2. Herein, "parallel" does not need to be mathematically strictly parallel. The term "parallel" as used in the present specification is meant to include cases where the direction is inclined by 10 degrees or less with respect to the strictly parallel direction.

The light-coupling structures 3 are arranged with a predetermined density in the x,y-axis direction (in-plane direction) and the z-axis direction (thickness direction). For example, the density is 10 to $10^3$ per 1 mm in the x-axis direction, 10 to $10^3$ per 1 mm in the y-axis direction, and about 10 to $10^3$ per 1 mm in the z-axis direction. In order to efficiently take in light illuminating the entirety of the first principal surface 2p and the second principal surface 2q of the light-transmitting sheet 2, the density with which the light-coupling structures 3 are arranged in the x-axis direction of the light-transmitting sheet 2, that in the y-axis direction and that in the z-axis direction may be independent of one another and uniform. Note however that depending on the application or the distribution of light illuminating the first principal surface 2p and the second principal surface 2q of the light-transmitting sheet 2, the arrangement of the light-coupling structures 3 in the light-transmitting sheet 2 may not be uniform and may have a predetermined distribution.

FIGS. 2A and 2B are a cross-sectional view along the thickness direction of the light-coupling structure 3, and a plan view orthogonal thereto. The light-coupling structure 3 includes the first light-transmitting layer 3a, the second light-transmitting layer 3b, and the third light-transmitting layer 3c sandwiched therebetween. The first light-transmitting layer 3a, the second light-transmitting layer 3b and the third light-transmitting layer 3c sandwiched therebetween are arranged next to each other in a direction perpendicular to the first and second principal surfaces (2p, 2q). Herein, "perpendicular" does not need to be mathematically strictly perpendicular. The term "perpendicular" as used in the present specification is meant to include cases where the direction is inclined by 10 degrees or less with respect to the strictly perpendicular direction. The third light-transmitting layer 3c includes a diffraction grating 3d having a linear grating of the pitch Λ provided on the reference plane. The linear grating of the diffraction grating 3d may be formed by protrusions/depressions provided at the interface between the third light-transmitting layer 3c and the first light-transmitting layer 3a or the second light-transmitting layer 3b, or may be provided inside the third light-transmitting layer 3c as shown in FIG. 2E. It may be a grating based on refractive index differences, instead of a grating with protrusions/depressions. In the light-coupling structure 3, the diffraction grating 3d of the third light-transmitting layer 3c is arranged in the light-transmitting sheet 2 so as to be parallel to the first principal surface 2p and the second principal surface 2q of the light-trapping sheet 51. Herein, the diffraction grating being parallel to the first principal surface 2p and the second principal surface 2q means that the reference plane on which the grating is provided is parallel to the first principal surface 2p and the second principal surface 2q.

In one embodiment, where a plurality of light-coupling structures 3 are arranged on a surface parallel to the first principal surface 2p and the second principal surface 2q, they are arranged so that at least the first light-transmitting layer 3a and the second light-transmitting layer 3b are spaced apart from each other. That is, where a plurality of light-coupling structures 3 include a first light-coupling structure and a second light-coupling structure that are two-dimensionally arranged next to each other on a surface parallel to the first and second principal surfaces (2p, 2q), the first and/or second light-transmitting layer (3a, 3b) of the first light-coupling structure is/are spaced apart from the first and/or second light-transmitting layer (3a, 3b) of the second light-coupling structure. Herein, the first and/or second light-transmitting layer (3a, 3b) of first light-coupling structure being spaced apart from the first and/or second light-transmitting layer (3a, 3b) of the second light-coupling structure means to include any of the following cases. That is, a case where the first light-transmitting layer 3a of the first light-coupling structure and the first light-transmitting layer 3a of the second light-coupling structure are spaced apart from each other; a case where the second light-transmitting layer 3b of the first light-coupling structure and the second light-transmitting layer 3b of the second light-coupling structure are spaced apart from each other; and a case where the first and second light-transmitting layers (3a, 3b) of the first light-coupling structure and the first and second light-transmitting layers (3a, 3b) of the second light-coupling structure are spaced apart from each other. The third light-transmitting layers 3c may be arranged to be spaced apart from each other, or may be arranged to be continuous with each other. In order to facilitate the manufacturing process, the third light-transmitting layers 3c may be arranged to be continuous with each other. That is, the third light-transmitting layer of the first light-coupling structure and the third light-transmitting layer of the second light-coupling structure may be continuous with each other.

Where a plurality of light-coupling structures 3 are arranged in the thickness direction of the light-transmitting sheet 2, they are arranged to be spaced apart from each other. For example, where the second light-transmitting layer of the second light-coupling structure is present above the first light-transmitting layer of the first light-coupling structure, the first light-transmitting layer of the first light-coupling structure and the second light-transmitting layer of the second light-coupling structure are arranged to be spaced apart from each other.

The thicknesses of the first light-transmitting layer 3a, the second light-transmitting layer 3b and the third light-transmitting layer 3c are a, b and t, respectively, and the step (depth) of the linear diffraction grating of the third light-transmitting layer 3c is d. The surface of the third light-transmitting layer 3c is parallel to the first principal surface 2p and the second principal surface 2q of the light-transmitting sheet 2, and surfaces 3p and 3q of the first light-transmitting layer 3a and the second light-transmitting layer 3b that are located on the opposite side from the third light-transmitting layer 3c are also parallel to the first principal surface 2p and the second principal surface 2q of the light-transmitting sheet 2.

As will be described below, in order to be able to take in light of different wavelengths incident on the light-trapping sheet, the light-trapping sheet 51 may include a plurality of light-coupling structures 3, and at least two of the plurality of light-coupling structures may differ from each other in terms of the direction in which the diffraction grating 3d extends. Alternatively, at least two of the plurality of light-coupling structures 3 may differ from each other in terms of the pitch Λ of the diffraction grating 3d. Alternatively, a combination thereof may be used.

The refractive index of the first light-transmitting layer 3a and the second light-transmitting layer 3b is smaller than the refractive index of the light-transmitting sheet 2, and the refractive index of the third light-transmitting layer 3c is larger than the refractive index of the first light-transmitting layer 3a and the second light-transmitting layer 3b. Hereinbelow, it is assumed that the first light-transmitting layer 3a and the second light-transmitting layer 3b are the air, and the refractive index thereof is 1. It is also assumed that the third light-transmitting layer 3c is formed by the same medium as the light-transmitting sheet 2, and they have an equal refractive index.

The surfaces 3p and 3q of the first light-transmitting layer 3a and the second light-transmitting layer 3b of the light-coupling structure 3 are each a rectangular of which two sides are the lengths W and L, for example, and W and L are 3 μm or more and 100 μm or less. That is, the surfaces of the first light-transmitting layer 3a and the second light-transmitting layer 3b of the light-coupling structure 3 are each sized so as to circumscribe a circle having a diameter of 3 μm or more and 100 μm or less. The thickness (a+t+d+b) of the light-coupling structure 3 is 3 μm or less. While the surface (plane) of the light-coupling structure 3 has a rectangular shape as shown in FIG. 2B in the present embodiment, it may have a different shape, e.g., a polygonal shape, a circular shape, or an elliptical shape.

The light-trapping sheet 51 is used while being surrounded by an environmental medium. For example, the light-trapping sheet 51 is used in the air. In this case, the refractive index of the environmental medium is 1. Hereinbelow, the refractive index of the light-transmitting sheet 2 is assumed to be $n_s$. Light 4 from the environmental medium passes through the cover sheet 2e and the buffer layer 2f, and enters the inside of the light-transmitting sheet 2 through the first principal surface 2p and the second principal surface 2q of the light-transmitting sheet 2. The buffer layer 2f is formed by the same medium as the environmental medium, and the refractive index thereof is 1. The refractive index of the spacer 2d is substantially equal to 1. An AR coat or anti-reflective nanostructures may be formed on the opposite surfaces of the cover sheet 2e, the first principal surface 2p and the second principal surface 2q in order to increase the transmittance of the incident light 4. The anti-reflective nanostructures include minute protrusion/depression structures, such as moth-eye structures, whose pitch and height are ⅓ or less the design wavelength. The design wavelength is the wavelength of light used when designing the various elements so that the light-trapping sheet 51 exhibits a predetermined function. Note that with anti-reflective nanostructures, Fresnel reflection is reduced but total reflection is present.

Hereinbelow, of the light present inside the light-transmitting sheet 2, light that satisfies $\sin \theta < 1/n_s$ will be referred to as the in-critical-angle light and light that satisfies $\sin \theta \geq 1/n_s$ as the out-of-critical-angle light, regarding the angle θ (hereinafter referred to as the propagation angle) formed between the propagation azimuth thereof and the normal to the light-transmitting sheet 2 (a line perpendicular to the first principal surface 2p and the second principal surface 2q). In FIG. 1A, where in-critical-angle light 5a is present inside the light-transmitting sheet 2, a portion thereof is converted by a light-coupling structure 3 to out-of-critical-angle light 5b, and this light is totally reflected by the first principal surface 2p to be out-of-critical-angle light 5c that stays inside the sheet. A portion of the remaining in-critical-angle light 5a' of the in-critical-angle light 5a is converted by another light-coupling structure 3 to out-of-critical-angle light 5b', and this light is reflected by the second principal surface 2q to be out-of-critical-angle light 5c' that stays inside the sheet. Thus, all of the in-critical-angle light 5a is converted to the out-of-critical-angle light 5b or 5b' inside the third area 2c where the light-coupling structures 3 are arranged.

On the other hand, where out-of-critical-angle light 6a is present in the light-transmitting sheet 2, a portion thereof is totally reflected by the surface of a light-coupling structure 3 to be out-of-critical-angle light 6b, and this light is totally reflected by the first principal surface 2p to be out-of-critical-angle light 6c that stays inside the sheet. A portion of the remaining light of the light 6a becomes out-of-critical-angle light 6b' that passes through the third area 2c where the light-coupling structures 3 are provided, and this light is totally reflected by the second principal surface 2q to be out-of-critical-angle light 6c' that stays inside the light-transmitting sheet 2. Although not shown in the figure, there is also out-of-critical-angle light that stays inside the sheet while being totally reflected between different light-coupling structures 3 and between the first principal surface 2p and the second principal surface 2q, i.e., light that propagates through, while staying in, the first area 2a, the second area 2b or the third area 2c. In this case, there may occur a deviation in the distribution of light propagating through the first area 2a and the second area 2b. Where the deviation in the distribution of light in the light-transmitting sheet 2 is problematic, one or more fourth area 2h may be provided, in the third area 2c in the light-transmitting sheet 2, where no light-coupling structure 3 is provided, as shown in FIG. 1A. That is, the light-coupling structures 3 are arranged only in the third area 2c excluding the fourth area 2h. In the light-transmitting sheet 2, the fourth area 2h connects between the first area 2a and the second area 2b. The fourth area 2h extends from the first area 2a to the second area 2b, or in the opposite direction, and the azimuth of an arbitrary straight line passing through the fourth area 2h is along a larger angle than a critical angle that is defined by the refractive index of the light-transmitting sheet and the refractive index of the environmental medium around the light-transmitting sheet. That is, assuming that the refractive index of the environmental medium is 1 and the refractive index of the light-transmitting sheet 2 is $n_e$, the angle θ' of the direction 2hx in which the arbitrary straight line passing through the fourth area 2h extends with respect to the normal to the light-transmitting sheet 2 satisfies $\sin \theta' \geq 1/n_s$. Herein, a straight line passing through the fourth area 2h refers to the straight line penetrating the surface at which the fourth area 2h is in contact with the first area 2a and the surface at which the fourth area 2h is in contact with the second area 2b.

Figure 1B:
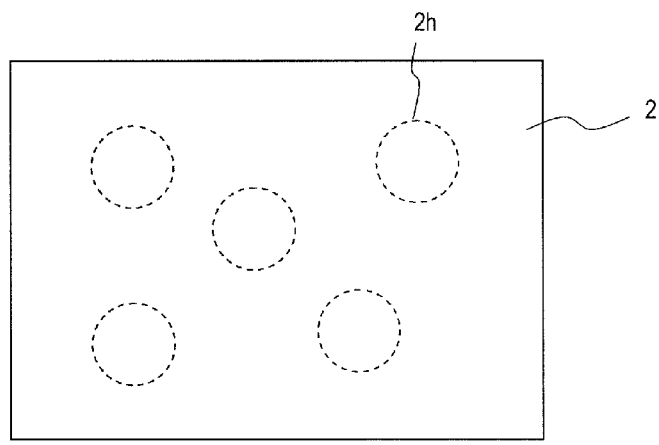
FIG. 1B is a plan view showing the position of a fourth area in the first embodiment.

FIG. 1B is a plan view of the light-trapping sheet 51, showing the arrangement of the fourth areas 2h. Preferably, a plurality of fourth areas 2h are provided in the light-transmitting sheet 2 as shown in FIG. 1B. Since the fourth area 2h extends from the first area 2a to the second area 2b, or in the opposite direction, at an angle larger than the critical angle, only out-of-critical-angle light, of the light propagating through the first area 2a and the second area 2b of the light-transmitting sheet 2, can pass from the first area 2a to the second area 2b, or in the opposite direction, passing through the fourth area 2h. Therefore, it is possible to prevent the deviation of the light distribution in the light-trapping sheet 51.

As shown in FIG. 2A, the in-critical-angle light 5a passes through the surface 3q of the second light-transmitting layer 3b, and a portion thereof is converted by the function of the diffraction grating 3d to guided light 5B that propagates inside the third light-transmitting layer 3c. The remainder primarily becomes the in-critical-angle light 5a' to pass through the light-coupling structure 3 as transmitted light or diffracted light, or becomes in-critical-angle light 5r to pass through the light-coupling structure 3 as reflected light. Upon entering the second light-transmitting layer 3b, there is also the out-of-critical-angle light 6b which is reflected by the surface 3q, but most of the light can be allowed to pass therethrough if anti-reflective nanostructures are formed on the surfaces 3q and 3p.

The coupling to the guided light 5B is the same as the principle of the conventional grating coupling method. Before the guided light 5B reaches an end face 3S of the third light-transmitting layer 3c, a portion thereof is radiated in the same direction as the in-critical-angle light 5r to be in-critical-angle light 5r', and the remainder is guided to be radiated from the end, face 3S of the third light-transmitting layer 3c to be the out-of-critical-angle light 5c. On the other hand, the out-of-critical-angle light 6a is totally reflected at the surface 3q of the second light-transmitting layer 3b, and it entirely becomes the out-of-critical-angle light 6b. Thus, out-of-critical-angle light incident on the surface of the light-coupling structure (the surface 3p of the first light-transmitting layer 3a and the surface 3q of the second light-transmitting layer 3b) is reflected, as it is, as out-of-critical-angle light, while a portion of in-critical-angle light is converted to out-of-critical-angle light.

Note that if the length of the diffraction grating 3d of the third light-transmitting layer 3c is too long, the guided light 5B is entirely radiated before reaching the end face 3S. If it is too short, the efficiency of coupling to the guided light 5B is insufficient. How easily the guided light 5B is radiated is represented by the radiation loss coefficient α, and the intensity of the guided light 5B is multiplied by a factor of exp(−2αL) at a propagation distance of L. Assuming that the value of α is 10 (1/mm), the light intensity will be multiplied by a factor of 0.8 after propagation over 10 μm. The radiation loss coefficient α is related to the depth d of the diffraction grating 3d, and it monotonously increases in the range of d≤$d_c$ while being saturated in the range of d>$d_c$. Where the wavelength of light is λ, the equivalent refractive index of the guided light 5B is $n_{eff}$, the refractive index of the light-transmitting layer 3c is $n_1$, and the duty of the diffraction grating 3d (the ratio of the width of the protruding portion with respect to the pitch) is 0.5, $d_c$ is give by Expression 2 below.

[Exp. 2]

$$d_c \approx \frac{\lambda}{2\pi}\sqrt{n_{eff}^2 - \left(\frac{n_1 - 1}{2}\right)^2} \quad (2)$$

For example, $d_c$=0.107 μm if λ=0.55 μm, $n_{eff}$=1.25, and $n_1$=1.5. In the monotonous increase region, the radiation loss coefficient α is in proportion to d squared. Therefore, the length of the diffraction grating 3d, i.e., the length of the third light-transmitting layer 3c (the dimensions W and L) is determined by the radiation loss coefficient α, and is dependent on the depth d of the diffraction grating 3d. Assuming that by adjusting the depth d, the value of α is set in the range of 2 to 100 (1/mm) and the attenuation ratio to 0.5, W and L will be about 3 μm to 170 μm. Therefore, if W and L are 3 μm or more and 100 μm or less, as described above, it is possible to suppress the radiation loss to obtain a high coupling efficiency by adjusting the depth d.

Table 1 shows the visible light wavelength (λ=0.4 to 0.7 μm) of light that is coupled for the pitch Λ and the angle of incidence θ based on Expression 1, where the equivalent refractive index $n_{eff}$ of the guided light 5B is set to 1.25. Each section of a dotted line is the range for coupling. For example, where the pitch is 0.4 μm, light having a wavelength of 0.4 μm is coupled at θ=−14° and light having a wavelength of 0.7 μm is coupled at θ=30°, thereby giving a visible light coupling range from θ=−14° to θ=30°.

TABLE 1

| | | Angle of incidence θ (degrees) | | | | | | | |
|---|---|---|---|---|---|---|---|---|---|
| | | −90 | −54 | −33 | −14 | 0 | 5 | 30 | 49 | 90 |
| Pitch | 0.18 | | | | | | | | 0.4 |
| Λ | 0.20 | | | | | | | | 0.4----0.5 |
| μm | 0.30 | | | | | | | 0.4----------------------0.7 |
| | 0.40 | | | | 0.4-----------------0.7 | | | | |
| | 0.56 | | | 0.4----------0.7 | | | | | |

TABLE 1-continued

| | | Angle of incidence θ (degrees) | | | | | | | |
|---|---|---|---|---|---|---|---|---|---|
| | | −90 | −54 | −33 | −14 | 0 | 5 | 30 | 49 | 90 |
| 1.60 | 0.4----0.7 | | | | | | | | |
| 2.80 | 0.7 | | | | | | | | |

The polarity of the angle of incidence θ is relevant to the light coupling direction. Therefore, if one focuses only on the presence/absence of coupling while ignoring the light coupling direction, covering either the range of angles of incidence from 0 to 90° or from −90 to 0° means that coupling is achieved for every angle of incidence. Therefore, it can be seen from Table 1 that in order for light to be coupled for every visible light wavelength and for every angle of incidence, one may combine together light-coupling structures 3 including diffraction gratings 3d having pitches Λ from 0.18 μm to 0.56 μm (from 0° to 90°), or from 0.30 μm to 2.80 μm (from −90° to 0°). Taking into consideration changes in the equivalent refractive index and manufacturing errors occurring when forming the waveguide layer and the diffraction grating, the pitch of the diffraction grating 3d may be generally 0.1 μm or more and 3 μm or less.

For example, as shown in FIG. 2B, the pitch of the diffraction grating 3d is Λ for the in-critical-angle light 5a that is incident in the direction perpendicular to the direction in which the diffraction grating 3d extends, but the effective pitch of the diffraction grating 3d for light 5aa that is incident at an azimuthal angle of φ is Λ/cos φ. For example, where the azimuthal angle φ of incidence of the light 5aa is 0 to 87°, the effective pitch is Λ to 19Λ. Therefore, where Λ=0.18 μm is set, it is possible to realize effective pitches Λ from 0.18 to 2.80 μm depending on the azimuth of incident light even with the same diffraction grating 3d, and where Λ=0.30 μm is set, it is possible to realize pitches Λ from 0.30 to 2.80 μm. Therefore, it is possible to take in light for every visible light wavelength and for every angle of incidence also by placing light-coupling structures 3 of a single pitch in the light-transmitting sheet 2 while turning the light-coupling structures 3 so that the direction in which the diffraction grating extends (the azimuth of the diffraction grating) varies from 0° to 180°, other than by combining together light-coupling structures 3 including diffraction gratings 3d having different pitches. Moreover, for a plurality of light-coupling structures 3, the pitch of the diffraction grating 3d and the direction in which the diffraction grating 3d extends may both be varied.

Next, light at end faces 3r and 3s perpendicular to the surfaces 3p and 3q of the light-coupling structure 3 (surfaces extending along the normal direction to the light-transmitting layer 3b) will be discussed. As shown in FIG. 2C, possible courses of action for the light incident on the end face 3r of the light-coupling structure 3 are: to be reflected by the end face 3r; to be diffracted through the end face 3r; to be refracted passing through the end face 3r; and to be guided through the third light-transmitting layer 3c passing through the end face 3r. For example, the out-of-critical-angle light 6a which is incident on, and passes through, the end faces of the first light-transmitting layer 3a and the second light-transmitting layer 3b is refracted to be in-critical-angle light 6a'. A portion of light 6A which is incident on, and passes through, the end face of the third light-transmitting layer 3c is converted to guided light 6B which propagates inside the third light-transmitting layer 3c.

For reference, FIG. 2D shows the optical path obtained when the third light-transmitting layer 3c is removed from the light-coupling structure 3 and the space left by the removal is filled with the same air as the first light-transmitting layer 3a and the second light-transmitting layer 3b. When the in-critical-angle light 5a is incident on the surface 3q of the light-coupling structure 3, if the position of incidence is close to the end face 3s, it is output through the end face 3s as the out-of-critical-angle light 5a' as a result of refraction. When the in-critical-angle light 5a is incident on the end face 3r of the light-coupling structure 3, it is totally reflected by the end face 3r. When the out-of-critical-angle light 6a is incident on the end face 3r of the light-coupling structure 3, it is output from the surface 3p as the in-critical-angle light 6a' as a result of refraction, irrespective of the position of incidence. When the out-of-critical-angle light 6a is incident on the surface 3q of the light-coupling structure 3, it is totally reflected by the surface 3q.

Thus, for light that is incident on the end faces 3r and 3s of the light-coupling structure 3, the behavior is complicated, and even if out-of-critical-angle light is incident on the end face, it is not always output as out-of-critical-angle light. However, if the size of the surface (W, L) is set to be sufficiently (e.g., 4 times or more) larger than the size of the end face (a+t+d+b), the influence at the end face will be sufficiently small, and then the transmission or the reflection of light at the surfaces 3p and 3q can be seen as the transmission or reflection behavior of light for the entire light-coupling structure 3. Specifically, if the size of the surface 3p of the first light-transmitting layer 3a and the surface 3q of the second light-transmitting layer 3b is 4 times or more of the thickness of the light-coupling structure 3, it is possible to sufficiently ignore the influence of light at the end faces 3r and 3s of the light-coupling structure 3. Therefore, the light-coupling structures 3 exhibit a function of irreversibly converting in-critical-angle light to out-of-critical-angle light while maintaining out-of-critical-angle light as out-of-critical-angle light, and if the density of the light-coupling structures 3 is set to a sufficient density, it is possible to convert all the light incident on the light-trapping sheet 51 to out-of-critical-angle light (i.e., light confined within the sheet).

Figure 3:
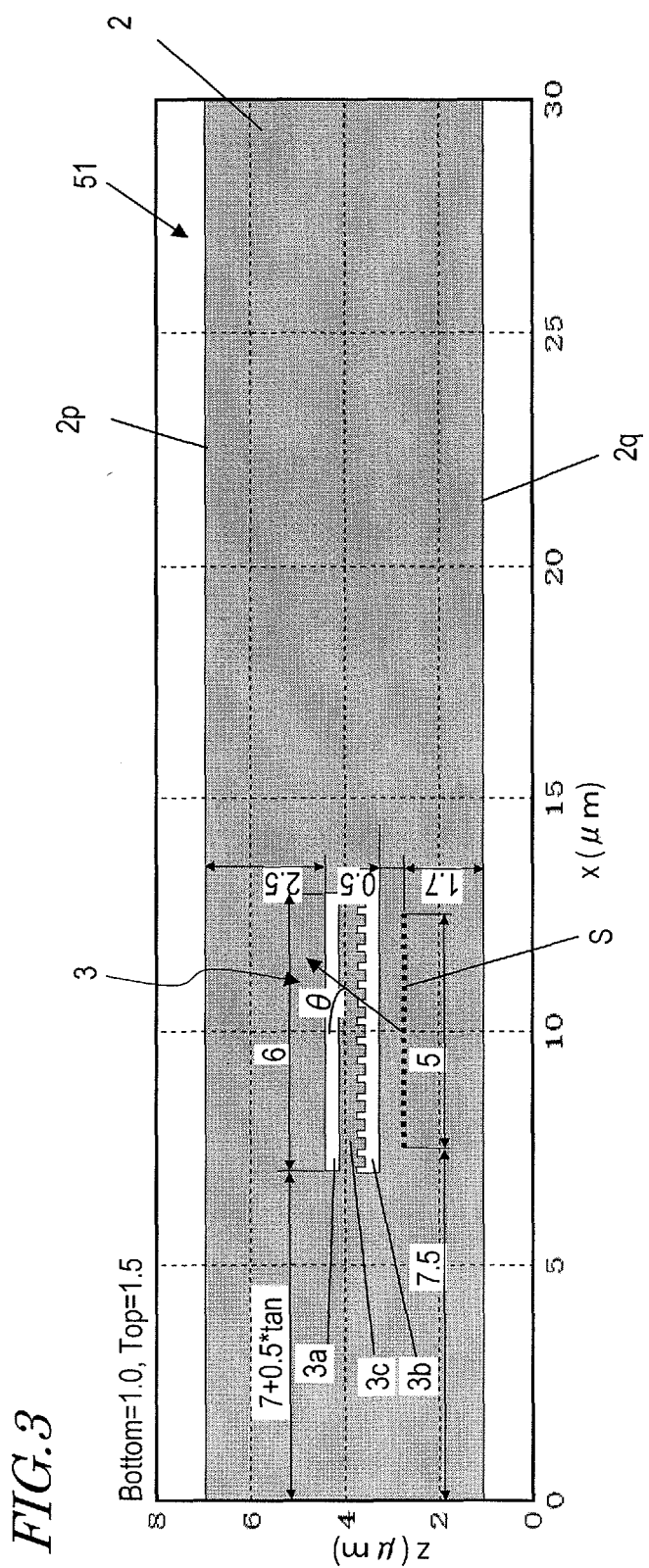
FIG. 3 is a cross-sectional view showing a structure used in analyzing the light-trapping sheet of the first embodiment.

FIG. 3 shows a cross-sectional structure of a light-trapping sheet used in an analysis for confirming the light-confining effect of the light-trapping sheet 51. A light-trapping sheet including one light-coupling structure was used for the analysis. As shown in FIG. 3, a light source S (indicated by a broken line) having a width of 5 µm was set in parallel at a position of 1.7 µm from the second principal surface 2q of the light-transmitting sheet 2, and the second light-transmitting layer 3b having a width of 6 µm was arranged in parallel thereabove at a distance of 0.5 µm, with the third light-transmitting layer 3c and the first light-transmitting layer 3a of the same width being arranged thereabove. The first principal surface 2p of the light-transmitting sheet 2 is located at a position of 2.5 µm from the surface of the first light-transmitting layer 3a. The positions of the first light-transmitting layer 3a, the second light-transmitting layer 3b and the third light-transmitting layer 3c are shifted side to side based on the angle θ so that a plane wave having a polarization at an angle of 45° with respect to the drawing sheet is output from the light source S at an azimuth forming the angle of θ with respect to the normal to the second principal surface 2q, and the center of the incident light passes through the center of the surface of the second light-transmitting layer 3b. The thickness a of the first light-transmitting layer 3a was set to 0.3 µm, the thickness c of the second light-transmitting layer 3b to 0.3 µm, the thickness t of the third light-transmitting layer 3c to 0.4 µm, the depth d of the diffraction grating to 0.18 µm, and the pitch Λ of the diffraction grating to 0.36 µm. The refractive index of the light-transmitting sheet 2 and the third light-transmitting layer 3c was assumed to be 1.5, and the refractive index of the environmental medium, the first light-transmitting layer 3a and the second light-transmitting layer 3b to be 1.0.

Figure 4A:
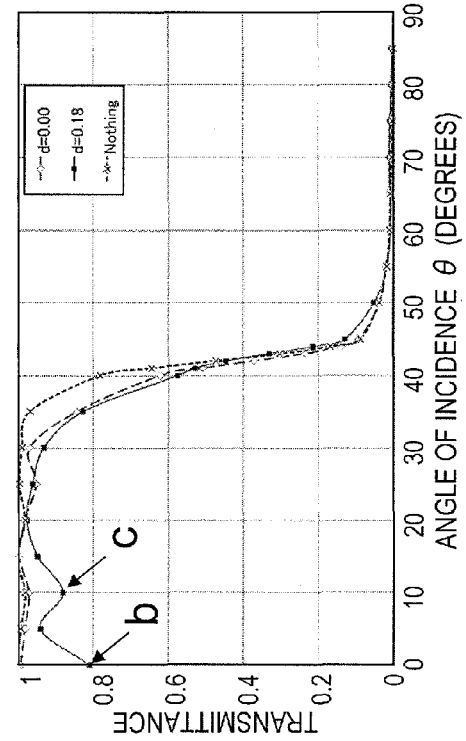
Figure 4B:
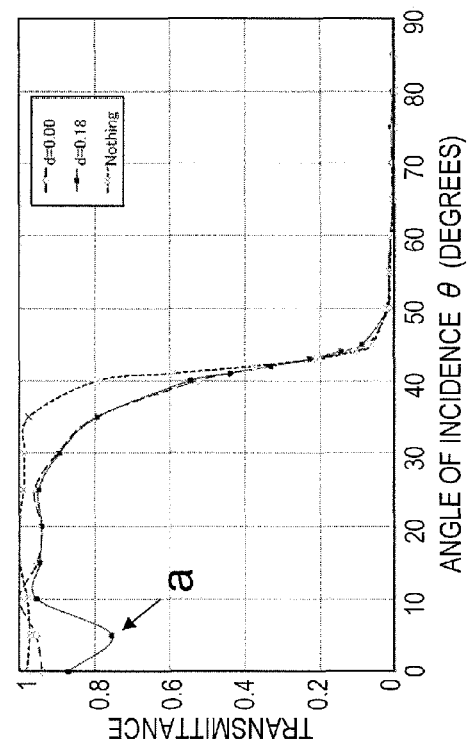
Figure 4C:
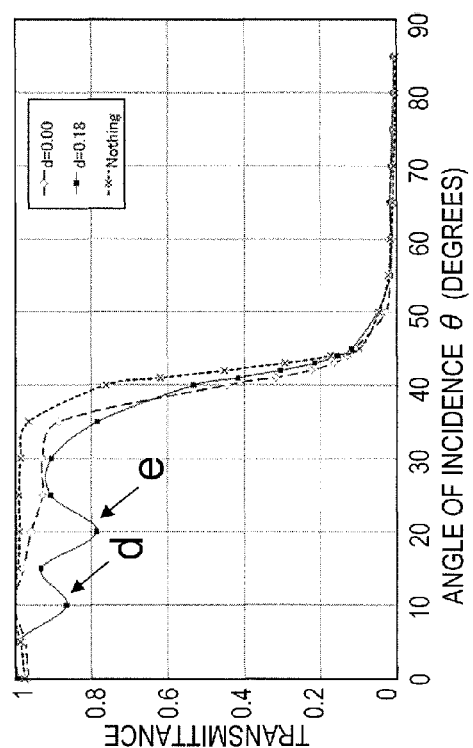

FIGS. 4A to 4C are results of an analysis using a light-trapping sheet having the structure shown in FIG. 3, each showing the relationship between the angle of incidence of light from the light source S incident on the light-coupling structure 3 and the transmittance of light that is output to the outside of the light-trapping sheet. The structure used in the analysis was as described above. A two-dimensional finite-difference time-domain method (FDTD) was used in the analysis. Therefore, the analysis results are those with a structure in which the cross section shown in FIG. 3 extends infinitely in the direction perpendicular to the drawings sheet. The transmittance was measured while it was stable, and was defined by the ratio of the integrated value of the Poynting vectors passing through the bottom surface (z=0 µm) and the top surface (z≈8 µm) of the analysis area with respect to the integrated value of the Poynting vectors passing through a closed curved surface surrounding the light source. While there are some calculation results exceeding 100%, it is because of slight errors in the measurement of the Poynting vectors of the light source. FIG. 4A shows the calculation results for a case where the wavelength λ of the light source is 0.45 µm, FIG. 4B for a case where the wavelength λ is 0.55 µm, and FIG. 4C for a case where the wavelength λ is 0.65 µm. Each figure uses the depth d of the diffraction grating as a parameter, and is also plotting the results obtained under a condition where there is no light-coupling structure 3 (a configuration only with the light-transmitting sheet 2 and the light source S).

A comparison between the results obtained in a case where the light-coupling structures 3 are present but the depth d of the diffraction grating is d=0 and the results (Nothing) obtained in a case where there is no light-coupling structure shows that the former has a lower transmittance than the latter in a range within the critical angle (41.8°), and they are both substantially zero for angles greater than or equal to that. The reason why the former has a lower transmittance within the critical angle is because light incident on the surface 3q of the second light-transmitting layer 3b is refracted and a portion thereof is output from the end face 3s as out-of-critical-angle light, as described above with reference to FIG. 2D. Note however that for the former, out-of-critical-angle light entering through the end face 3r of the light-coupling structure 3 is refracted through this surface, and is then refracted through the surface 3p of the first light-transmitting layer 3a to be in-critical-angle light inside the light-transmitting sheet 2, as described above again with reference to FIGS. 2C and 2D. Therefore, for a structure where d=0, there is conversion to out-of-critical-angle light while there is also conversion to in-critical-angle light, and it can be said that the light-confining effect as a whole is small.

Figure 4D:
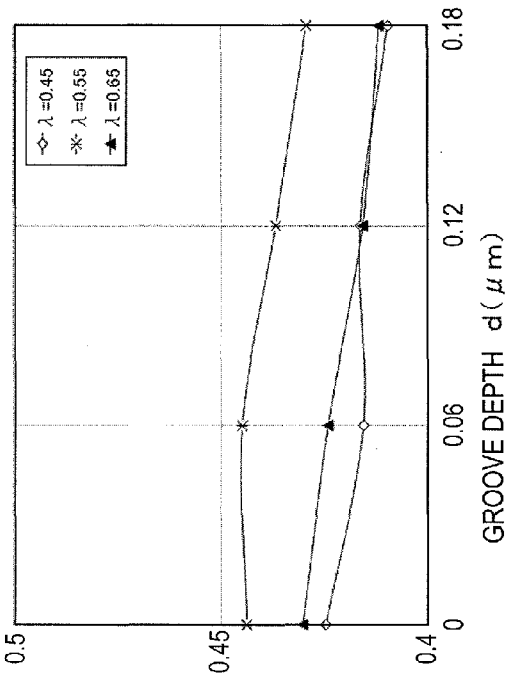

On the other hand, a comparison between the results for a case where the depth of the grating is d=0.18 µm and the results for a case where d=0 shows that although the transmittance of the former is substantially close to that of the latter, the transmittance drops at positions indicated by arrows a, b, c, d and e. FIG. 4D shows the standard value (a value obtained by division by 90) of a value obtained by integrating each of the curves of FIGS. 4A, 4B and 4C for the angle of incidence θ, using the depth d of the diffraction grating as a parameter. Since the analysis model is two-dimensional, the integrated value is equal to the efficiency with which light in the light-confining sheet is taken out of the sheet. With any wavelength, the take-out efficiency decreases as d increases (at least for the comparison between d=0 and d=0.18). This represents the light-confining effect by a single light-coupling structure. This effect can be accumulated, and by increasing the number of light-coupling structures, it is possible to eventually confine all the light. Note that while this analysis is a two-dimensional model, there is always incident light that satisfies Expression 1, which is the coupling condition, for an arbitrary azimuthal angle φ shown in the plan view of FIG. 2A in an actual model (three-dimensional model), and therefore the transmittance curves shown in FIGS. 4A to 4D will drop for the entire range of the angle of incidence θ, rather than for the local range such as the arrows a, b, c, d and e, thus increasing the light-confining effect of the light-coupling structures.

FIGS. 5A to 5E shows light intensity distribution diagrams in the light-trapping sheet under conditions indicated by arrows a, b, c, d and e of FIGS. 4A to 4D. Specifically, FIG. 5A shows the results where the wavelength is λ=0.45 μm and θ=5°, FIG. 5B shows the results where the wavelength is λ=0.55 μm and θ=0°, FIG. 5C shows the results where the wavelength is λ=0.55 μm and θ=10°, FIG. 5D shows the results where the wavelength is λ=0.65 μm and θ=10°, and FIG. 5E shows the results where the wavelength is λ=0.65 μm and θ=20°.

For the conditions and the angles of incidence shown in FIGS. 5A and 5B, since the refractive index of the third light-transmitting layer 3c is higher than the refractive index of the first light-transmitting layer 3a and the second light-transmitting layer 3b surrounding the third light-transmitting layer 3c, the third light-transmitting layer 3c functions as a waveguide layer, and the incident light is coupled to the guided light propagating inside the third light-transmitting layer 3c by the function of the diffraction grating, with the light being radiated into the light-transmitting sheet 2 from the end faces 3r and 3s of the third light-transmitting layer 3c. The radiated light is out-of-critical-angle light, and is totally reflected by the first principal surface 2p and the second principal surface 2q of the light-transmitting sheet 2 to be confined within the light-transmitting sheet 2. Also for the conditions and the angles of incidence shown in FIGS. 5C, 5D and 5E, the incident light is coupled to the guided light propagating inside the third light-transmitting layer 3c by the function of the diffraction grating, with the light being radiated into the sheet from the end face 3r of the third light-transmitting layer 3c. The radiated light is out-of-critical-angle light, and is totally reflected by the first principal surface 2p and the second principal surface 2q of the light-transmitting sheet 2 to be confined within the light-transmitting sheet 2. Note that in FIGS. 5A, 5C and 5E, the radiated light is divided into two, and the coupled light is guided light of the first-order mode whose phase is reversed above and below the cross section of the waveguide layer. On the other hand, in FIGS. 5B and 5D, the radiated light is in an undivided state, and the coupled light is guided light of the zeroth-order mode.

Figure 6A:
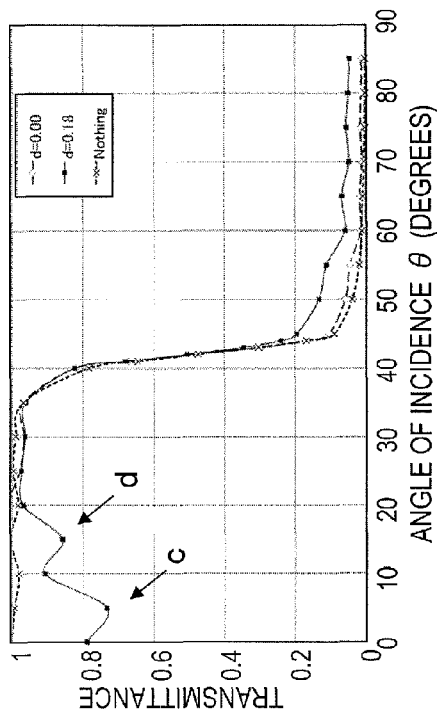
FIGS. 6A to 6D show results of an analysis with the structure shown in FIG. 3 where the refractive index of a first light-transmitting layer 3a and a second light-transmitting layer 3b is made equal to the refractive index of the light-transmitting sheet, and the refractive index of the third light-transmitting layer 3c is set to 2.0, wherein FIGS. 6A to 6C each show the relationship between the angle of incidence and the transmittance thereof out of the sheet.
Figure 6B:
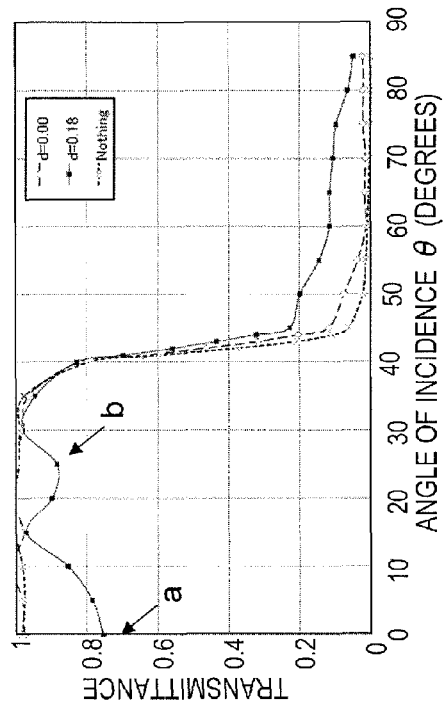
Figure 6C:
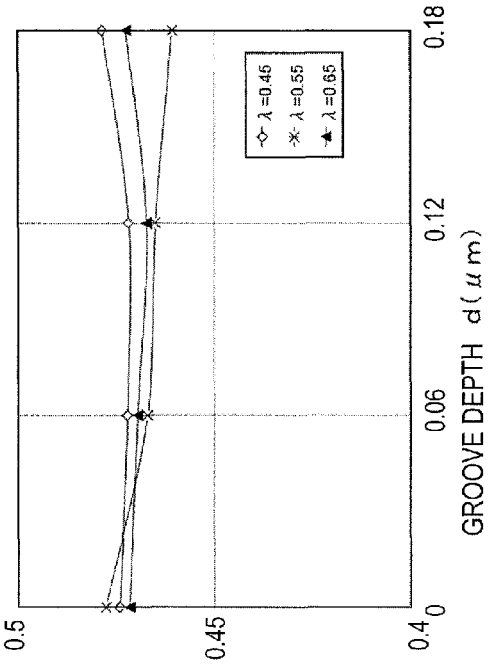
Figure 6D:
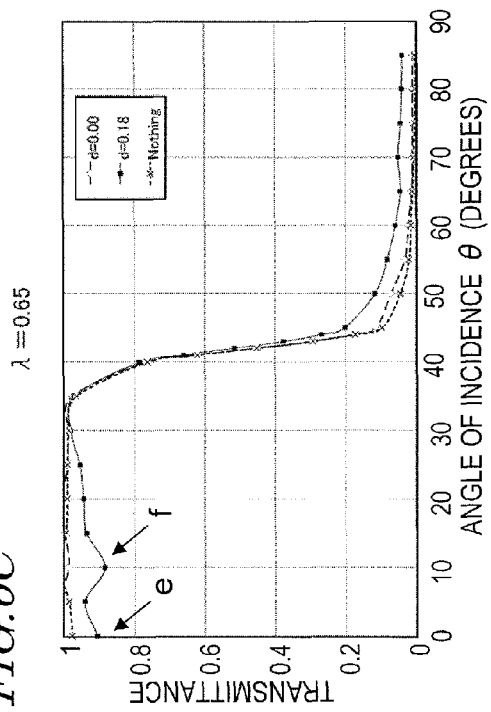

FIGS. 6A to 6D show results of an analysis using the structure shown in FIG. 3 where the refractive index of the first light-transmitting layer 3a and the second light-transmitting layer 3b is made to coincide with the refractive index of the light-transmitting sheet 2, and the refractive index of the third light-transmitting layer 3c is changed to 2.0. The other conditions are the same as those when the analysis results shown in FIGS. 4A to 4D were obtained. FIG. 6A shows the results where the wavelength of the light source is λ=0.45 μm, FIG. 6B shows the results where the wavelength is λ=0.55 μm, and FIG. 6C shows the results where the wavelength is λ=0.65 μm. A comparison between the results where the depth of the grating is d=0.18 μm and the results where d=0 shows that the transmittance of the former drops at positions of arrows a, b, c, d, e and f, as compared with that of the latter. This is for the same reason as described above with reference to FIGS. 4A to 4D. However, in the region above the critical angle, the latter comes to the vicinity of zero whereas the former is substantially floating. This is because light of an angle of incidence above the critical angle diffracts through the diffraction grating of the light-coupling structure 3, and a portion thereof is converted to in-critical-angle light in the sheet. FIG. 6D shows the standard value (a value obtained by division by 90) of a value obtained by integrating each of the curves of FIGS. 6A, 6B and 6C for the angle of incidence θ, using the groove depth d as a parameter. For some conditions, an increase in d rather increased the take-out efficiency, thereby failing to obtain the light-confining effect. This indicates that the characteristics in the region above the critical angle cancel out the effects at the positions of the arrows a, b, c, d, e and f.

A comparison between analysis results of FIGS. 4 and 6 shows that the transmittance is successfully made zero above the critical angle in FIGS. 4A to 4D. A comparison between the results where the depth of the grating is d=0.18 μm and the results where d=0 shows there is no difference in the region above the critical angle, and they are both substantially zero. This is because the refractive index of the first light-transmitting layer 3a and the second light-transmitting layer 3b is set to be smaller than the refractive index of the light-transmitting sheet 2, resulting in total reflection at the surface 3q which is the interface between the second light-transmitting layer 3b and the light-transmitting sheet 2, whereby light of a large angle of incidence cannot enter the diffraction grating in the light-coupling structure 3, and there is no diffracted light caused by the diffraction grating. Thus, it can be seen that with the light-coupling structure 3, in order for the third light-transmitting layer 3c to be a light guide layer, the refractive index thereof may be larger than the refractive index of the first light-transmitting layer 3a and the second light-transmitting layer 3b, and in order for out-of-critical-angle light not to enter the third light-transmitting layer 3c, the refractive index of the first light-transmitting layer 3a and the second light-transmitting layer 3b may be smaller than the refractive index of the light-transmitting sheet 2. It can also be seen that in order to decrease the critical angle for the total reflection between the light-transmitting sheet 2 and the light-coupling structure, the difference between the refractive index of the first light-transmitting layer 3a and the second light-transmitting layer 3b and the refractive index of the light-transmitting sheet is preferably large, and the refractive index of the first light-transmitting layer 3a and the second light-transmitting layer 3b may be 1, for example.

Thus, with the light-trapping sheet of the present embodiment, light incident on the first principal surface and the second principal surface of the light-transmitting sheet at various angles becomes in-critical-angle light and enters a light-coupling structure arranged inside the light-transmitting sheet, and a portion thereof is converted by the diffraction grating in the light-coupling structure to guided light that propagates inside the third light-transmitting layer and is radiated from the end face of the light-coupling structure to be out-of-critical-angle light. Because the pitch of the diffraction grating varies and the azimuth of the diffraction grating varies from one light-coupling structure to another, this conversion is achieved for every azimuth over a wide wavelength range, e.g., over the entire visible light range. Since the length of the diffraction grating is short, it is possible to reduce the radiation loss of the guided light. Therefore, in-critical-angle light present inside the light-transmitting sheet is all converted to out-of-critical-angle light by a plurality of light-coupling structures. Since the refractive index of the first and second transmission layers of the light-coupling structure is smaller than the refractive index of the light-transmitting sheet, the out-of-critical-angle light is totally reflected by the surface of the light-coupling structure, and the light is repeatedly totally reflected between the surfaces of other light-coupling structures and the surface of the light-transmitting sheet, thus being confined within the light-transmitting sheet. Thus, the light-coupling structure irreversibly converts in-critical-angle light to out-of-critical-angle light, while maintaining out-of-critical-angle light in the out-of-critical-angle state. Therefore, if the density of the light-coupling structures is set to a sufficient density, it is possible to convert all the light incident on the light-trapping sheet to out-of-critical-angle light, i.e., light confined within the sheet.

Note that in FIG. 1A, the first principal surface 2p of the light-transmitting sheet 2 is covered by the cover sheet 2e via the buffer layer 2f therebetween. Therefore, a foreign matter 2g such as a drop of water remains on the surface of the cover sheet 2e, and is prevented from coming into contact with the first principal surface 2p. If the foreign matter 2g comes into contact with the first principal surface 2p, the total reflection relationship at the contact surface is lost, whereby the out-of-critical-angle light, which has been confined within the light-transmitting sheet 2, leaks to the outside via the foreign matter 2g. Although the spacer 2d is also in contact with the first principal surface 2p, the refractive index thereof is substantially the same as the refractive index of the environmental medium, the total reflection relationship at the contact surface is maintained, and the out-of-critical-angle light will not leak to the outside via the spacer 2d. If the surface area of the light-transmitting sheet is small, the buffer layer 2f may be formed between the cover sheet 2e and the first principal surface 2p, instead of providing the spacer 2d sandwiched therebetween.

Figure 33A:
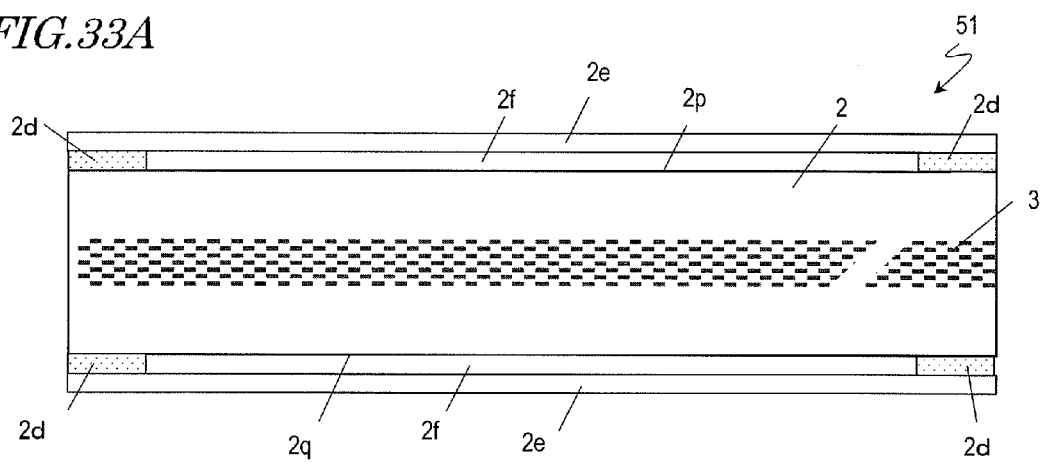
FIGS. 33A and 33B are schematic cross-sectional views showing still other embodiments of the light-trapping sheet according to the present disclosure.
Figure 33B:
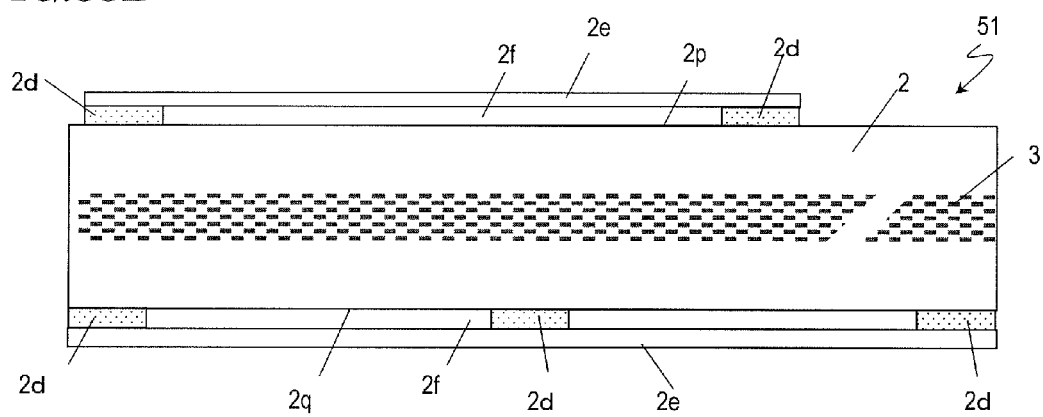

FIGS. 33A and 33B are cross-sectional views each showing an example arrangement of cover sheets 2e. In the example of FIG. 33A, cover sheets 2e are provided so as to oppose the first principal surface 2p and the second principal surface 2q of the light-transmitting sheet 2 both with a "gap" interposed therebetween. In this example, the first principal surface 2p and the second principal surface are entirely covered by the cover sheets 2e. In the example of FIG. 33B, a portion of the first principal surface 2p of the light-transmitting sheet 2 is not opposing the cover sheet 2e. Also in this example, a spacer 2d is provided at a position other than the end portions of the second principal surface 2q. Note that the "gap" described above may be filled with a fluid or a solid whose refractive index is sufficiently small.

The light-trapping sheet 51 can be manufactured by the following method, for example. FIGS. 7A to 7E are schematic cross-sectional configuration views showing a manufacturing procedure of the light-trapping sheet 51, and FIGS. 8A and 8B are schematic plan views each showing a pattern of a mold surface for producing the sheet.

Figure 8A:
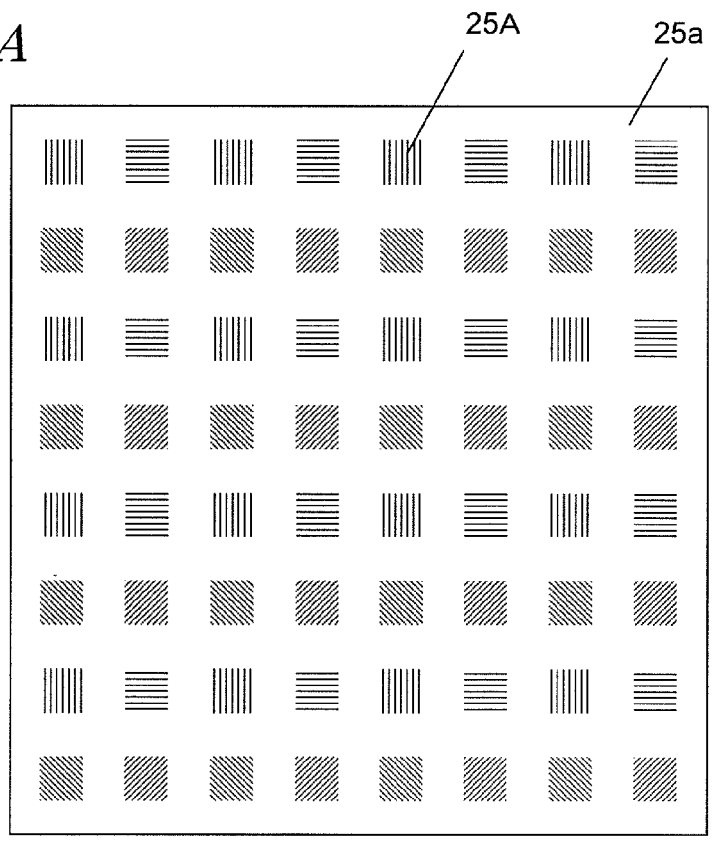
FIGS. 8A and 8B are schematic plan views each showing a surface pattern of a mold used in manufacturing the light-trapping sheet of the first embodiment.
Figure 8B:
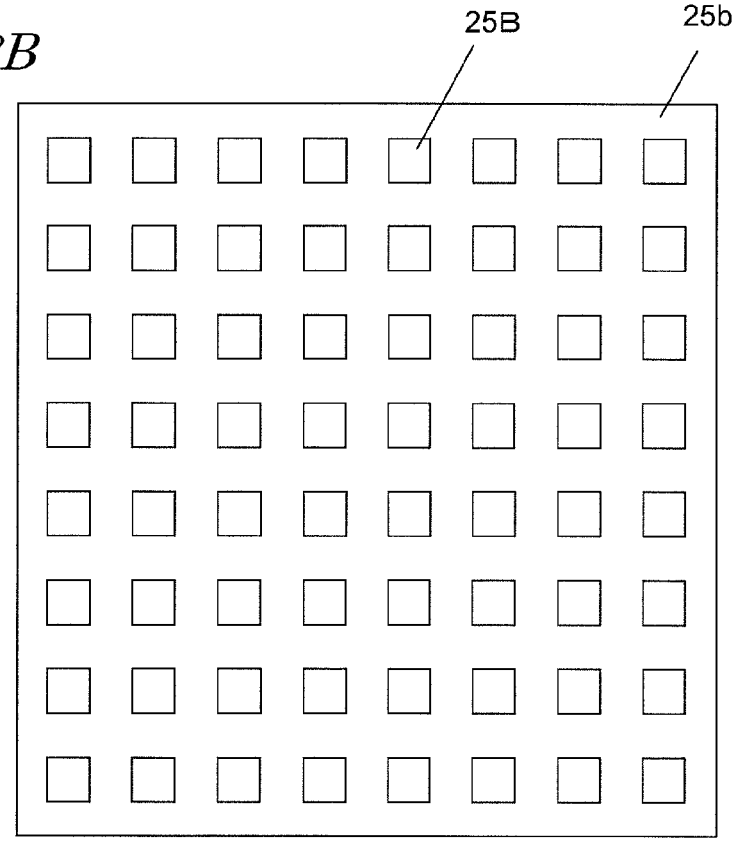

In FIGS. 8A and 8B, rectangular minute structures 25A and 25B of the same size are two-dimensionally arranged, for example, on the surfaces of molds 25a and 25b. The arrangement of the minute structures 25A on the mold 25a and the arrangement of the minute structures 25B on the mold 25b are equal. In the present embodiment, the minute structures 25A and 25B are protrusions. The height of the minute structures 25A is the dimension b of FIG. 2A, and the height of the minute structures 25B is equivalent to the dimension a. While the surface of the minute structure 25B is a plane, a linear diffraction grating having a height of d and a pitch of Λ is formed on the surface of the minute structure 25A, and the azimuth of the diffraction grating (the direction in which the depressed portion or the protruding portion extends) varies from one minute structure 25A to another. While gratings of azimuths of 45° intervals, i.e., 0°, 45°, 90° and 135°, are arranged regularly in FIGS. 8A and 8B, gratings may be arranged in practice with an equal frequency at azimuths of smaller intervals, e.g., 30° or 15°.

Figure 7A:
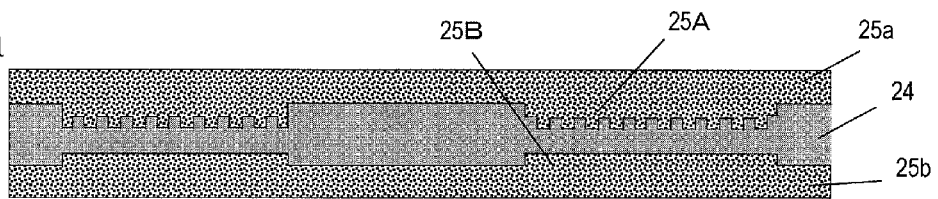
FIGS. 7A to 7E are schematic cross-sectional views showing a manufacturing procedure of the light-trapping sheet of the first embodiment.

As shown in FIG. 7A, with a thin layer of a spacer agent applied on the surface of the mold 25b, a transparent resin sheet 24 is laid on the surface of the mold 25b, and the mold 25a is arranged on the sheet, pressing the resin sheet 24 sandwiched between the mold 25b and the mold 25b while the minute structures 25B and the minute structures 25A are aligned with each other.

Figure 7B:
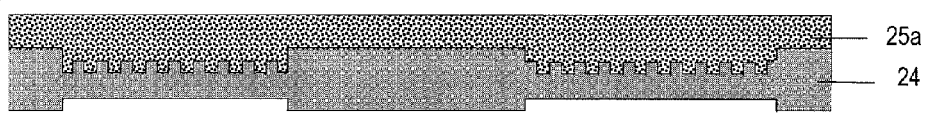
Figure 7C:
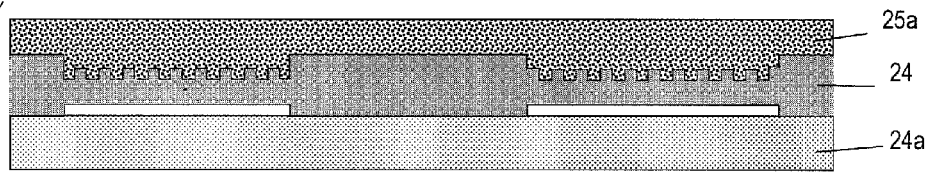
Figure 7D:
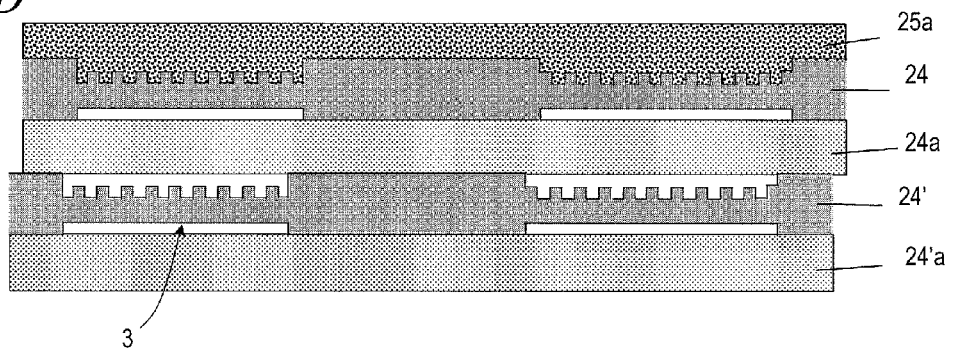

As shown in FIG. 7B, the mold 25a is lifted, thereby peeling the resin sheet 24 off the mold 25b, and the resin sheet 24 is pressed against a resin sheet 24a with a thin layer of an adhesive applied on the surface thereof as shown in FIG. 7C, thereby bonding together the resin sheet 24 and the resin sheet 24a. As shown in FIG. 7D, an adhesive is applied in a thin layer on the bottom surface of the resin sheet 24a, and it is pressed against similarly-formed resin sheets 24' and 24'a while ignoring the alignment therebetween, thus bonding them together.

Figure 7E:
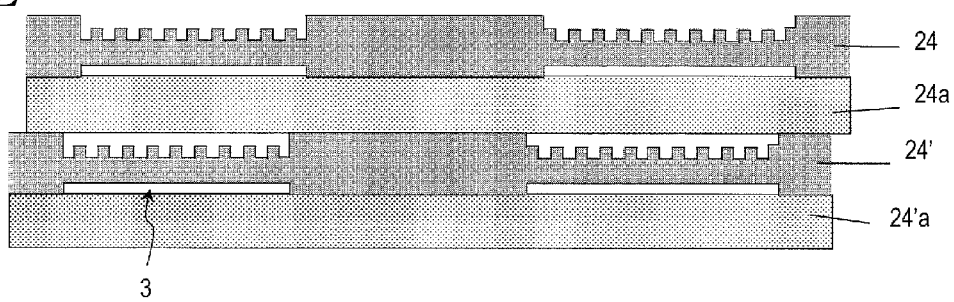

As shown in FIG. 7E, the mold 25a is lifted while the resin sheet 24'a is secured, thereby peeling the resin sheets 24, 24a, 24' and 24'a as a whole off the mold 25a.

Thereafter, the resin sheets 24, 24a, 24' and 24'a are replaced by the resin sheets 24' and 24'a of FIG. 7D, and these steps are repeated, thereby producing the third area 2a of the light-transmitting sheet 2 shown in FIG. 1A. Resin sheets to be the first area 2a and the second area 2b of the light-transmitting sheet 2 are bonded to the front surface and the reverse surface of the third area 2c of the light-transmitting sheet 2, thereby completing the light-trapping sheet 51 shown in FIG. 1A. While an adhesive is used for the bonding between resin sheets in the present embodiment, the surfaces of the resin sheets may be heated so as to weld together the resin sheets, instead of using an adhesive. Anti-reflective nanostructures may be formed in advance on the surface of the resin sheet 24a and the resin sheets to be the first area 2a and the second area 2b.

Second Embodiment

A second embodiment of a light-trapping sheet according to the present disclosure will be described. A light-trapping sheet 52 of the present embodiment is different from the light-coupling structure of the first embodiment in terms of the structure at the end face of the light-coupling structure. Therefore, the description hereinbelow will focus on the light-coupling structure of the present embodiment.

Figure 9A:
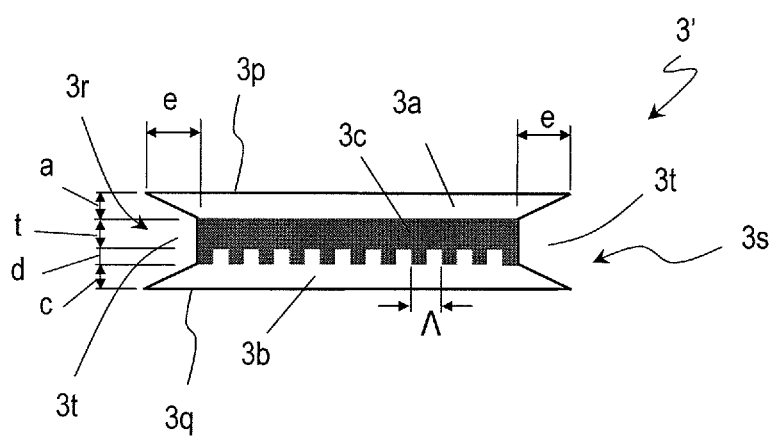
FIGS. 9A and 9B are a schematic cross-sectional view and a plan view showing a light-coupling structure used in a second embodiment of a light-trapping sheet according to the present disclosure.
Figure 9B:
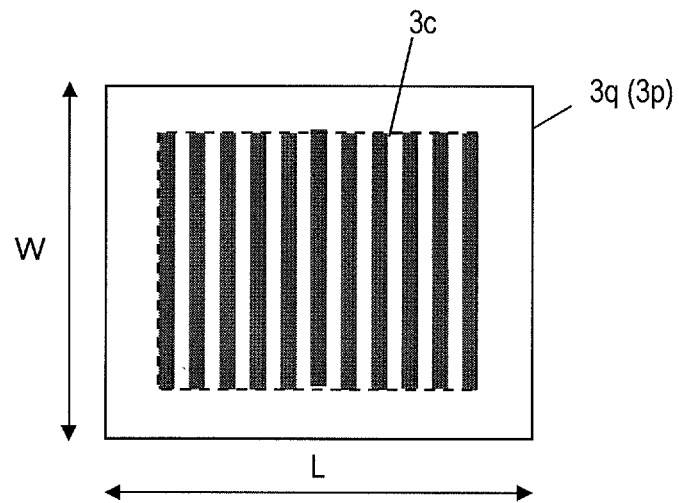

FIGS. 9A and 9B schematically show a cross-sectional structure and a planar structure of a light-coupling structure 3' along the thickness direction of the light-trapping sheet 52. As shown in FIGS. 9A and 9B, a depressed portion 3t having a depth of e is provided on the end faces 3r and 3s of the light-coupling structure 3'. The cross section of the depressed portion 3t has a width that is tapered inwardly. Therefore, in the light-coupling structure 3', the thickness of the first light-transmitting layer 3a and that of the second light-transmitting layer 3b decrease toward the outer edge side away from the center of the light-coupling structure 3'. The surfaces 3p and 3q are flat as they are in the first embodiment.

Figure 10:
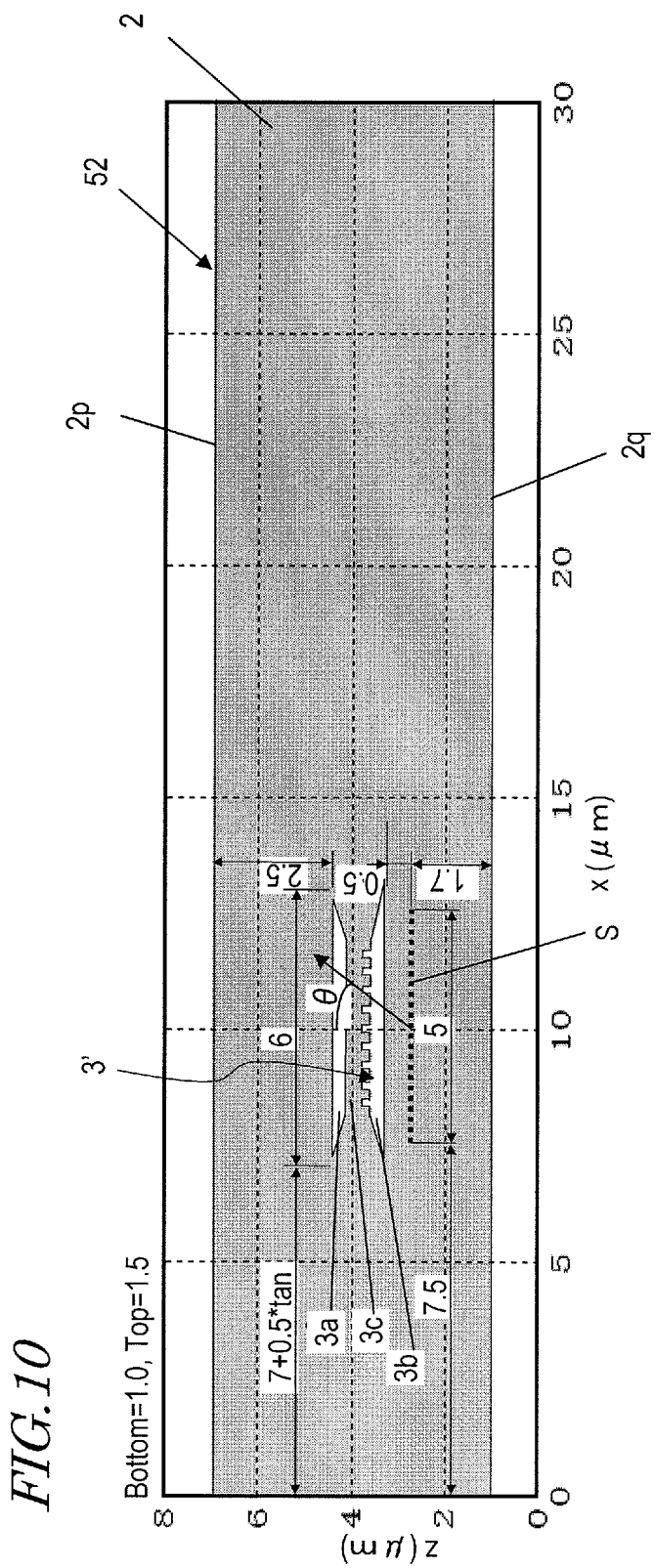
FIG. 10 is a cross-sectional view showing a structure used in analyzing the light-trapping sheet of the second embodiment.

FIG. 10 shows a cross-sectional structure of a light-trapping sheet used in an analysis for confirming the light-confining effect of the light-trapping sheet 52 including the light-coupling structure 3'. The light-coupling structure and the light source are arranged at just the same positions as the corresponding elements in the structure used in the analysis in the first embodiment (FIG. 3).

Figure 11A:
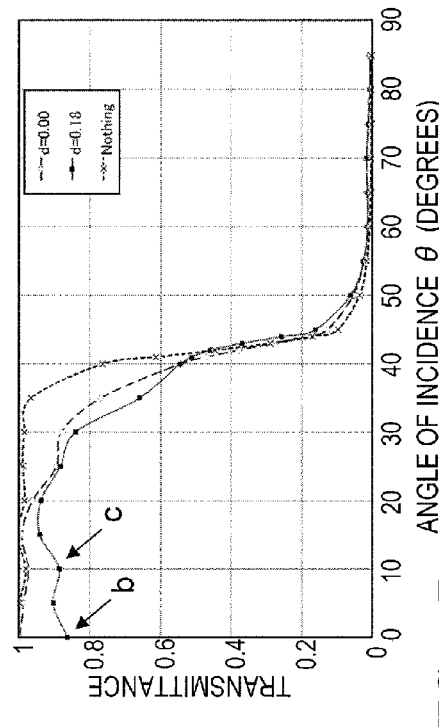
Figure 11B:
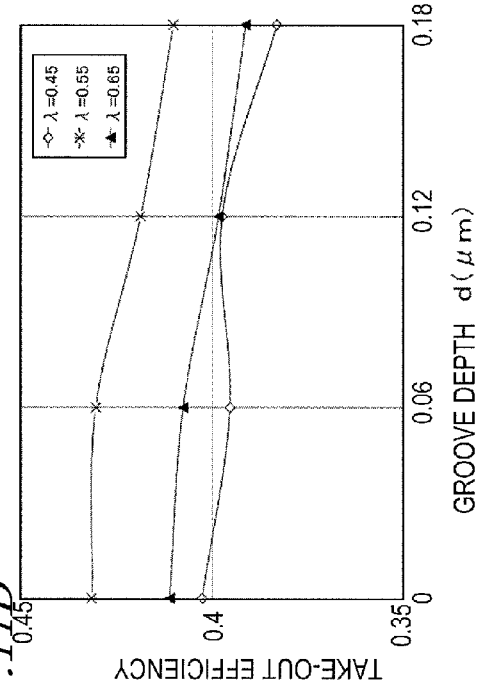
Figure 11C:
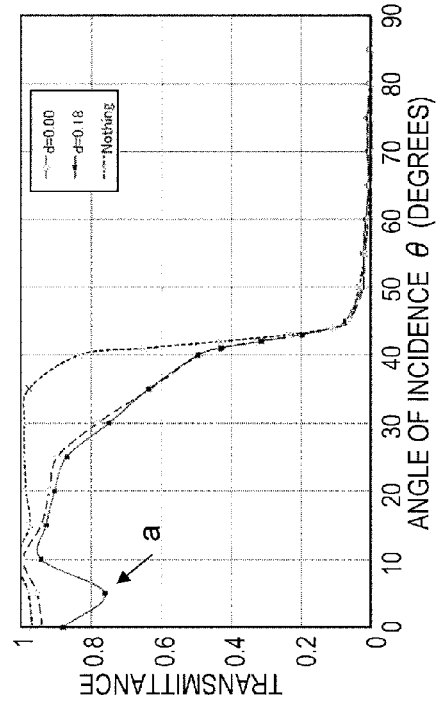

FIGS. 11A to 11C show results of an analysis using a light-trapping sheet having the structure shown in FIG. 10, each showing the relationship between the angle of incidence θ of light from the light source S incident on the light-coupling structure 3' and the transmittance of light that is output to the outside of the light-trapping sheet. The same method as that of the first embodiment was used for the analysis. FIG. 11A shows the results where the wavelength of the light source is λ=0.45 μm, FIG. 11B shows the results where the wavelength is λ=0.55 μm, and FIG. 11C shows the results where the wavelength is λ=0.65 μm. Each figure uses the depth d of the diffraction grating as a parameter, and is also plotting the results obtained under a condition where there is no light-coupling structure (a configuration only with the light-transmitting sheet 2 and the light source S).

A comparison between the results obtained in a case where the light-coupling structures 3' are present but the depth of the diffraction grating is d=0 and the results (Nothing) obtained in a case where there is no light-coupling structure shows that the former is smaller than the latter in a range within the critical angle (41.8°), and they are both zero for angles greater than or equal to that. The reason why the former is smaller within the critical angle is because light incident on the surface 3q of the second light-transmitting layer 3b is refracted and a portion thereof is output from the right side face (the right side face of the third light-transmitting layer 3c) as out-of-critical-angle light, as described above with reference to FIG. 2D.

Figure 11D:
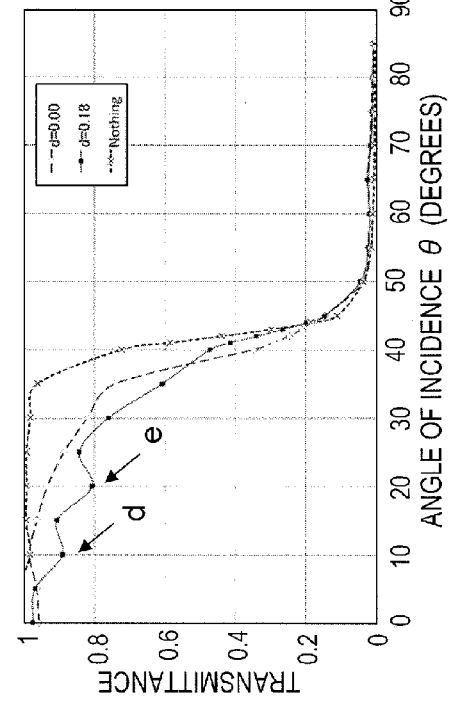

On the other hand, a comparison between the results for a case where the depth of the grating is d=0.18 μm and the results for a case where d=0 shows that although the transmittance of the former is substantially close to that of the latter, the transmittance drops at positions indicated by arrows a, b, c, d and e. These positions correspond to conditions under which light is coupled to the guided light. FIG. 11D shows the standard value (a value obtained by division by 90) of a value obtained by integrating each of the curves of FIGS. 11A, 11B and 11C for the angle of incidence θ, using the groove depth d as a parameter. Since the analysis model is two-dimensional, the integrated value is equal to the efficiency with which light in the sheet is taken out of the sheet. With any wavelength, the take-out efficiency decreases as d increases (at least for the comparison between d=0 and d=0.18). This represents the light-confining effect by a single light-coupling structure, as with the analysis results in the first embodiment. This effect can be accumulated, and by increasing the number of light-coupling structures, it is possible to confine all the light. Note that while this analysis is a two-dimensional model, there is always incident light that satisfies Expression 1, which is the coupling condition, for an arbitrary azimuthal angle φ shown in the plan view of FIG. 2A in an actual three-dimensional model, and therefore the transmittance curves shown in FIG. 11 will drop for the entire range of the angle of incidence θ, rather than for the local range such as the arrows a, b, c, d and e, thus increasing the light-confining effect of the light-coupling structures. The drops at positions of arrows b, c, d and e are smaller as compared with those of the analysis results of the first embodiment because the length of the grating (coupling length) is made smaller in the analysis model of this embodiment.

Figure 12A:
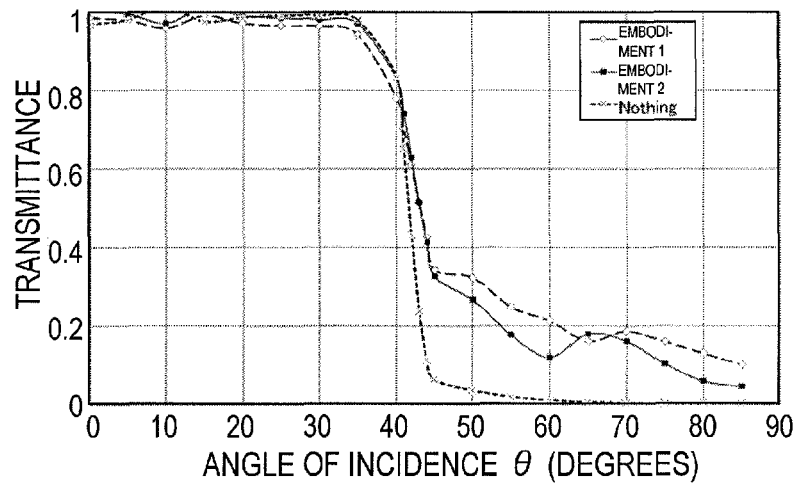
Figure 12B:
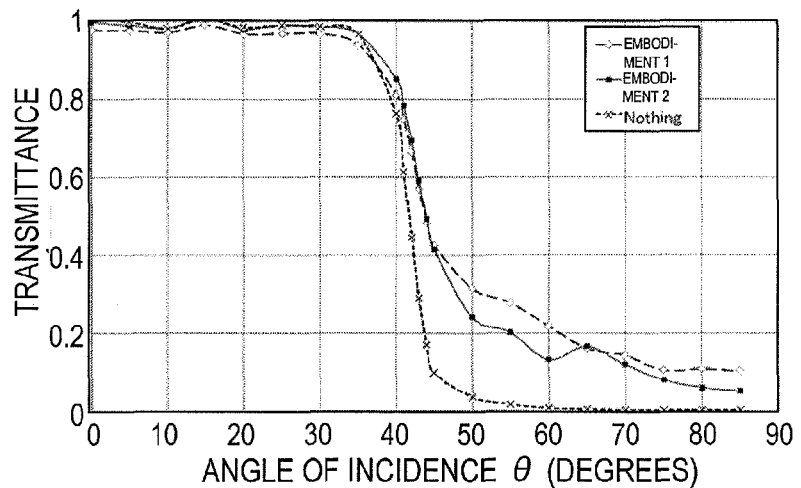
Figure 12C:
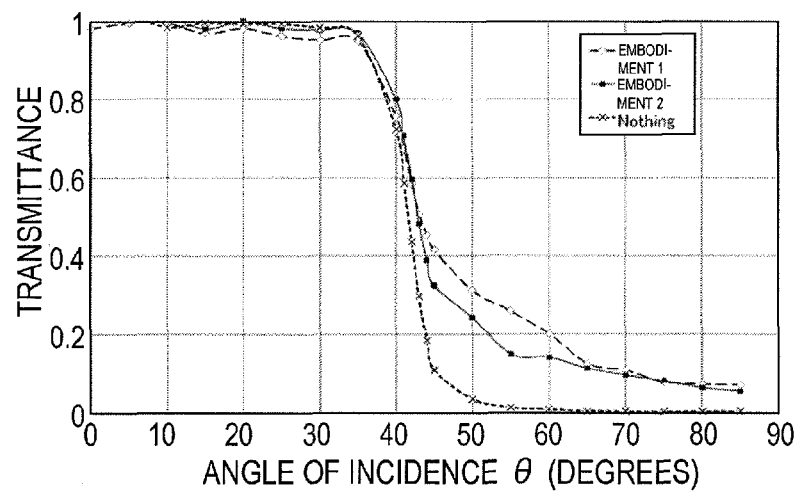
Figure 13A:
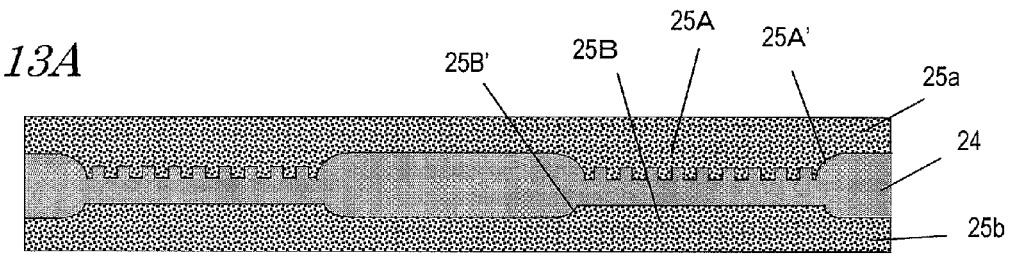
FIGS. 13A to 13E are schematic cross-sectional views showing a manufacturing procedure of the light-trapping sheet of the second embodiment.
Figure 13B:
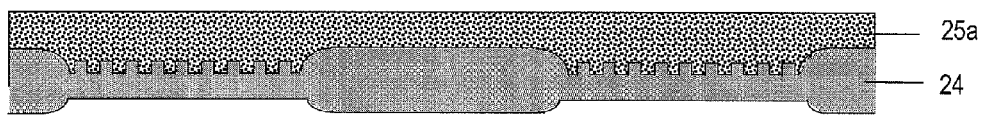
Figure 13C:
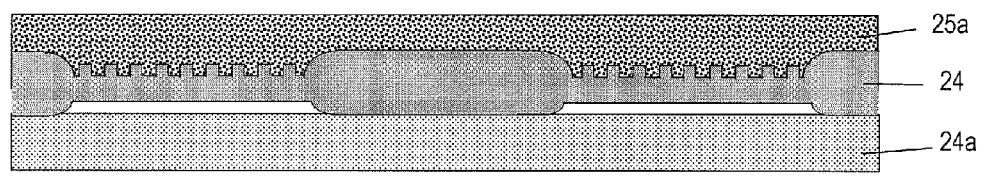
Figure 13D:
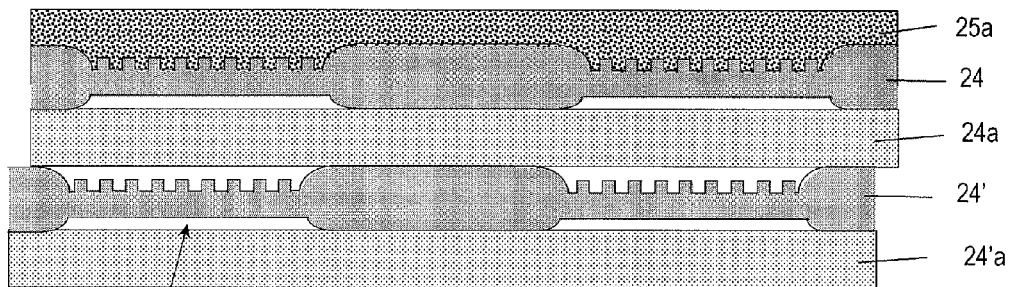
Figure 13E:
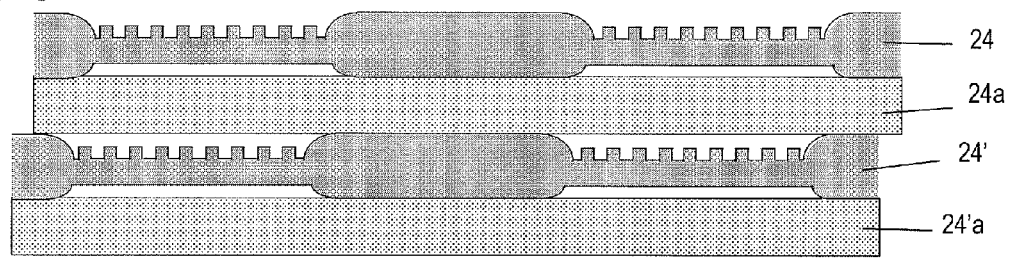

FIGS. 12A to 12C show results of an analysis of the second embodiment, each showing the relationship between the angle of incidence θ of light on the end face of a single light-coupling structure and the transmittance thereof out of the light-trapping sheet. In the analysis conditions used, only the position of the light source S is shifted by 5 μm in the x-axis negative direction from the conditions of FIG. 10 or FIG. 3. FIG. 12A shows a case where the wavelength of the light source is λ=0.45 μm, FIG. 12B a case where the wavelength is λ=0.55 μm, and FIG. 12C a case where the wavelength is λ=0.65 μm, wherein each figure shows a comparison between the model of this embodiment and the model of the first embodiment, and is also plotting the results obtained under a condition where there is no light-coupling structure (a configuration only with the light-transmitting sheet 2 and the light source S).

A comparison between the results for the model of the second embodiment and the results (Nothing) obtained in a case where there is no light-coupling structure shows that they substantially coincide with each other in both cases within the critical angle (41.8° or less), but the latter is substantially zero and the former substantially floats from zero outside the critical angle (41.8° or more). The former floats outside the critical angle because, as described above with reference to FIGS. 2C and 2D, light incident on the end face of the first light-transmitting layer 3a and the second light-transmitting layer 3b of the light-coupling structure refracts, and then becomes in-critical-angle light and is output from the first principal surface 2p. In contrast, in the analysis results for the model of the second embodiment, the floating outside the critical angle is partially suppressed. This is because the first light-transmitting layer 3a and the second light-transmitting layer 3b account for no area on the end face of the second embodiment, and the refraction at the end face is somewhat suppressed. Therefore, the second embodiment is a configuration such that the influence at the end face (the phenomenon that out-of-critical-angle light is converted to in-critical-angle light) can be ignored more than in the first embodiment, and can be said to be a configuration having a greater light-confining effect. Note that in FIG. 12, the length of the light source is set to 5 μm. Increasing this length will increase the proportion of a component that that deviates from the end face of the light-coupling structure and is incident directly on the first principal surface 2p to be totally reflected or is totally reflected at the surface 3q of the light-coupling structure, thus reducing the floating outside the critical angle. If the length of the light source is set to 20 μm, which is 4 times more, while the light-coupling structure is set to be about 21 μm, only the floating outside the critical angle, of the end face incidence characteristics, is reduced to about ¼.

FIGS. 13A to 13E are schematic cross-sectional views showing an example of a production procedure for the light-trapping sheet 52 of the present embodiment. The light-trapping sheet 52 can be manufactured by using a similar procedure to that of the first embodiment, while providing slopes 25A' and 25B' at the outer edge portions of the minute structures 25A and 25B of the molds 25a and 25b. Except for the shapes of the molds 25a and 25b being different, the light-trapping sheet 52 of the present embodiment can be manufactured in a similar manner to the light-trapping sheet 51 of the first embodiment, and therefore the manufacturing procedure will not be described in detail.

Third Embodiment

A third embodiment of a light-trapping sheet according to the present disclosure will be described. A light-trapping sheet 53 of the present embodiment is different from the light-coupling structure of the second embodiment in terms of the structure at the end face of the light-coupling structure. Therefore, the description hereinbelow will focus on the light-coupling structure of the present embodiment.

Figure 14A:
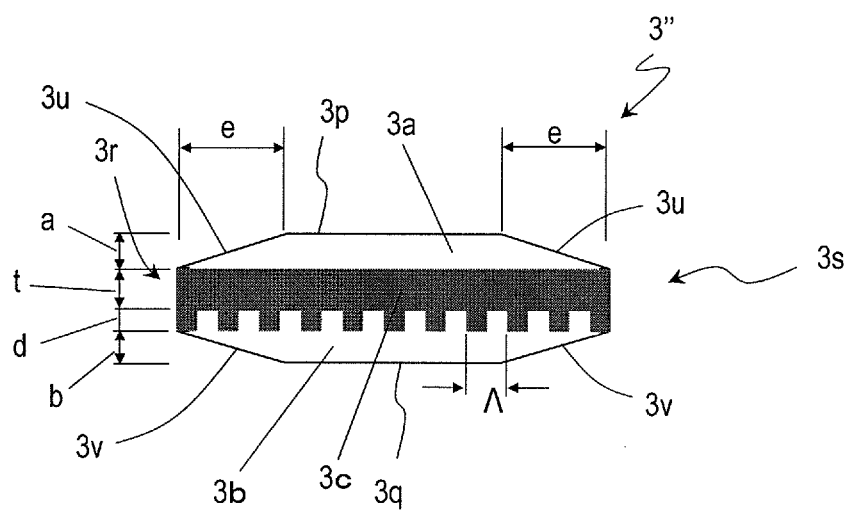
FIGS. 14A and 14B are a schematic cross-sectional view and a plan view showing a light-coupling structure used in a third embodiment of a light-trapping sheet according to the present disclosure.
Figure 14B:
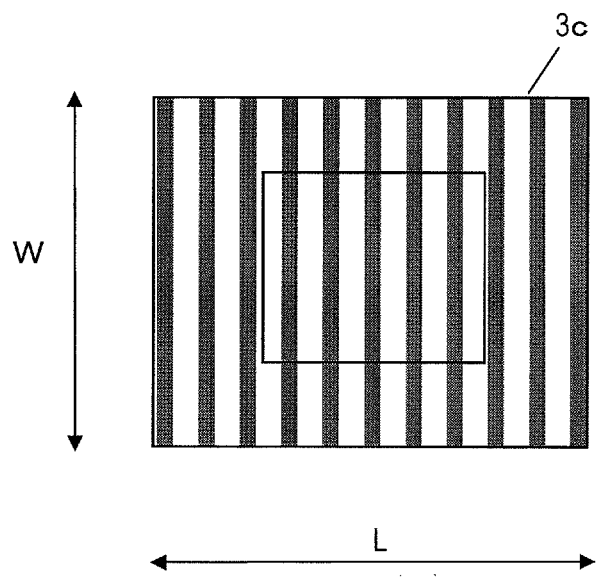

FIGS. 14A and 14B schematically show a cross-sectional structure and a planar structure of a light-coupling structure 3" along the thickness direction of the light-trapping sheet 53. As shown in FIGS. 14A and 14B, on the surfaces 3p and 3q of the light-coupling structure 3", tapered portions 3u and 3v are provided across areas having the width e adjacent to the end faces 3r and 3s. Therefore, the thicknesses of the first light-transmitting layer 3a and the second light-transmitting layer 3b are decreased toward the outer edge side away from the center of the light-coupling structure 3" while maintaining the flatness of the interface between the first light-transmitting layer 3a and the second light-transmitting layer 3b and the third light-transmitting layer 3c.

Figure 15:
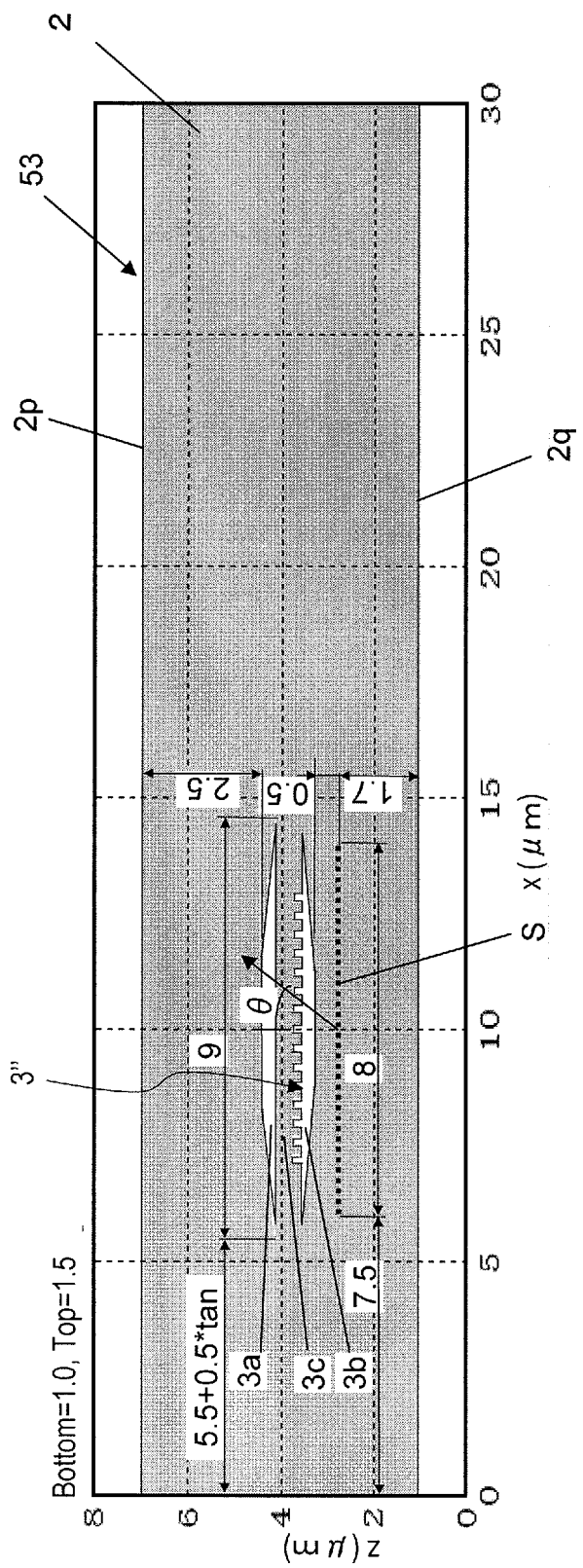
FIG. 15 is a cross-sectional view showing a structure used in analyzing the light-trapping sheet of the third embodiment.

FIG. 15 shows a cross-sectional structure of a light-trapping sheet used in the analysis for confirming the light-confining effect of the light-trapping sheet 53 including the light-coupling structure 3". The light-coupling structure and the light source are provided at just the same positions as those in the structure used in the analysis in the first embodiment (FIG. 3).

Figure 16A:
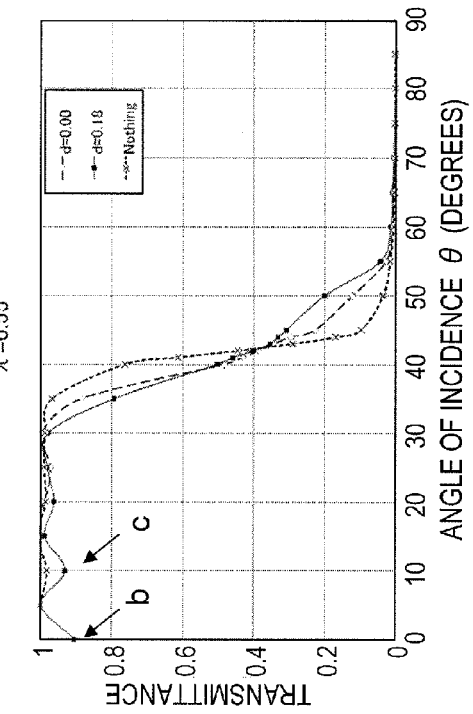
FIGS. 16A to 16D show results of an analysis conducted using the structure shown in FIG. 15, wherein FIGS. 16A to 16C each show the relationship between the angle of incidence and the transmittance out of the sheet.
Figure 16B:
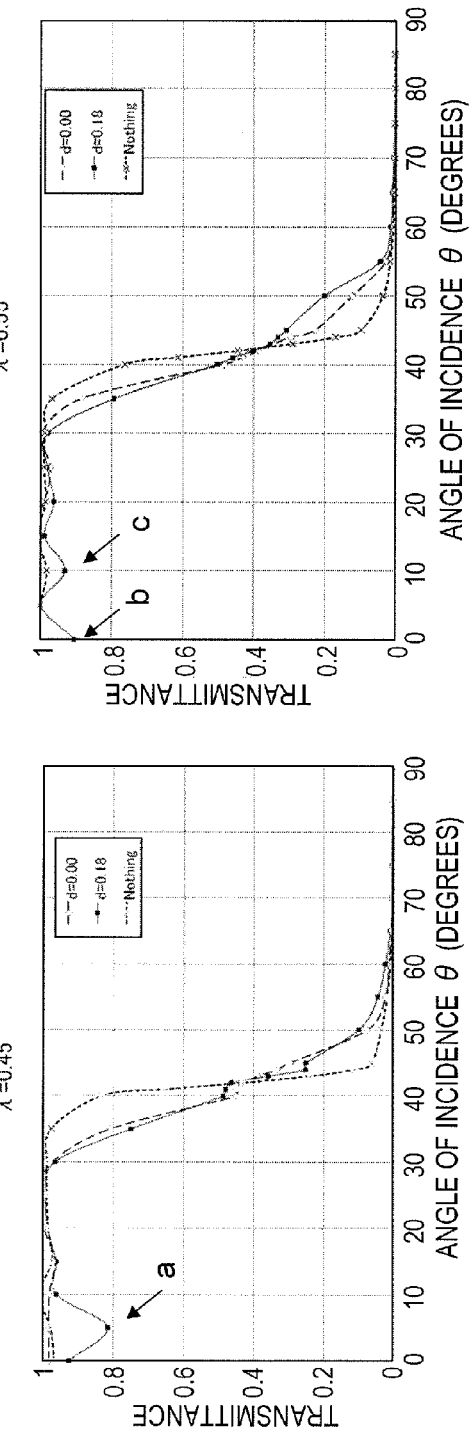
Figure 16C:
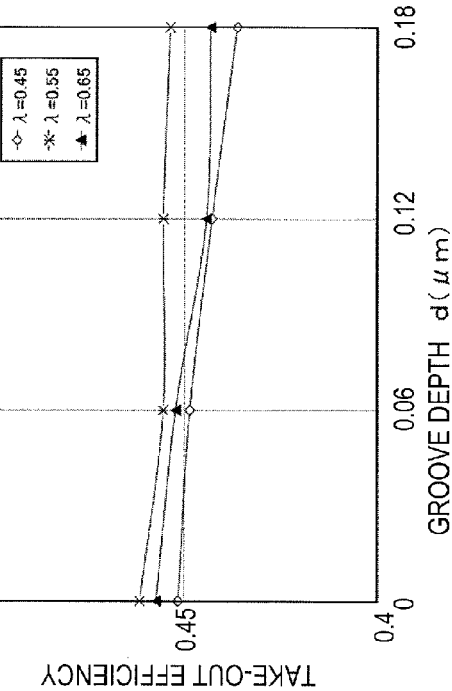

FIGS. 16A to 16C show results of an analysis using a light-trapping sheet having the structure shown in FIG. 15, each showing the relationship between the angle of incidence θ of light from the light source S incident on the side of the light-coupling structure 3' and the transmittance of light that is output to the outside of, the light-trapping sheet. The same method as that of the first embodiment was used for the analysis. FIG. 16A is for a case where the wavelength of the light source is λ=0.45 μm, FIG. 16B for a case where the wavelength is λ=0.55 μm, and FIG. 16C for a case where the wavelength is λ=0.65 μm, wherein each figure uses the depth d of the diffraction grating as a parameter, and is also plotting the results obtained under a condition where there is no light-coupling structure (a configuration only with the light-transmitting sheet 2 and the light source S).

A comparison between the results obtained in a case where the light-coupling structures are present but the depth of the grating is d=0 and the results (Nothing) obtained in a case where there is no light-coupling structure shows that the former is smaller than the latter in a range within the critical angle (41.8°), and the latter is zero for angles greater than or equal to the critical angle, whereas floating remains for the former in the range up to 55°. The reason why the former is smaller within the critical angle is because light incident on the surface 3q of the second light-transmitting layer 3b is refracted and a portion thereof is output from the right side face (the right side face of the third light-transmitting layer 3c) as out-of-critical-angle light, as described above with reference to FIG. 2D. There are two possible reasons for the former to float for angles greater than or equal to the critical angle. First, the surface 3q of the second light-transmitting layer 3b is sloped toward the outer edge portion, whereby a portion of light exceeding the critical angle can be incident on the surface 3q of the second light-transmitting layer 3b within the critical angle, and this light diffracts through the grating inside the light-coupling structure to be in-critical-angle light. Second, the thickness of the second light-transmitting layer 3b is too small in the outer edge portion, and a portion of light exceeding the critical angle passes into the inside of the light-coupling structure in the form of evanescent light, and this light diffracts through the grating to be in-critical-angle light.

On the other hand, a comparison between the results for a case where the depth of the diffraction grating is d=0.18 μm and the results for a case where d=0 shows that although the transmittance of the former is substantially close to that of the latter, the transmittance drops at positions of arrows a, b, c, d and e. These positions correspond to conditions under which light is coupled to the guided light, and the light is guided, after which it is radiated from the end face of the third light-transmitting layer 3c to be out-of-critical-angle light. This radiated light falls within the range of about ±35° about a propagation angle of 90° (x-axis direction) (see FIG. 5).

In FIGS. 16A to 16D, the floating of transmitted light is suppressed at the angle of incidence of 55° or more, and it becomes substantially zero, indicating that light to be guided light and radiated becomes out-of-critical-angle light (light whose propagation angle is 55° or more) that is repeatedly totally reflected and stays inside the sheet. Note that as the surface 3p of the first light-transmitting layer 3a and the surface 3q of the second light-transmitting layer 3b are sloped toward the outer edge portion, the propagation angle of light that is totally reflected at these surfaces increases and decreases depending on the slope direction, but since they occur with the same probability, it is possible to maintain substantially the same propagation angle as a whole.

Figure 16D:
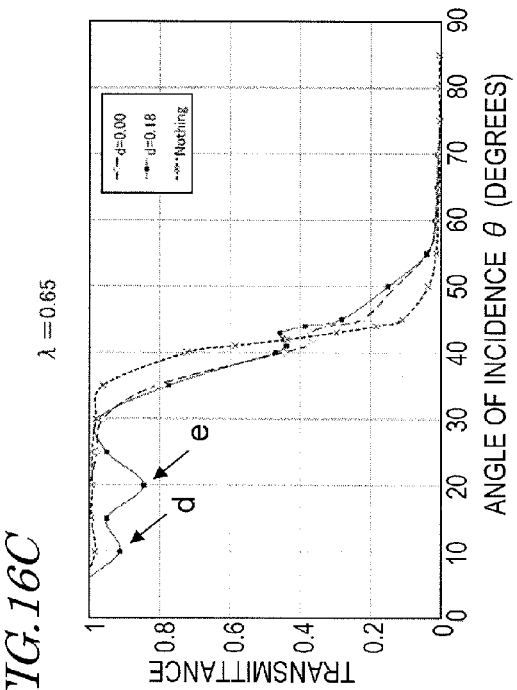

FIG. 16D shows the standard value (a value obtained by division by 90) of a value obtained by integrating each of the curves of FIGS. 16A, 16B and 16C for the angle of incidence θ, using the groove depth d as a parameter. Since the analysis model is two-dimensional, the integrated value is equal to the efficiency with which light in the sheet is taken out of the sheet. With any wavelength, the take-out efficiency decreases as d increases (at least for the comparison between d=0 and d=0.18). This represents the light-confining effect by a single light-coupling structure, as with the analysis results of the first embodiment. This effect can be accumulated, and by increasing the number of light-coupling structures, it is possible to confine all the light. Note that while this analysis is a two-dimensional model, there is always incident light that satisfies Expression 1, which is the coupling condition, for an arbitrary azimuthal angle φ shown in the plan view of FIG. 2A in an actual three-dimensional model, and therefore the transmittance curves shown in FIG. 16 will drop for the entire range of the angle of incidence θ, rather than for the local range such as the arrows a, b, c, d and e, thus increasing the light-confining effect of the light-coupling structures.

Figure 17A:
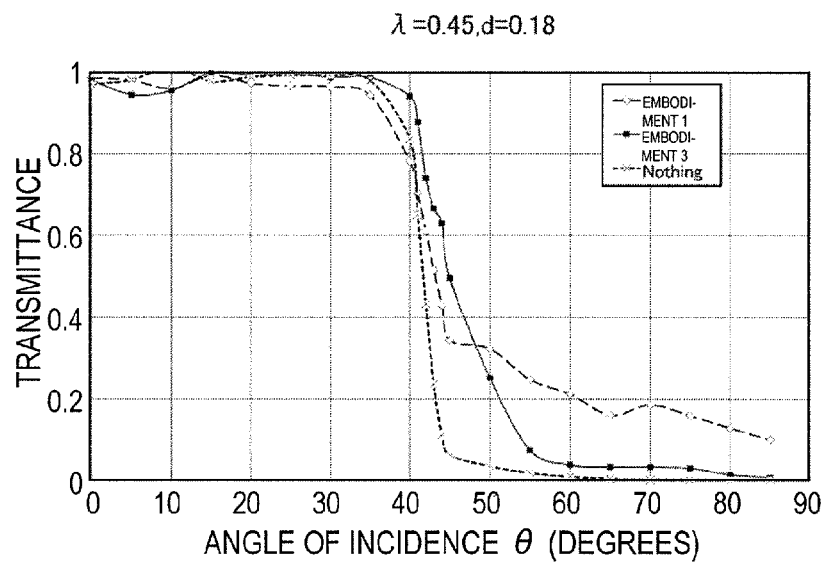
Figure 17B:
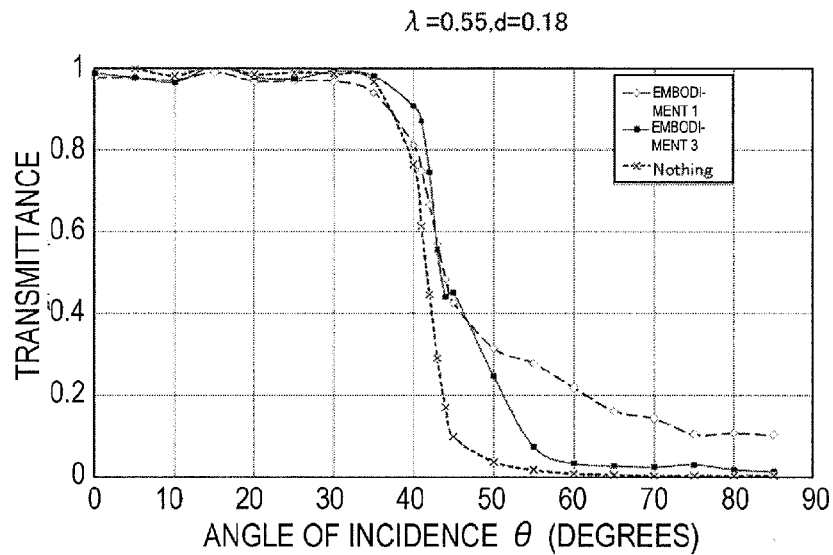
Figure 17C:
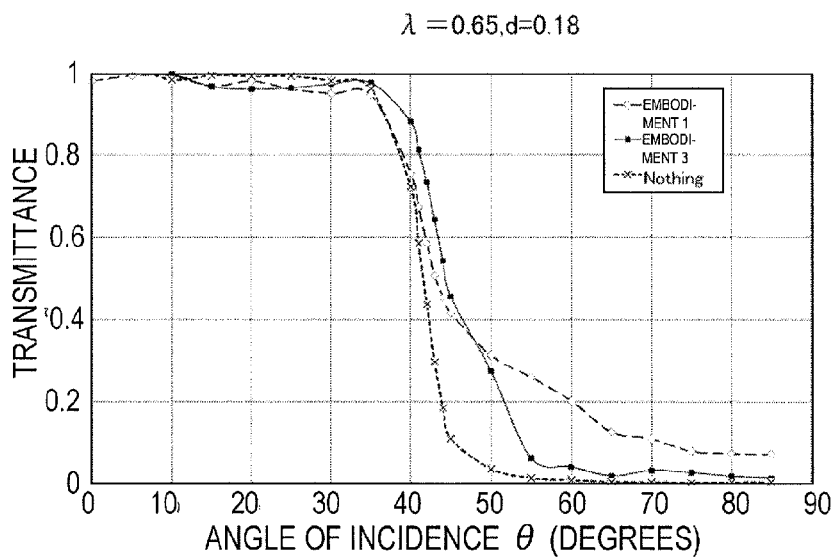

FIGS. 17A to 17C show results of an analysis using the sheet of the third embodiment, each showing the relationship between the angle of incidence θ of light on the end face of a single light-coupling structure and the transmittance thereof out of the light-trapping sheet. In the analysis conditions used, only the position of the light source S is shifted by 5 μm in the x-axis negative direction from the conditions of FIG. 15 or FIG. 3. FIG. 17A shows a case where the wavelength of the light source is λ=0.45 μm, FIG. 17B a case where the wavelength is λ=0.55 μm, and FIG. 17C a case where the wavelength is λ=0.65 μm, wherein each figure shows a comparison between the model of this embodiment and the model of Embodiment 1, and is also plotting the results obtained under a condition where there is no light-coupling structure (a configuration only with the light-transmitting sheet 2 and the light source S). A comparison between the results for the model of Embodiment 1 and the results (Nothing) obtained in a case where there is no light-coupling structure shows that they substantially coincide with each other in both cases within the critical angle (41.8° or less), but the latter is substantially zero and the former substantially floats outside the critical angle (41.8° or more). The former floats outside the critical angle because, as described above with reference to FIGS. 2C and 2D, light incident on the end face of the first light-transmitting layer 3a and the second light-transmitting layer 3b of the light-coupling structure refracts, and then becomes in-critical-angle light and is output from the upper surface. In contrast, with the results for the model of the third embodiment, the floating is significantly suppressed to be substantially zero in the range where the angle of incidence is 55° or more. This is because the first light-transmitting layer 3a and the second light-transmitting layer 3b account for no area on the end face of the third embodiment, and a component that is supposed to refract through the end face is totally reflected at the sloped surface 3q of the second light-transmitting layer 3b. Therefore, the third embodiment is a configuration such that the influence at the end face (the phenomenon that out-of-critical-angle light is converted to in-critical-angle light) can be ignored more than in the first embodiment or the second embodiment, and can be said to be a configuration having a greater light-confining effect.

The light-trapping sheet 53 can be manufactured by the following method, for example. FIGS. 18A to 18F are schematic cross-sectional configuration views showing a manufacturing procedure of the light-trapping sheet 53, and FIGS. 8A and 8B are schematic plan views each showing a pattern of a mold surface for producing the sheet. In FIG. 19A, the surface of the mold 25a is a plane, and rectangular minute structures 25A of the same size are two-dimensionally arranged, for example, on the surface of the mold 25a. The rectangular minute structure 25A is a diffraction grating having a height of d and a pitch of Λ. The azimuth of the diffraction grating varies from one minute structure 25A to another. While diffraction gratings of 45°-interval azimuths, i.e., 0°, 45°, 90° and 135°, are arranged regularly in FIG. 19A, gratings may be arranged in practice with an equal frequency at smaller azimuths intervals, e.g., 30° or 15°. The rectangular minute structures 25B and 25B' are two-dimensionally arranged also on the surfaces of the molds 25b and 25b' of FIG. 19B. The pitch of the arrangement of the minute structures 25B and 25B' is equal to the pitch of the arrangement of the minute structures 25A. The minute structures 25B and 25B' are depressed portions with planar bottoms. The depth of the depressed portion is equivalent to the dimension a or b of FIGS. 14A and 14B. The minute structures 25A of the mold 25a are so large that their square shapes are almost in contact with one another (they may be in contact with one another), the minute structures 25B and 25B' of the molds 25b and 25b' are smaller.

Figure 18A:
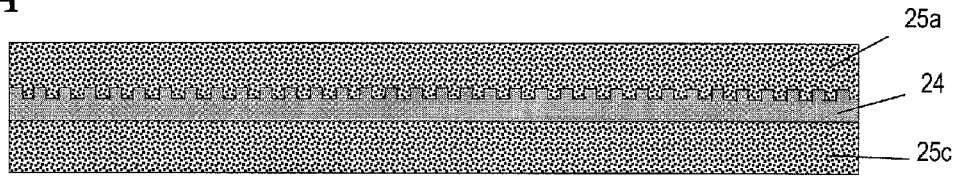
FIGS. 18A to 18F are schematic cross-sectional views showing a manufacturing procedure of the light-trapping sheet of the third embodiment.
Figure 18B:
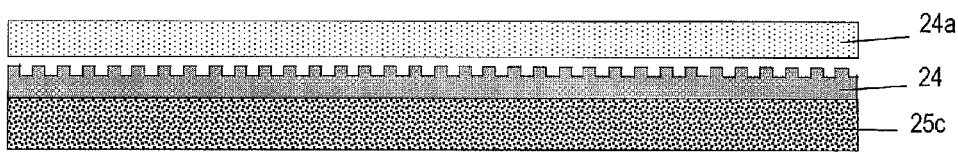
Figure 19A:
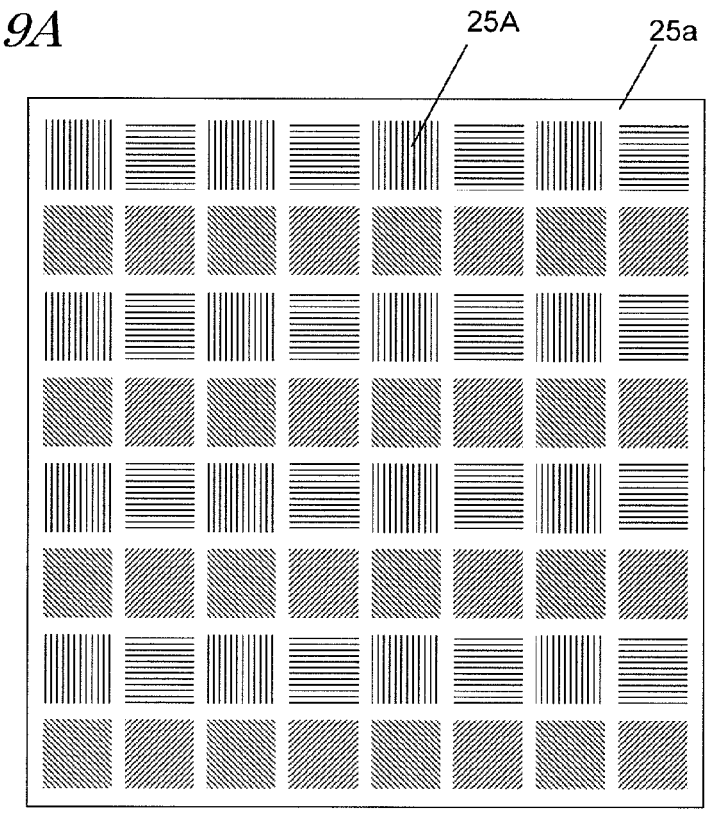
FIGS. 19A and 19B are schematic plan views each showing a surface pattern of a mold used in manufacturing the light-trapping sheet of the third embodiment.
Figure 19B:
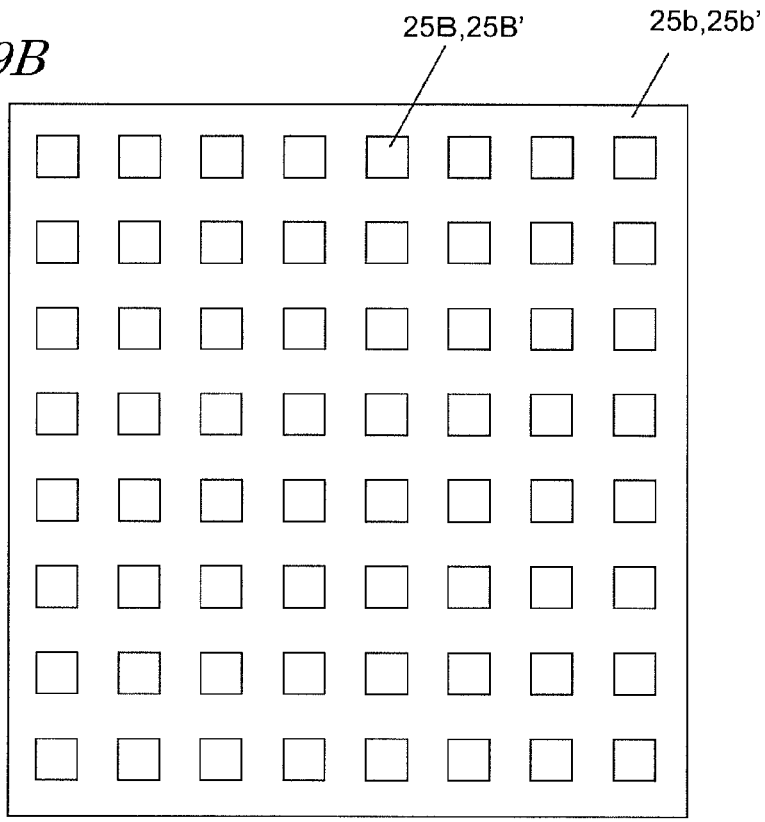

As shown in FIG. 18A, the transparent resin sheet 24 is laid on a mold 25c having a flat surface and, with a thin layer of a spacer agent applied thereon, is pressed by the mold 25a. As shown in FIG. 18B, the mold 25a is lifted to peel the mold 25a off the resin sheet, and the flat resin sheet 24a is laid on the resin sheet 24, onto which a diffraction grating has been transferred.

Figure 18C:
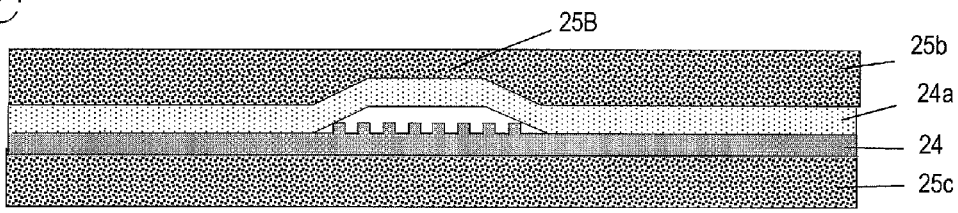
Figure 18D:
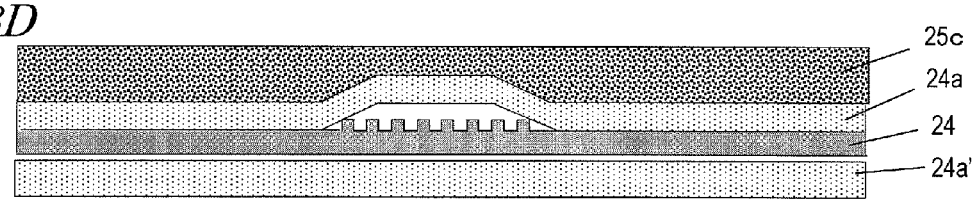
Figure 18E:
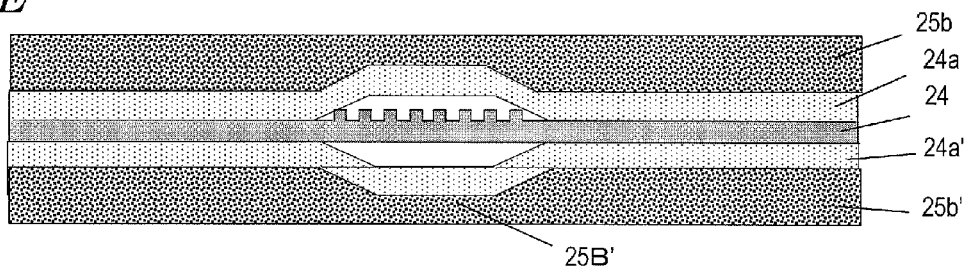
Figure 18F:
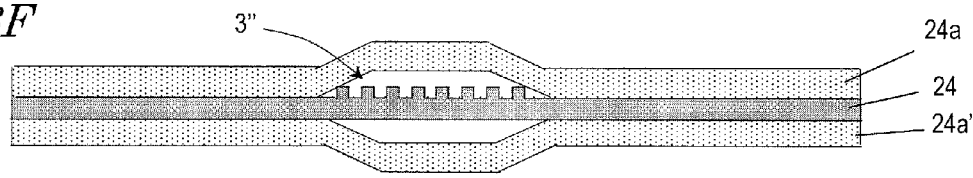

As shown in FIG. 18C, the resin sheet 24 and the resin sheet 24a are pressed by the mold 25b while being heated, and the resin sheet 24a is raised in the area of a depression 25B of the mold 25b while attaching the resin sheet 24 and the resin sheet 24a together in the other area. In this process, the diffraction grating is all buried to disappear in the attached portion, and remains only in the area where the resin sheet 24a is raised. Raising the resin sheet 24a forms an air layer (or a vacuum layer) between the resin sheet 24a and the resin sheet 24. As shown in FIG. 18D, the mold 25c is lifted to peel the mold 25c off the resin sheet 24, and a resin sheet 24a' is laid under the resin sheet 24. As shown in FIG. 18E, the resin sheet 24 and the resin sheet 24a' are pressed by a mold 25b' while being heated, and the resin sheet 24a' is raised in the area of a depression 25B' of the mold 25b' while attaching the resin sheet 24 and the resin sheet 24a' together in the other area. The rise of the resin sheet 24a' forms an air layer (or a vacuum layer) between the resin sheet 24a' and the resin sheet 24. As shown in FIG. 18F, the molds 25b and 25b' are peeled off, completing an attached sheet of the resin sheet 24a, the resin sheet 24 and the resin sheet 24a'. Thereafter, these attached sheets are bonded together via an adhesive layer therebetween, and the process is repeated, thereby producing the third area 2c of the light-transmitting sheet 2 shown in FIG. 1A. A resin sheet to be the first area 2a and the second area 2b of the light-transmitting sheet 2 is bonded to the front surface and the reverse surface of the third area 2c of the light-transmitting sheet 2, thereby completing the light-trapping sheet 53. Note that anti-reflective nanostructures may be formed in advance on the surface of the resin sheet to be the resin sheets 24a and 24a', the first area 2a and the second area 2b.

Fourth to tenth embodiments will be described hereinbelow. Descriptions with respect to the cover sheets 2e will be omitted because they are the same as, and redundant with, those given in the first embodiment.

Fourth Embodiment

Figure 20:
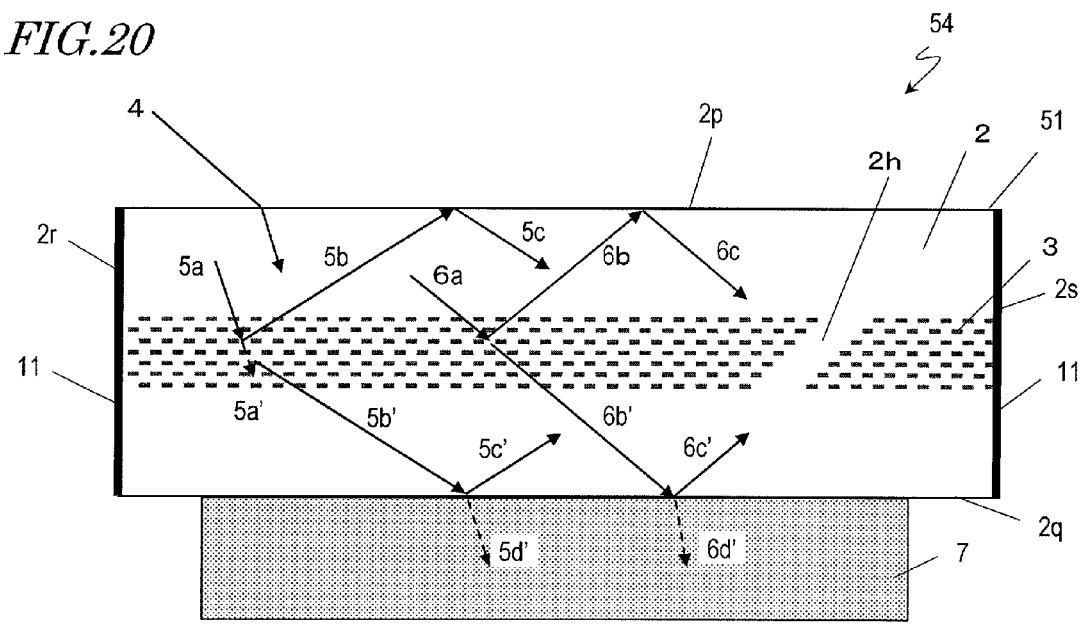
FIG. 20 is a schematic cross-sectional view showing an embodiment of a light-receiving device according to the present disclosure.

An embodiment of a light-receiving device according to the present disclosure will be described. FIG. 20 schematically shows a cross-sectional structure of a light-receiving device 54 of the present embodiment. The light-receiving device 54 includes the light-trapping sheet 51 of the first embodiment and a photoelectric conversion section 7. The light-trapping sheet 52 of the second embodiment or the light-trapping sheet 53 of the third embodiment may be used instead of the light-trapping sheet 51.

A reflective film 11 is preferably provided on end faces 2s and 2r of the light-trapping sheet 51. The photoelectric conversion section 7 is provided adjacent to the second principal surface 2q of the light-trapping sheet 51. If the light-transmitting sheet 2 has a plurality of end faces, the reflective film 11 may be provided on all of the end faces. In the present embodiment, a portion of the second principal surface 2q and a light-receiving portion of the photoelectric conversion section 7 are in contact with each other. The photoelectric conversion section 7 may be provided in a portion of the first principal surface 2p of the light-trapping sheet 51.

By covering the end faces 2r and 2s of the light-trapping sheet 51 with the reflective film 11, light that has been taken and enclosed in the light-trapping sheet 51 will circulate in the light-trapping sheet 51.

The photoelectric conversion section 7 is a solar cell formed by a silicon. A plurality of photoelectric conversion sections 7 may be attached to one sheet of light-trapping sheet 51. Since the refractive index of silicon is about 5, even if light is made incident perpendicularly on the light-receiving surface of a solar cell, around 40% of the incident light is normally lost through reflection without being taken in the photoelectric conversion section 7. The reflection loss further increases when the light is incident diagonally. Although an AR coat or anti-reflective nanostructures are formed on the surface of a commercially-available solar cell in order to reduce the amount of reflection, a sufficient level of performance has not been achieved. Moreover, a metal layer is present inside the solar cell, and a large portion of light that is reflected by the metal layer is radiated to the outside. With an AR coat or anti-reflective nanostructures, the reflected light is radiated to the outside with a high efficiency.

In contrast, the light-trapping sheet of the present disclosure takes in and encloses light for every visible light wavelength and for every angle of incidence in the light-trapping sheet. Therefore, with the light-receiving device 54, light entering through the first principal surface 2p of the light-trapping sheet 51 is taken into the light-trapping sheet 51 and circulates in the light-trapping sheet 51. Since the refractive index of silicon is larger than the refractive index of the light-transmitting sheet 2, the out-of-critical-angle light 5b' and 6b' incident on the second principal surface 2q are not totally reflected but portions thereof are transmitted into the photoelectric conversion section 7 as refracted light 5d' and 6d' and are converted to electric current in the photoelectric conversion section. After the reflected out-of-critical-angle light 5c' and 6c' propagate inside the photoelectric conversion section 7, they enter again and are used in photoelectric conversion until all the enclosed light is gone. Assuming that the refractive index of the transmissive sheet 2 is 1.5, the reflectance of light that is incident perpendicularly on the first principal surface 2p is about 4%, but the reflectance can be suppressed to 1 to 2% or less, taking into account the wavelength dependency and the angle dependency, if an AR coat or anti-reflective nanostructures are formed on the surface thereof. Light other than this enters to be confined within the light-trapping sheet 51, and is used in photoelectric conversion.

With the light-receiving device of the present embodiment, most of the incident light can be confined within the sheet, most of which can be used in photoelectric conversion. Therefore, it is possible to significantly improve the energy conversion efficiency of the photoelectric conversion section. The light-receiving area is determined by the area of a first principal surface p, and all of the light received by this surface enters the photoelectric conversion section 7. Therefore, it is possible to reduce the area of the photoelectric conversion section 7 or reduce the number of photoelectric conversion sections 7, thereby realizing a significant cost reduction of the light-receiving device.

Fifth Embodiment

Figure 21:
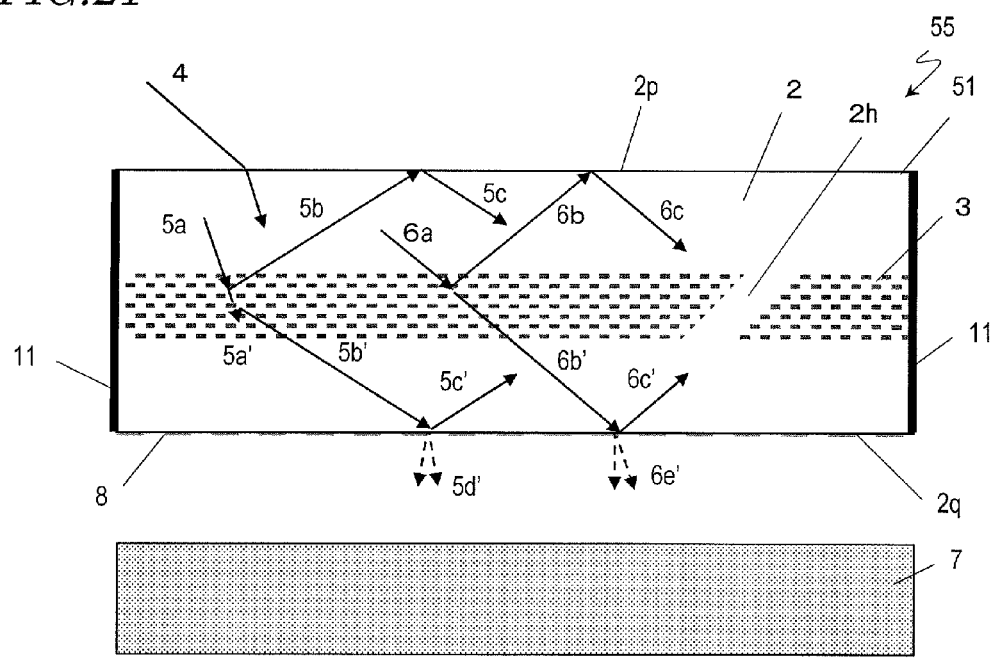
FIG. 21 is a schematic cross-sectional view showing another embodiment of a light-receiving device according to the present disclosure.

Another embodiment of a light-receiving device of the present disclosure will be described. FIG. 21 schematically shows a cross-sectional structure of a light-receiving device 55 of the present embodiment. The light-receiving device 55 includes the light-trapping sheet 51 of the first embodiment and the photoelectric conversion section 7. The light-trapping sheet 52 of the second embodiment or the light-trapping sheet 53 of the third embodiment may be used instead of the light-trapping sheet 51.

The light-receiving device 55 is different from the light-receiving device 54 of the fourth embodiment in that a protrusion/depression structure 8 is provided on the second principal surface 2q, with a gap between the protrusion/depression structure 8 and the photoelectric conversion section 7. The protrusion/depression structure 8 provided on the second principal surface 2q includes depressed portions and protruding portions whose width is 0.1 μm or more and which may be in a periodic pattern or a random pattern. With the protrusion/depression structure 8, the out-of-critical-angle light 5b' and 6b' incident on the second principal surface 2q are not totally reflected, and portions thereof travel toward the photoelectric conversion section 7 as output light 5d' and 6d' to undergo photoelectric conversion. Light that are reflected by the surface of the photoelectric conversion section 7 are taken inside through the second principal surface 2q of the light-trapping sheet 51 and propagates inside the light-trapping sheet 51, after which the light again travel toward the photoelectric conversion section 7 as the output light 5d' and 6d'. Therefore, also with the light-receiving device of the present embodiment, most of the incident light can be confined within the light-trapping sheet, most of which can be used in photoelectric conversion. As in the fourth embodiment, it is possible to reduce the area of the photoelectric conversion section 7 or reduce the number of photoelectric conversion sections 7. Therefore, it is possible to realize a light-receiving device having a significantly improved energy conversion efficiency and being capable of cost reduction.

Sixth Embodiment

Figure 22:
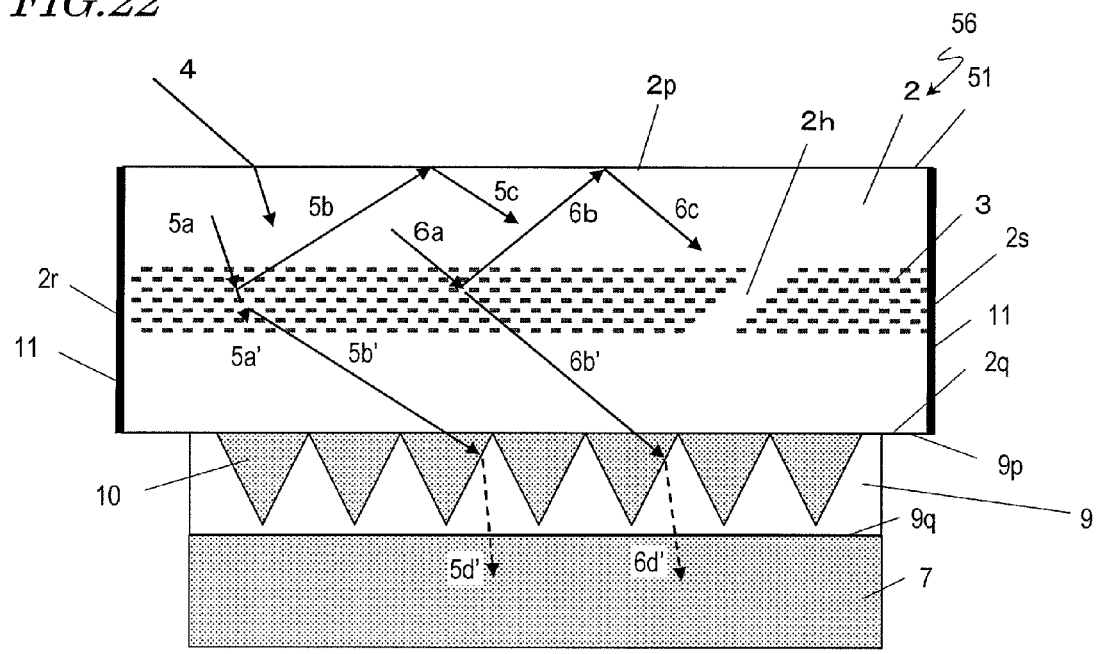
FIG. 22 is a schematic cross-sectional view showing another embodiment of a light-receiving device according to the present disclosure.

Another embodiment of a light-receiving device of the present disclosure will be described. FIG. 22 schematically shows a cross-sectional structure of a light-receiving device 56 of the present embodiment. The light-receiving device 56 includes the light-trapping sheet 51 of the first embodiment, the photoelectric conversion section 7, and a prism sheet 9. The light-trapping sheet 52 of the second embodiment or the light-trapping sheet 53 of the third embodiment may be used instead of the light-trapping sheet 51.

The light-receiving device 56 is different from the light-receiving device 54 of the fourth embodiment in that the prism sheet 9 is provided between the second principal surface 2q and the photoelectric conversion section 7. Tetrahedron prisms 10 are arranged adjacent to one another inside the prism sheet 9. The prism sheet 9 may be formed by layering together two triangular prism array sheets orthogonal to each other. Since the refractive index of the prism 10 is set to be larger than the refractive index of the prism sheet 9, the out-of-critical-angle light 5b' and 6b' incident on the surface of the prism sheet 9 are refracted by the prism surface to be 5d' and 6d' and travel toward the photoelectric conversion section 7. Since the angle of incidence of light to the photoelectric conversion section 7 is close to perpendicular, it is possible to reduce the reflection at the light-receiving surface of the photoelectric conversion section 7 and to reduce the number of light circulations within the light-trapping sheet 51 as compared with the fourth embodiment.

Also with the light-receiving device of the present embodiment, most of the incident light can be confined within the light-trapping sheet, most of which can be used in photoelectric conversion. As in the fourth embodiment, it is possible to reduce the area of the photoelectric conversion section 7 or reduce the number of photoelectric conversion sections 7. Therefore, it is possible to realize a light-receiving device having a significantly improved energy conversion efficiency and being capable of cost reduction. Since the number of light circulations within the sheet is smaller than the fourth embodiment, it is less influenced by the light enclosing capacity of the light-trapping sheet.

Seventh Embodiment

Figure 23:
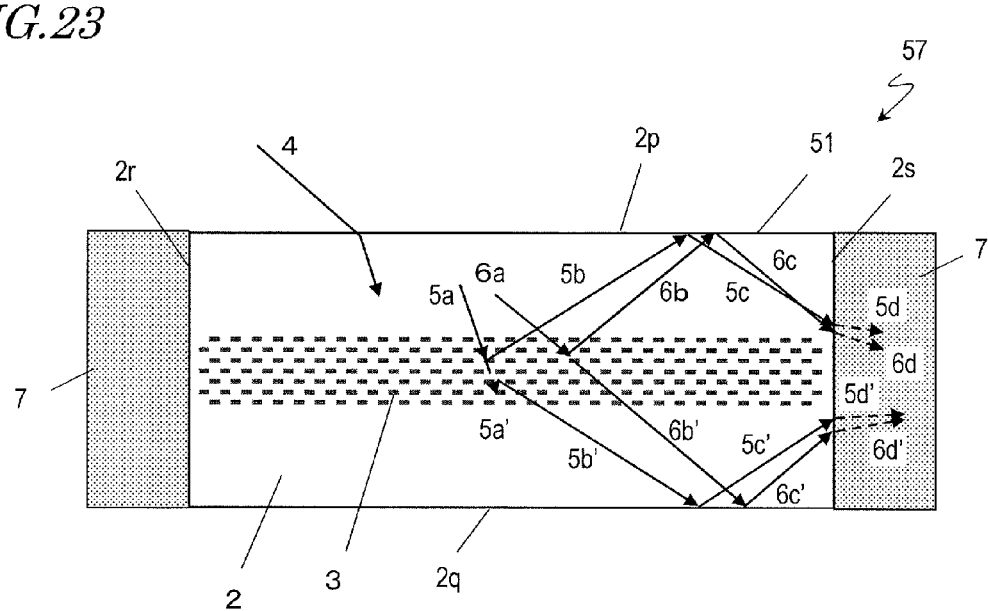
FIG. 23 is a schematic cross-sectional view showing another embodiment of a light-receiving device according to the present disclosure.

Another embodiment of a light-receiving device of the present disclosure will be described. FIG. 23 schematically shows a cross-sectional structure of a light-receiving device 57 of the present embodiment. The light-receiving device 57 includes the light-trapping sheet 51 of the first embodiment and the photoelectric conversion section 7. The light-trapping sheet 52 of the second embodiment or the light-trapping sheet 53 of the third embodiment may be used instead of the light-trapping sheet 51.

The light-receiving device 57 is different from the light-receiving device 54 of the fourth embodiment in that the end faces 2s and 2r are covered by the photoelectric conversion section 7 instead of the reflective film 11. If the light-transmitting sheet 2 has a plurality of end faces, the photoelectric conversion section 7 may be provided on all of the end faces. In the present embodiment, the fourth area 2h may be absent in the light-trapping sheet 51.

When the photoelectric conversion section 7 is provided on the end faces 2s and 2r, the out-of-critical-angle light 5c, 6c, 5c' and 6c' enter the photoelectric conversion section 7 along the normal to the light-receiving surface of the photoelectric conversion section 7, as opposed to the fourth embodiment. Therefore, there is less reflection at the surface of the photoelectric conversion section 7, and it is possible to reduce the number of light circulations within the light-trapping sheet 51.

Also with the light-receiving device of the present embodiment, most of the incident light can be confined within the light-trapping sheet, most of which can be used in photoelectric conversion. Therefore, it is possible to realize a light-receiving device having a significantly improved energy conversion efficiency. Since the area of the photoelectric conversion section 7 can be reduced as compared with the fourth embodiment, it is possible to significantly reduce the cost. Since the number of light circulations within the sheet is smaller than the fourth embodiment, it is less influenced by the light enclosing capacity of the light-trapping sheet.

Eighth Embodiment

Figure 24:
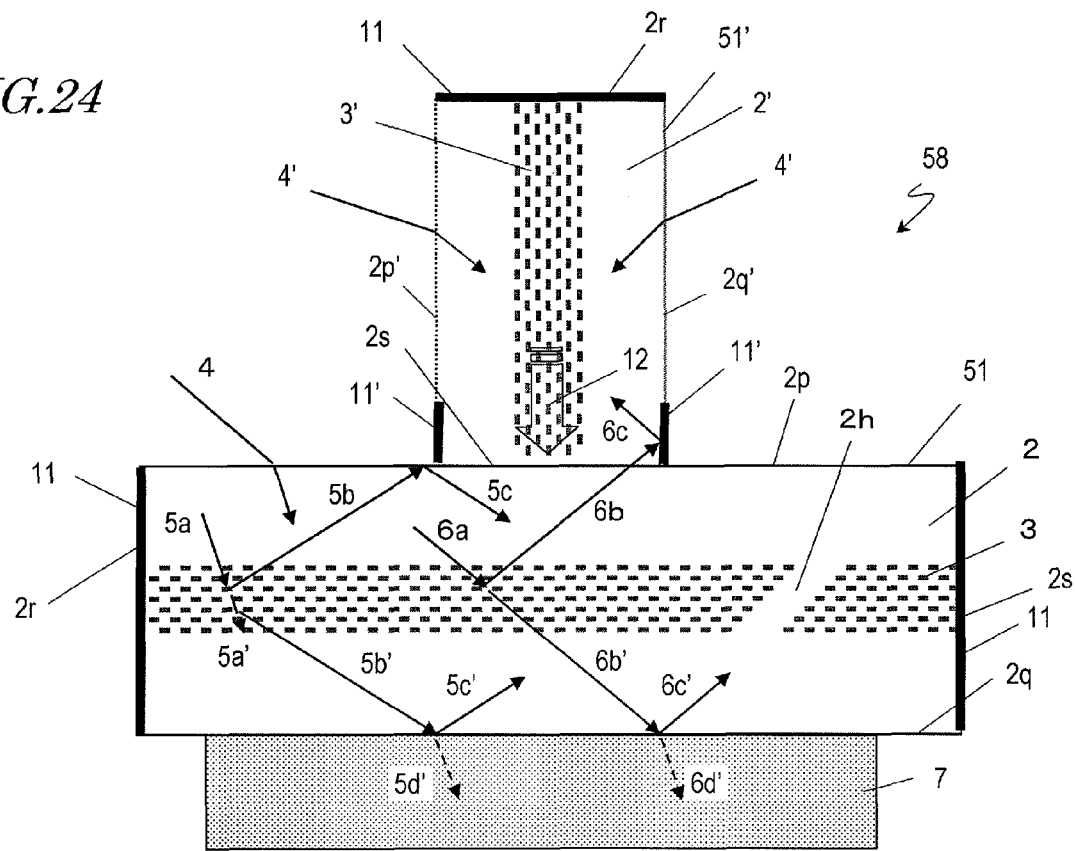
FIG. 24 is a schematic cross-sectional view showing another embodiment of a light-receiving device according to the present disclosure.

Another embodiment of a light-receiving device of the present disclosure will be described. FIG. 24 schematically shows a cross-sectional structure of a light-receiving device 58 of the present embodiment. The light-receiving device 58 includes light-trapping sheets 51 and 51', and the photoelectric conversion section 7. The first light-trapping sheet 51, the light-trapping sheet 52 of the second embodiment or the light-trapping sheet 53 of the third embodiment may be used, independently, instead of the light-trapping sheets 51 and 51'. In the present embodiment, the fourth area 2h may be absent in the light-trapping sheet 51'.

The light-receiving device 58 is different from the fourth embodiment in that the attachment is such that the end face 2s of the light-trapping sheet 51 is in contact with the first principal surface 2p of the light-receiving device 54 of the fourth embodiment. The light-trapping sheet 51' may be attached orthogonal to the light-trapping sheet 51. In the light-trapping sheet 51', the reflective film 11 may be provided on the end face 2r, and a reflective film 11' may be provided on a first principal surface 2p' and a second principal surface 2q' in the vicinity of the end face 2s which is attached to the light-trapping sheet 51. The reflective film 11' serves to reflect the light 6b so as to prevent the out-of-critical-angle light 6b from the light-trapping sheet 51 from leaking out of the light-trapping sheet 51'.

The light 4 incident on the first principal surface 2p of the light-trapping sheet 51 is taken into the light-trapping sheet 51. On the other hand, light 4' incident on the first principal surface 2p' and the second principal surface 2q' of the light-trapping sheet 51' is taken into the light-trapping sheet 51'. Light taken into the light-trapping sheet 51' becomes guided light 12 propagating toward the end face 2s, since the end face 2r is covered by the reflective film 11, and merges with the light inside the light-trapping sheet 51. Since a portion of the second principal surface 2q in the light-trapping sheet 51 is in contact with the surface of the photoelectric conversion section 7, and the refractive index of silicon is larger than the refractive index of the light-transmitting sheet 2, the out-of-critical-angle light 5b' and 6b' incident on the second principal surface 2q are not totally reflected but portions thereof are incident on the photoelectric conversion section 7 as the refracted light 5d' and 6d' and are converted to electric current in the photoelectric conversion section 7. The reflected out-of-critical-angle light 5c' and 6c' propagate inside the light-trapping sheet 51, are incident again on the light-receiving surface of the photoelectric conversion section 7, and are used in photoelectric conversion until the enclosed light is mostly gone.

Since the light-receiving device of the present embodiment includes the light-trapping sheet 51' perpendicular to the light-receiving surface of the photoelectric conversion section 7, even light that is incident diagonally on the first principal surface 2p of the light-trapping sheet 51 is incident, at an angle close to perpendicular, on the first principal surface 2p' and the second principal surface 2q' of the light-trapping sheet 51'. This makes it easier to take in light of every azimuth.

Also with the light-receiving device of the present embodiment, most of the incident light can be confined within the light-trapping sheet, most of which can be used in photoelectric conversion. As in the fourth embodiment, it is possible to reduce the area of the photoelectric conversion section 7 or reduce the number of photoelectric conversion sections 7. Therefore, it is possible to realize a light-receiving device having a significantly improved energy conversion efficiency and being capable of cost reduction.

Ninth Embodiment

Figure 25:
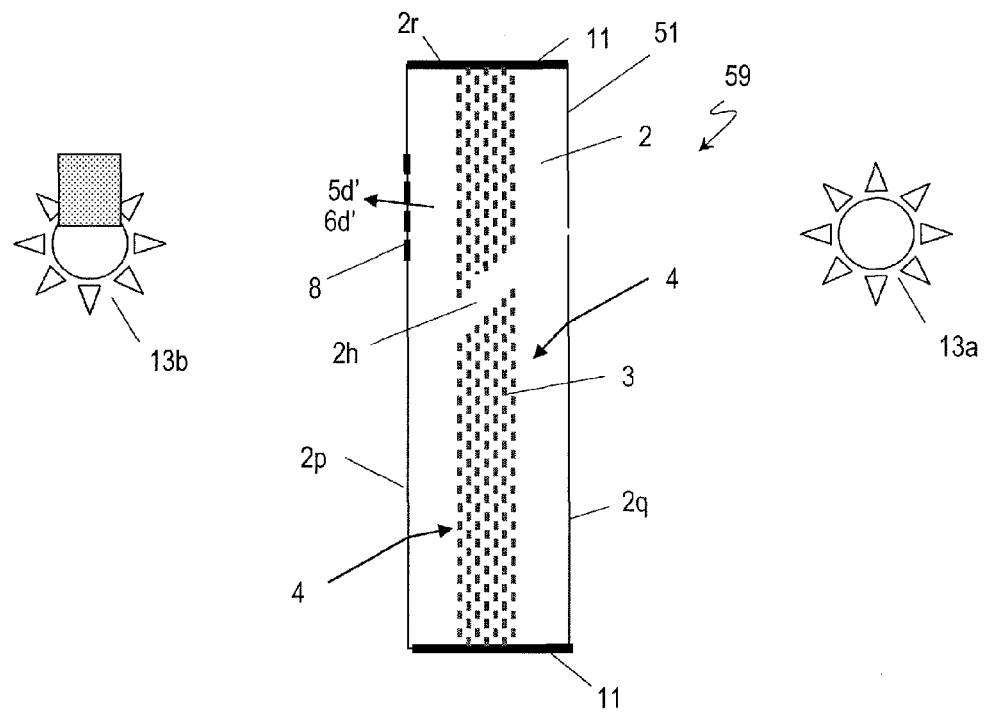
FIG. 25 is a schematic cross-sectional view showing an embodiment of a lighting plate according to the present disclosure.

An embodiment of a lighting plate according to the present disclosure will be described. FIG. 25 schematically shows a cross-sectional structure of a lighting plate 59 of the present embodiment. The lighting plate 59 includes the light-trapping sheet 51 of the first embodiment, and the protrusion/depression structure 8 provided on portions of the first principal surface 2p and the second principal surface 2q of the light-trapping sheet 51. The light-trapping sheet 52 of the second embodiment or the light-trapping sheet 53 of the third embodiment may be used instead of the light-trapping sheet 51. In the light-trapping sheet 51, the reflective film 11 is provided on the end faces 2r and 2s.

The protrusion/depression structure 8 is formed on a portion of the first principal surface 2p, forms a random pattern of depressed portions and protruding portions whose width is 0.1 μm or more. Light taken into the light-trapping sheet 51 propagates inside the light-trapping sheet 51, and portions of the propagating light are radiated outside as the output light 5d' and 6d' by the protrusion/depression structure 8.

The lighting plate 59 is provided on a window for lighting of a building such as a house so that the first principal surface 2p with the protrusion/depression structure 8 provided thereon is facing the room side. During the day, the lighting plate 59 takes in the light of the sun 13a through the second principal surface 2q, and radiates it into the room through the protrusion/depression structure 8. Thus, it can be used as an indoor lighting in which light is radiated from the protrusion/depression structure 8. During the night, the lighting plate 59 takes in light from an indoor lighting 13b through the first principal surface 2p, and radiates the light through the protrusion/depression structure 8. Thus, the lighting plate 59 can be used as an auxiliary to an indoor lighting. Thus, with the lighting plate of the present embodiment, it is possible to confine most of the incident light within the sheet, and reuse it as a lighting, thereby realizing an efficient use of energy.

Tenth Embodiment

An embodiment of a light-emitting device according to the present disclosure will be described. FIG. 26 schematically shows a cross-sectional structure of a light-emitting device 60 of the present embodiment. The light-emitting device 60 includes the light-trapping sheet 51, a light source 14, and the prism sheet 9. The light-trapping sheet 52 of the second embodiment or the light-trapping sheet 53 of the third embodiment may be used instead of the light-trapping sheet 51.

The light source 14, such as an LED, is provided adjacent to one of the first principal surface 2p and the second principal surface 2q of the light-trapping sheet 51, with the protrusion/depression structure 8 provided on the other. In the present embodiment, the light source 14 is provided adjacent to the first principal surface 2p, and the protrusion/depression structure 8 is provided on the second principal surface 2q. The reflective film 11 is provided on the end faces 2s and 2r of the light-trapping sheet 51. The protrusion/depression structure 8 includes depressed portions and protruding portions whose width is 0.1 µm or more and which may be in a periodic pattern or a random pattern.

The prism sheet 9 is arranged with a gap from the second principal surface 2q so as to oppose the protrusion/depression structure 8. The tetrahedron prisms 10 are arranged adjacent to one another inside the prism sheet 9. The prism sheet 9 may be formed by layering together two triangular prism array sheets orthogonal to each other.

The light 4 output from the light source 14 is taken in through the first principal surface 2p of the light-trapping sheet 51 to be the light 12 that propagates inside the light-trapping sheet 51. Portions of this light are radiated outside as the output light $5d'$ and $6d'$ by the protrusion/depression structure 8. The radiated light is condensed through the prisms 10 inside the prism sheet 9 to be light 4a having a substantially parallel wave front.

With the light-emitting device of the present embodiment, it is possible, with a simple and thin configuration, to confine light output from a point light source into a light-trapping sheet, and take out the light as a surface light source.

Eleventh Embodiment

An embodiment of a light-trapping rod according to the present disclosure will be described. FIGS. 27A and 27B schematically show a cross-sectional structure of a light-trapping rod 61 of the present embodiment parallel to the central axis, and a cross-sectional structure thereof perpendicular to the central axis. The light-trapping rod 61 includes a light-transmitting rod 2', and at least one light-coupling structure 3 arranged inside the light-transmitting rod 2'.

The light-transmitting rod 2' has a circular or elliptical cross-sectional shape on a plane that is perpendicular to the central axis C. The light-transmitting rod 2' is formed by a transparent material that transmits therethrough light of a desired wavelength or light within a desired wavelength range determined according to the application, as in the first embodiment.

The cover sheet 2e is bonded to the outside of the light-transmitting rod 2' with the spacer 2d sandwiched therebetween. Therefore, most of the principal surface 2u, which is the surface of the light-transmitting rod 2', is in contact with a buffer layer 2f. The spacer 2d is formed by a material having a lower refractive index than the light-transmitting rod 2', such as an aerogel.

Where the cross section of the light-transmitting rod 2' is circular, the diameter D of the light-transmitting rod 2' on a cross section perpendicular to the central axis C is about 0.05 mm to 2 mm, for example. One or more light-coupling structures 3 are provided at a distance of d3 or more from a surface 2u, which is the principal surface of the light-transmitting rod 2', in the direction toward the central axis C. Preferably, the light-trapping rod 61 includes a plurality of coupling structures 3. The light-transmitting rod 2' has a circular or elliptical cross-sectional shape, and the light-coupling structures 3 are arranged within a core region 2A that has a circular shape having a diameter of $d=D-2\times d3$ centered about the central axis C on a plane that is perpendicular to the central axis C of the light-transmitting rod 2' and that is extending along the central axis C direction.

The light-coupling structures 3 are arranged within the core region 2A at a predetermined density in the axial direction, the radial direction and the circumferential direction. The density at which the light-coupling structures 3 are arranged is, for example, 10 to $10^3$ per 1 mm in the axial direction, 10 to $10^3$ per 1 mm in the radial direction, and 10 to $10^3$ per 1 mm in the circumferential direction. The cross-sectional shape of the core region is circular or elliptical, and may be a shape with two or more rings.

The light-coupling structures 3 have the same structure as that of the light-coupling structures 3 of the first embodiment. The light-trapping rod 61 may include the light-coupling structures 3' of the second embodiment or the light-coupling structures 3" of the third embodiment, instead of the light-coupling structures 3.

The light-coupling structures 3 is arranged within the core region 2A so that the diffraction grating of the third light-transmitting layer 3c is parallel to the central axis C of the light-transmitting rod 2'. The length L of the light-coupling structure 3 in the central axis C direction is 3 µm to 100 µm, and the length W thereof in the direction orthogonal thereto is about ⅓ to 1/10 of L.

In FIGS. 27A and 27B, it is assumed that the refractive index of the environmental medium surrounding the light-trapping rod 61 is 1.0, and the refractive index of the light-transmitting rod 2' is $n_s$. The light 4 from the environmental medium passes through the cover sheet 2e and the buffer layer 2f and enters the inside of the light-transmitting rod 2' through the principal surface 2u of the light-transmitting rod 2'. The buffer layer 2f is formed by the same medium as the environmental medium, and the refractive index thereof is 1. The refractive index of the spacer 2d is substantially equal to 1. An AR coat or anti-reflective nanostructures (e.g., moth-eye structures) may be formed on both surfaces of the cover sheet 2e or the surface 2u in order to increase the transmittance of the incident light 4. Herein, of the light inside the light-transmitting rod 2', light that satisfies $\sin \theta < 1/n_s$ will be referred to as the in-critical-angle light and light that satisfies $\sin \theta \geq 1/n_s$ as the out-of-critical-angle light, regarding the angle θ (propagation angle) formed between the propagation azimuth and the normal to the rod surface.

First, light vectors on a cross section parallel to the central axis C of the light-transmitting rod 2' will be discussed. In this cross section, a portion of the in-critical-angle light 5a inside the light-transmitting rod 2' is converted by a light-coupling structure 3 to the out-of-critical-angle light 5b, and this light is totally reflected by the surface 2u to be the out-of-critical-angle light 5c which stays inside the light-transmitting rod 2'. A portion of the remaining in-critical-angle light 5a' of the in-critical-angle light 5a is converted by another light-coupling structure 3 to the out-of-critical-angle light 5b', and this light is totally reflected by the surface 2u to be the out-of-critical-angle light 5c' which stays inside the rod. In this manner, all of the in-critical-angle light 5a is converted to the out-of-critical-angle light 5b or 5b' within the core region 2A where the light-coupling structures 3 are provided. On the other hand, a portion of the out-of-critical-angle light 6a inside the light-transmitting rod 2' is totally reflected by the surface of a light-coupling structure 3 to be the out-of-critical-angle light 6b, and this light is totally reflected by the surface 2u to be the out-of-critical-angle light 6c which stays within the rod. A portion of the remaining light of the out-of-critical-angle light 6a passes through the core region 2A where the light-coupling structures 3 are provided, and this out-of-critical-angle light 6b' is totally reflected at the surface 2u to be the out-of-critical-angle light 6c' which stays within the light-transmitting rod 2'. Although not shown in the figure, there is also out-of-critical-angle light that stays within the sheet while being totally reflected between different light-coupling structures 3 and between the surfaces 2u.

As described above with reference to FIG. 2A, the in-critical-angle light 5a passes through the surface 3q of the second light-transmitting layer 3b, and a portion thereof is converted to the guided light 5B which propagates inside the third light-transmitting layer 3c by the function of the diffraction grating. The remainder becomes transmitted light or diffracted light, and it primarily becomes the in-critical-angle light 5a' to pass through the light-coupling structures 3, or becomes the in-critical-angle light 5r as reflected light to pass through the light-coupling structures 3. Before the guided light 5B reaches the end face 3S of the third light-transmitting layer 3c, a portion thereof is radiated in the same direction as the in-critical-angle light 5r to be the in-critical-angle light 5r', and the remainder is guided and radiated from the end face 3S of the third light-transmitting layer 3c to be the out-of-critical-angle light 5c. On the other hand, the out-of-critical-angle light 6a is totally reflected at the surface 3q of the second light-transmitting layer 3b, all of which becomes the out-of-critical-angle light 6b. Thus, out-of-critical-angle light that is incident on the surface of the light-coupling structure 3 (the surface 3p of the first light-transmitting layer 3a and the surface 3q of the second light-transmitting layer 3b) remains to be out-of-critical-angle light, whereas a portion of in-critical-angle light incident thereon is converted to the out-of-critical-angle light.

Next, light vectors on a cross section orthogonal to the central axis of the rod will be discussed. On this cross section, light entering inside the rod are classified into three types. These are light 15a passing through the core region 2A, light 15b passing through the outer edge of the core region 2A, and light 15c passing through the outside of the core region 2A. The light 15a is converted to out-of-critical-angle light which stays within the rod on the cross section along the central axis of the rod as described above. On the other hand, the light 15b is light that is incident at an angle of ψ on the surface 2u of the rod, where ψ satisfies Expression 3.

[Exp. 3]

$$\sin \psi = \frac{d}{D} \quad (3)$$

Naturally, the angle of incidence of the light 15c on the surface 2u is greater than ψ. Therefore, if Expression 4 holds true, the light 15b is totally reflected by the first principal surface 2p of the rod, and the light 15b and 15c become out-of-critical-angle light which stays within the light-transmitting rod 2' on the cross section orthogonal to the central axis.

[Exp. 4]

$$\frac{d}{D} \ge \frac{1}{n_0} \quad (4)$$

Therefore, satisfying Expression 4 for both the cross section parallel to the central axis C of the light-transmitting rod 2' and the cross section orthogonal thereto is the condition for all the light inside the light-transmitting rod 2' to stay within the light-transmitting rod 2'.

Note that in the example of FIGS. 27A and 27B, the principal surface 2u of the light-transmitting rod 2' is covered by the cover sheet 2e via the buffer layer 2f therebetween. Therefore, a foreign matter 2g such as a drop of water remains on the surface of the cover sheet 2e, and is prevented from coming into contact with the principal surface 2u. If the foreign matter 2g comes into contact with the first principal surface 2u, the total reflection relationship at the contact surface is lost, whereby the out-of-critical-angle light, which has been confined within the light-transmitting rod 2', leaks to the outside via the foreign matter 2g. Although the spacer 2d is also in contact with the principal surface 2u, the refractive index thereof is substantially the same as the refractive index of the environmental medium, and therefore the total reflection relationship at the contact surface is maintained, and the out-of-critical-angle light will not leak to the outside via the spacer 2d. If the surface area of the light-transmitting rod is small, the buffer layer 2f may be formed between the cover sheet 2e and the principal surface 2u, instead of providing the spacer 2d sandwiched therebetween.

Figure 28:
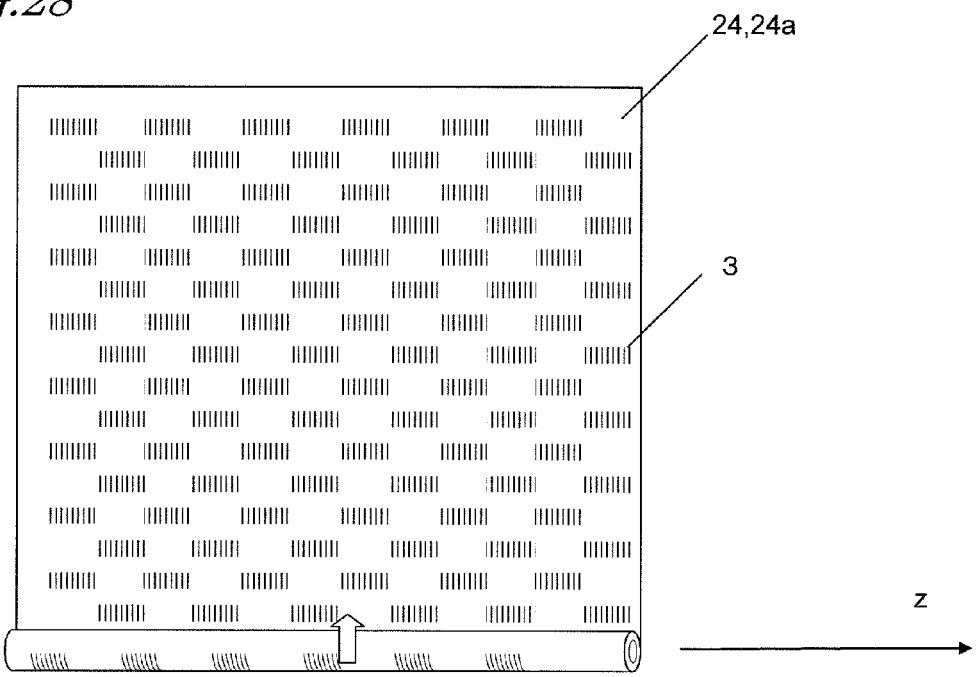
FIG. 28 is a schematic diagram showing a manufacturing procedure of the light-trapping rod shown in FIG. 27.

FIG. 28 is a schematic cross-sectional configuration view showing a production procedure for the light-trapping rod 61. In FIG. 28, the resin sheet 24, 24a (and 24', 24a') shown in FIGS. 7A to 7E, 13A to 13E, 18S to 18F is produced by the same method as those of the first to third embodiments. As to the grating vectors of the diffraction gratings forming the light-coupling structures 3 on the resin sheet 24, 24a (and 24a'), diffraction gratings of various pitches may be combined together, or diffraction gratings of a single pitch may be arranged so as to be in various directions (e.g., angles at 30° or 15° intervals) with respect to the z-axis, or a combination thereof may be used, so that the pitch as measured along the z-axis is from 0.30 μm to 2.80 μm. As to the size of the light-coupling structures 3, the length L in the z-axis direction is set to be 3 μm to 100 μm and the length W in the direction orthogonal thereto is set to be about ½ to ¹⁄₁₀ of L so that the coupled guided light can be radiated as much as possible along the central axis of the rod. The core region 2A of the light-trapping rod 61 can be produced by rolling up this sheet about the z axis with a thin layer of an adhesive applied on one surface thereof where the diffraction gratings are absent. The light-trapping rod 61 is completed by wrapping it with a transparent protection layer with anti-reflective nanostructures formed thereon.

Twelfth Embodiment

Twelfth to thirteenth embodiments will be described hereinbelow, and it is noted that descriptions with respect to the cover sheets 2e will be omitted because they are the same as, and redundant with, those given in the eleventh embodiment.

Figure 29:
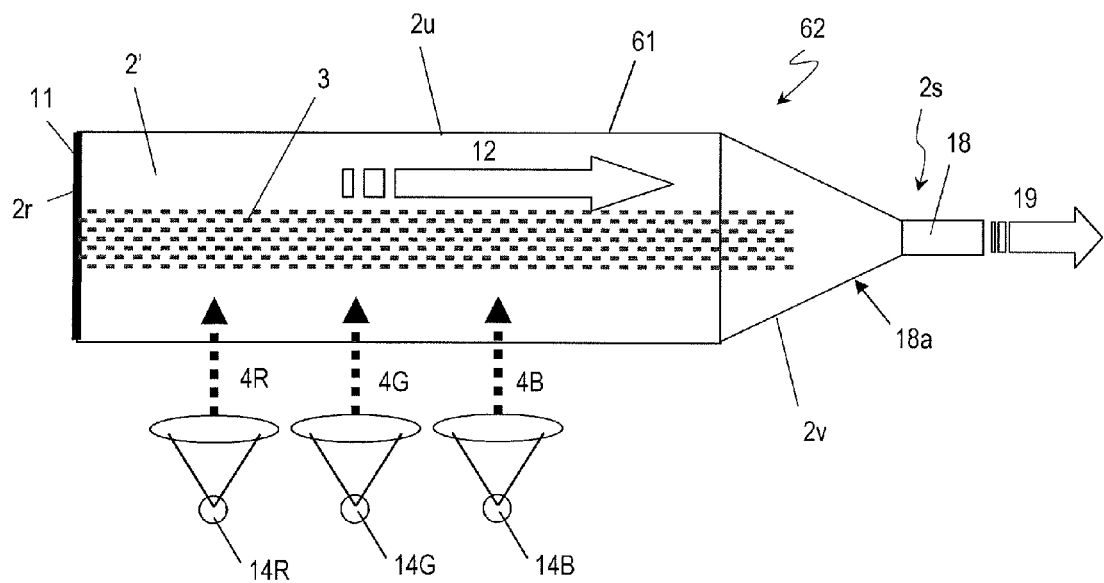
FIG. 29 is a schematic cross-sectional view showing another embodiment of a light-emitting device of the present disclosure.

An embodiment of a light-emitting device according to the present disclosure will be described. FIG. 29 schematically shows a cross-sectional structure of a light-emitting device 62 of the present embodiment. The light-emitting device 62 includes the light-trapping rod 61, and light sources 14R, 14G and 14B. The light-trapping rod 61 has such a structure as described above in the eleventh embodiment.

The reflective film 11 is provided on the end face 2r of the light-trapping rod 61. Preferably, a tapered portion 2v is provided on the surface 2u of the light-trapping rod 61 on the side of the end face 2s, and a waveguide 18 having a smaller diameter than the light-transmitting rod 2' is connected thereto.

The light sources 14R, 14G and 14B are formed by LDs and LEDs, and output red, green and blue light, respectively, for example. Light output from these light sources are condensed through lenses to radiate light 4R, 4G and 4B toward the surface 2u of the light-transmitting rod 2'. These light are confined inside the light-transmitting rod 2' by the light-coupling structures 3 in the core region 2A, and since the end face 2r is covered by the reflective film 11, it as a whole becomes the guided light 12 which propagates in one direction inside the rod. The guided light 12 is narrowed with no loss through the tapered portion 2v over which the diameter of the rod 2' decreases gradually, and it becomes guided light which propagates inside the waveguide 18 having a narrow diameter. Thus, the light 19, which is close to a point light source, is output from the end face of the waveguide 18. Where the light sources are lasers, the light 4R, 4G and 4B are coherent light, but since the light are radiated from the individual light-coupling structures 3 in varied phases, the guided light 12 obtained by synthesizing the radiated light together will be incoherent light. Therefore, the output light 19 is also incoherent light. By adjusting the light amounts of the light 4R, 4G and 4B, the output light 19 can be made white light. At present, red and blue semiconductor lasers have been realized, and a green laser is also available by using SHG. Synthesizing white light from these light sources typically requires a complicated optical configuration, and results in glaring light due to the coherence characteristic of laser light. However, with the light-emitting device 62 of the present embodiment, it is possible to provide a more natural, white-light point light source with no glare with a very simple configuration.

Figure 30:
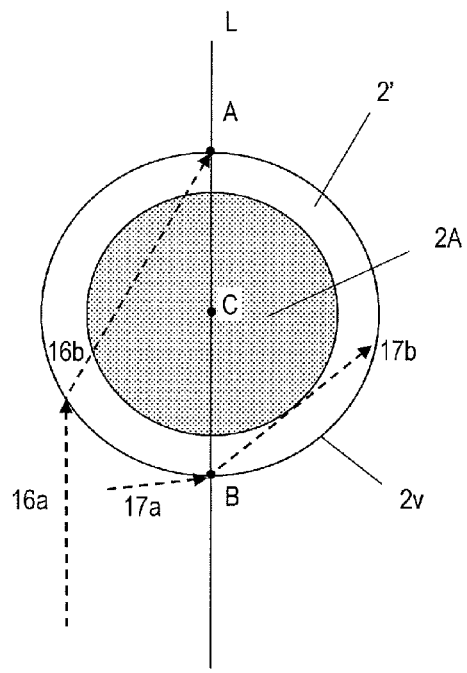
FIG. 30 is a cross-sectional view showing light being incident on a cross section of a light-trapping rod of the light-emitting device shown in FIG. 29.

In the case of the present embodiment, what needs an adjustment is the positional adjustment between the convergent light formed by the incident light 4R, 4G and 4B and the rod 2'. FIG. 30 is a cross-sectional view showing how light is incident on the light-trapping rod 61, where point O is the center of the rod. Assuming that the refractive index of the light-transmitting rod 2' is 1.5, the light 16a parallel to the straight line AOB refracts to be light 16b that is condensed approximately at point A. Assuming that the diameter of the core region 2A is greater than 1/1.5 the diameter of the light-transmitting rod 2', based on Expression 4, the light 16b certainly passes through the core region 2A to be confined within the light-transmitting rod 2'. In contrast, it is difficult to draw a light ray that does not pass through the core region 2A. For example, as for light 17b that is incident on point B and does not pass through the core region, the incident light beam 17a thereof is light at a very small angle with respect to the surface of incidence (light at an outermost edge of a condensation realized by a high numerical aperture). In other words, light rays at typical angles of incidence, i.e., light obtained by a condensation realized by a typical numerical aperture, all pass through the core region 2A to be confined within the light-transmitting rod 2'. This indicates that the positional adjustment between the incident light 4R, 4G and 4B and the light-transmitting rod 2' can be very rough, thus indicating how easy the adjustment is.

Thirteenth Embodiment

Figure 31:
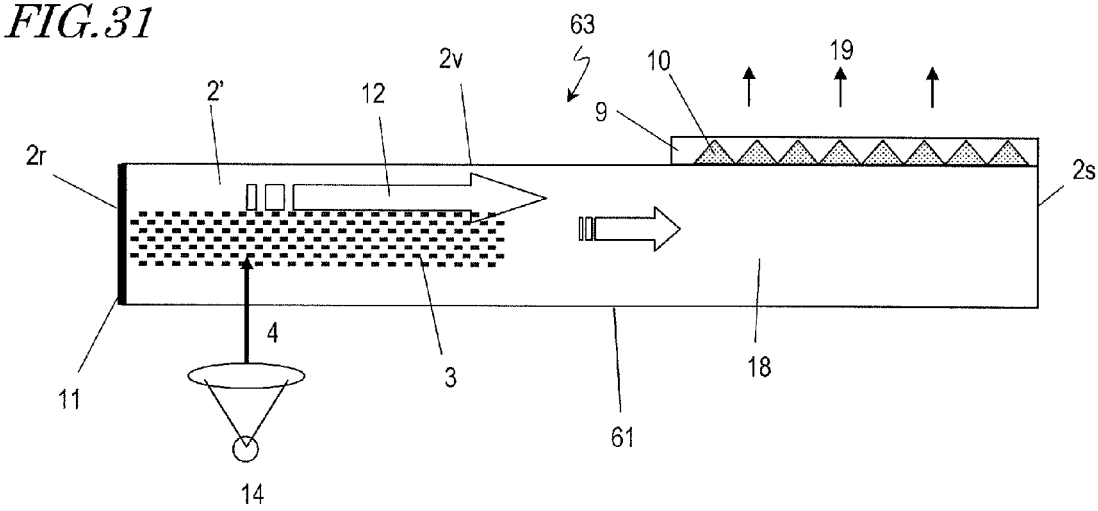
FIG. 31 is a schematic cross-sectional view showing another embodiment of a light-emitting device of the present disclosure.

Another embodiment of a light-emitting device according to the present disclosure will be described. FIG. 31 schematically shows a cross-sectional structure of a light-emitting device 63 of the present embodiment. The light-emitting device 63 includes the light-trapping rod 61, the light source 14, and the prism sheet 9. The light-trapping rod 61 has such a structure as described above in the eleventh embodiment.

The reflective film 11 is provided on the end face 2r of the light-trapping rod 61. A portion of the light-trapping rod 61 where the light-coupling structures 3 are absent functions as the waveguide 18. The prism sheet 9 is provided on the surface 2u of the waveguide 18.

The light source 14 is formed by an LD, an LED, or the like, and emits visible light. The light output from the light source is condensed through a lens to be the light 4 passing through the light-transmitting rod 2'. These light are confined inside the light-transmitting rod 2' by the light-coupling structures 3 in the core region 2A, and since one of the end faces is covered by the reflective film 11, it as a whole becomes the light 12 which propagates in one direction inside the light-transmitting rod 2', and becomes guided light which propagates inside the waveguide 18. The prism sheet 9 is provided in contact with the waveguide 18. The tetrahedron prisms 10 are arranged adjacent to one another inside the prism sheet 9. It may be formed by triangular prism array sheets orthogonal to each other that are bonded together. Since the refractive index of the prism 10 is larger than the refractive index of the prism sheet 9, light leaking out of the waveguide 18 to be incident on the prism sheet 9 refracts and is output from the prism sheet 9 to be the parallel output light 19. Note that the prism sheet 9 may be separated from the waveguide 18, in which case a protrusion/depression structure is formed on one side of the surface of the waveguide 18 that is opposing the prism sheet 9 for outputting light therethrough.

Where the light source is a laser, the light 4 is coherent light, but since the light are radiated from the individual light-coupling structures 3 in varied phases, the guided light 12 obtained by synthesizing the radiated light together will be incoherent light. Therefore, the output light 19 is also incoherent light. At present, red and blue semiconductor lasers have been realized, and a green laser is also available by using SHG. Using these light sources, red, green and blue linear light sources are obtained. For example, by bundling together these linear light sources, it is possible to provide a color backlight for a liquid crystal display with a very simple configuration.

Sheets and rods of the present disclosure are capable of taking in light over a wide area, and over a wide wavelength range (e.g., the entire visible light range) for every angle of incidence, without being influenced by a drop of water, dust, dirt, and the like; therefore, light-receiving devices using the same are useful in solar cells of high conversion efficiency, or the like, and light-receiving and light-emitting devices using the same provide a new form of a lighting or a light source, and are useful as a recycle lighting using the sunlight or light from a lighting, a high-efficiency backlight, and an incoherent white light source.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light-trapping sheet comprising:
   a light-transmitting sheet having first and second principal surfaces; and
   a plurality of light-coupling structures arranged in an inner portion of the light-transmitting sheet at a first and second distance from the first and second principal surfaces, respectively, wherein:
   each of the plurality of light-coupling structures includes a first light-transmitting layer, a second light-transmitting layer, and a third light-transmitting layer sandwiched therebetween;
   a refractive index of the first and second light-transmitting layers is smaller than a refractive index of the light-transmitting sheet; a refractive index of the third light-transmitting layer is larger than the refractive index of the first and second light-transmitting layers; and the third light-transmitting layer has a diffraction grating parallel to the first and second principal surfaces of the light-transmitting sheet;
   the plurality of light-coupling structures include a first light-coupling structure and a second light-coupling structure arranged next to each other on a surface parallel to the first and second principal surfaces, and the first light-transmitting layer of the first light-coupling structure is spaced apart from the first light-transmitting layer of the second light-coupling structure and the second light-transmitting layer of the first light-coupling structure is spaced apart from the second light-transmitting layer of the second light-coupling structure; and
   the light-trapping sheet further comprises a transparent cover sheet opposing at least one of the first and second principal surfaces of the light-transmitting sheet with a gap interposed therebetween.

2. The light-trapping sheet of claim 1, wherein surfaces of the first and second light-transmitting layers that are located opposite to the third light-transmitting layer are parallel to the first and second principal surfaces of the light-transmitting sheets.

3. The light-trapping sheet of claim 1, wherein the third light-transmitting layer of the first light-coupling structure and the third light-transmitting layer of the second light-coupling structure are continuous with each other.

4. The light-trapping sheet of claim 1, wherein the plurality of light-coupling structures are arranged three-dimensionally in an inner portion of the light-transmitting sheet at a first distance or more and a second distance or more from the first and second principal surfaces, respectively.

5. The light-trapping sheet of claim 1, wherein a material having a lower refractive index than a refractive index of the light-transmitting sheet is arranged in the gap.

6. The light-trapping sheet of claim 1, wherein a pitch of the diffraction grating is 0.1 µm or more and 3 µm or less, and
   wherein surfaces of the first and second light-transmitting layers are each sized so as to circumscribe a circle having a diameter of 100 µm or less; and the plurality of light-coupling structures each have a thickness of 3 µm or less.

7. The light-trapping sheet of claim 6, wherein at least two of the plurality of light-coupling structures are different from each other in terms of a direction in which the diffraction grating extends, and
   wherein at least two of the plurality of light-coupling structures are different from each other in terms of a pitch of the diffraction grating.

8. The light-trapping rod comprising:
   a light-transmitting rod having a principal surface and a circular or elliptical cross section; and
   plurality of light-coupling structures arranged in an inner portion of the light-transmitting rod at a first distance or more from the principal surface, wherein:
   each of the plurality of light-coupling structures includes a first light-transmitting layer, a second light-transmitting layer, and a third light-transmitting layer sandwiched therebetween;
   a refractive index of the first and second light-transmitting layers is smaller than a refractive index of the light-transmitting rod; a refractive index of the third light-transmitting layer is larger than the refractive index of the first and second light-transmitting layers; and the third light-transmitting layer includes a diffraction grating parallel to a central axis of the light-transmitting rod;
   the plurality of light-coupling structures include a first light-coupling structure and a second light-coupling structure arranged next to each other on a surface parallel to the principal surfaces, and the first light-transmitting layer of the first light-coupling structure is spaced apart from the first light-transmitting layer of the second light-coupling structure and the second light-transmitting layer of the first light-coupling structure is spaced apart from the second light-transmitting layer of the second light-coupling structure; and
   the light-trapping rod further comprises a transparent cover sheet opposing the principal surface of the light-transmitting rod with a gap interposed therebetween.

9. The light-trapping rod of claim 8, wherein the plurality of light-coupling structures are each arranged three-dimensionally in an inner portion of the light-transmitting rod at the first distance or more from the principal surface.

10. The light-trapping rod of claim 8, wherein a material having a lower refractive index than a refractive index of the light-transmitting sheet is arranged in the gap.

11. The light-trapping rod of claim 8, wherein a pitch of the diffraction grating is 0.1 µm or more and 3 µm or less, and
    wherein surfaces of the first and second light-transmitting layers are each sized so as to circumscribe a circle having a diameter of 100 µm or less; and the light-coupling structures each have a thickness of 3 µm or less.

12. The light-trapping rod of claim 11, wherein at least two of the plurality of light-coupling structures are different from each other in terms of a direction in which the diffraction grating extends, and
    wherein at least two of the plurality of light-coupling structures are different from each other in terms of a pitch of the diffraction grating.

13. A light-receiving device comprising: a light-trapping sheet of claim 1; and a photoelectric conversion section provided on one of the first principal surface of the light-trapping sheet, the second principal surface thereof, and end faces adjacent to the first principal surface and the second principal surface.

14. The light-receiving device of claim 13, further comprising another light-trapping sheet of claim 1,
    wherein the photoelectric conversion section is provided on the first principal surface of the light-trapping sheet; and an end face of the other light-trapping sheet is connected to the second principal surface of the light-trapping sheet.

15. A light-receiving device comprising: a light-trapping sheet of claim 1; a protrusion/depression structure or a prism sheet provided on the first principal surface or the second principal surface of the light-trapping sheet; and a photoelectric conversion section for receiving light output from the protrusion/depression structure or the prism sheet.

16. A light-receiving device comprising: a light-trapping sheet of claim 1; and a protrusion/depression structure provided on a portion of the first principal surface or the second principal surface of the light-trapping sheet.

17. A light-emitting device comprising: a light-trapping sheet of claim 1; a light source provided adjacent to one of the first principal surface and the second principal surface of the light-trapping sheet; a protrusion/depression structure provided on the other one of the first principal surface and the second principal surface of the light-trapping sheet; and a prism sheet arranged so as to receive light output from the protrusion/depression structure.

18. A light-emitting device comprising: a light-trapping rod of claim 8; and at least one light source provided adjacent to the first principal surface of the light-transmitting rod.

19. The light-emitting device of claim 18, wherein further comprising a prism sheet or a protrusion/depression structure provided on a portion of the first principal surface of the light-transmitting rod.

\* \* \* \* \*